(12) United States Patent
Boukai et al.

(10) Patent No.: US 10,580,955 B2
(45) Date of Patent: Mar. 3, 2020

(54) THERMOELECTRIC DEVICES AND SYSTEMS

(71) Applicant: Matrix Industries, Inc., Menlo Park, CA (US)

(72) Inventors: Akram I. Boukai, Menlo Park, CA (US); Douglas W. Tham, Menlo Park, CA (US); Haifan Liang, Menlo Park, CA (US); Eric C. Hale, Greenbrae, CA (US); Gregory L. Kress, San Francisco, CA (US); Scott A. Steber, San Francisco, CA (US); Brentley M. Wiles, San Francisco, CA (US)

(73) Assignee: MATRIX INDUSTRIES, INC., Menlo Park, CA (US)

( * ) Notice: Subject to any disclaimer, the term of this patent is extended or adjusted under 35 U.S.C. 154(b) by 0 days.

(21) Appl. No.: 16/354,772

(22) Filed: Mar. 15, 2019

(65) Prior Publication Data

US 2020/0028057 A1 Jan. 23, 2020

Related U.S. Application Data

(63) Continuation of application No. 15/585,376, filed on May 3, 2017, now Pat. No. 10,290,796.

(60) Provisional application No. 62/331,404, filed on May 3, 2016, provisional application No. 62/408,015, filed on Oct. 13, 2016, provisional application No. 62/421,120, filed on Nov. 11, 2016.

(51) Int. Cl.
*H01L 35/32* (2006.01)

(52) U.S. Cl.
CPC .................... *H01L 35/32* (2013.01)

(58) Field of Classification Search
CPC ........................................ H01L 35/32
USPC ................................. 318/117, 34
See application file for complete search history.

(56) References Cited

U.S. PATENT DOCUMENTS

| | | | |
|---|---|---|---|
| 365,990 | A | 7/1887 | Giles |
| 3,653,989 | A | 4/1972 | Widmer |
| 4,070,821 | A | 1/1978 | Somogyi |
| 4,078,945 | A | 3/1978 | Gonsiorawski |
| 4,092,445 | A | 5/1978 | Tsuzuki et al. |

(Continued)

FOREIGN PATENT DOCUMENTS

| | | |
|---|---|---|
| CN | 1382626 A | 12/2002 |
| JP | S63266829 A | 11/1988 |

(Continued)

OTHER PUBLICATIONS

Advisory action dated Jul. 21, 2017 for U.S. Appl. No. 14/372,443.

(Continued)

*Primary Examiner* — David Luo
(74) *Attorney, Agent, or Firm* — Wilson Sonsini Goodrich & Rosati

(57) ABSTRACT

The present disclosure provides wearable electronic devices with thermoelectric devices. The wearable electronic device may comprise a user interface for displaying information to a user. The thermoelectric device may comprise a heat collecting unit, a thermoelectric element, and a heat expelling unit. During use, the thermoelectric element may generate power upon the flow of thermal energy from the heat collecting unit, across the thermoelectric element, and to the heat expelling unit.

35 Claims, 43 Drawing Sheets

(56) References Cited

U.S. PATENT DOCUMENTS

| | | | |
|---|---|---|---|
| 4,106,279 A | 8/1978 | Martin et al. |
| 4,261,049 A | 4/1981 | Komiyama et al. |
| 4,681,657 A | 7/1987 | Hwang et al. |
| 5,089,293 A | 2/1992 | Bohara et al. |
| 5,139,624 A | 8/1992 | Searson et al. |
| 5,206,523 A | 4/1993 | Goesele et al. |
| 5,552,328 A | 9/1996 | Orlowski et al. |
| 5,565,084 A | 10/1996 | Lee et al. |
| 5,695,557 A | 12/1997 | Yamagata et al. |
| 5,767,020 A | 6/1998 | Sakaguchi et al. |
| 5,868,947 A | 2/1999 | Sakaguchi et al. |
| 5,873,003 A | 2/1999 | Inoue et al. |
| 5,889,735 A | 3/1999 | Kawata et al. |
| 5,895,223 A | 4/1999 | Peng et al. |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,194,323 B1 | 2/2001 | Downey et al. |
| 6,222,114 B1 | 4/2001 | Mitamura |
| 6,304,520 B1 | 10/2001 | Watanabe |
| 6,304,521 B1 | 10/2001 | Kanesaka |
| 6,313,015 B1 | 11/2001 | Lee et al. |
| 6,407,965 B1 | 6/2002 | Matoge et al. |
| 6,560,167 B1 * | 5/2003 | Kotanagi ............... G04C 10/00 136/205 |
| 6,762,134 B2 | 7/2004 | Bohn et al. |
| 6,790,785 B1 | 9/2004 | Li et al. |
| 6,803,260 B2 | 10/2004 | Shin et al. |
| 6,882,051 B2 | 4/2005 | Majumdar et al. |
| 7,075,161 B2 | 7/2006 | Barth |
| 7,115,971 B2 | 10/2006 | Stumbo et al. |
| 7,135,728 B2 | 11/2006 | Duan et al. |
| 7,161,168 B2 | 1/2007 | Heath et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,569,941 B2 | 8/2009 | Majumdar et al. |
| 7,572,669 B2 | 8/2009 | Tuominen et al. |
| 7,629,531 B2 | 12/2009 | Stark |
| 7,645,625 B2 | 1/2010 | Ono et al. |
| 7,675,084 B2 | 3/2010 | Wierer, Jr. et al. |
| 7,960,258 B2 | 6/2011 | Chao et al. |
| 8,087,254 B2 | 1/2012 | Arnold |
| 8,101,449 B2 | 1/2012 | Liang et al. |
| 8,278,191 B2 | 10/2012 | Hildreth et al. |
| 8,324,699 B2 | 12/2012 | Ichijo et al. |
| 8,486,843 B2 | 7/2013 | Li et al. |
| 8,641,912 B2 | 2/2014 | Heath et al. |
| 8,980,656 B2 | 3/2015 | Li et al. |
| 9,065,016 B2 | 6/2015 | Peter et al. |
| 9,209,375 B2 | 12/2015 | Boukai et al. |
| 9,263,662 B2 | 2/2016 | Boukai et al. |
| 9,515,246 B2 | 12/2016 | Boukai et al. |
| D819,627 S | 6/2018 | Boukai et al. |
| 1,000,300 A1 | 6/2018 | Boukai et al. |
| 10,290,796 B2 | 5/2019 | Boukai et al. |
| 2004/0152240 A1 | 8/2004 | Dangelo |
| 2005/0133254 A1 | 6/2005 | Tsakalakos |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0258213 A1 | 11/2007 | Chen et al. |
| 2007/0277866 A1 | 12/2007 | Sander et al. |
| 2008/0019876 A1 | 1/2008 | Chau et al. |
| 2008/0173344 A1 | 7/2008 | Zhang et al. |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0069045 A1 | 3/2009 | Cheng |
| 2009/0117741 A1 | 5/2009 | Heath et al. |
| 2010/0035163 A1 | 2/2010 | Kobrin |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0248449 A1 | 9/2010 | Hildreth et al. |
| 2011/0003279 A1 | 1/2011 | Patel |
| 2011/0114145 A1 | 5/2011 | Yang et al. |
| 2011/0114146 A1 | 5/2011 | Scullin |
| 2011/0168978 A1 | 7/2011 | Kochergin |
| 2011/0179806 A1 | 7/2011 | Ipposhi et al. |
| 2011/0215441 A1 | 9/2011 | Lin et al. |
| 2011/0263119 A1 | 10/2011 | Li et al. |
| 2011/0266521 A1 | 11/2011 | Ferrari et al. |
| 2012/0097204 A1 | 4/2012 | Yu et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0174956 A1 | 7/2012 | Smythe et al. |
| 2012/0217165 A1 | 8/2012 | Feng et al. |
| 2012/0282435 A1 | 11/2012 | Yang et al. |
| 2012/0290051 A1 | 11/2012 | Boyden et al. |
| 2012/0295074 A1 | 11/2012 | Yi et al. |
| 2012/0319082 A1 | 12/2012 | Yi et al. |
| 2012/0326097 A1 | 12/2012 | Ren et al. |
| 2013/0052762 A1 | 2/2013 | Li et al. |
| 2013/0087180 A1 | 4/2013 | Stark et al. |
| 2013/0143407 A1 | 6/2013 | Lin et al. |
| 2013/0175484 A1 | 7/2013 | Ren et al. |
| 2013/0186445 A1 | 7/2013 | Lorimer et al. |
| 2014/0117380 A1 | 5/2014 | Loboda et al. |
| 2014/0299169 A1 | 10/2014 | Schneider et al. |
| 2014/0306250 A1 | 10/2014 | Gardner et al. |
| 2014/0326287 A1 | 11/2014 | Wiant et al. |
| 2014/0373888 A1 | 12/2014 | Boukai et al. |
| 2015/0029661 A1 | 1/2015 | Huang et al. |
| 2015/0083180 A1 | 3/2015 | Lang |
| 2015/0101788 A1 | 4/2015 | Smith et al. |
| 2015/0162517 A1 | 6/2015 | Kasichainula |
| 2015/0179911 A1 | 6/2015 | Lemmer et al. |
| 2015/0216718 A1 | 8/2015 | Diller et al. |
| 2015/0228883 A1 | 8/2015 | Boukai et al. |
| 2015/0280099 A1 | 10/2015 | Boukai et al. |
| 2016/0035956 A1 | 2/2016 | Carroll et al. |
| 2016/0197259 A1 | 7/2016 | Boukai et al. |

FOREIGN PATENT DOCUMENTS

| | | |
|---|---|---|
| JP | H11317547 A | 11/1999 |
| JP | 2004193526 A | 7/2004 |
| JP | 2006261451 A | 9/2006 |
| JP | 2007300127 A | 11/2007 |
| JP | 2010192580 A | 9/2010 |
| JP | 2010537430 A | 12/2010 |
| WO | WO-0223607 A1 | 3/2002 |
| WO | WO-2010003629 A2 | 1/2010 |
| WO | WO-2011049804 A2 | 4/2011 |
| WO | WO-2012068426 A2 | 5/2012 |
| WO | WO-2013012842 A1 | 1/2013 |
| WO | WO-2013109729 A1 | 7/2013 |
| WO | WO-2014028903 A1 | 2/2014 |
| WO | WO-2014070795 A1 | 5/2014 |
| WO | WO-2014179622 A1 | 11/2014 |
| WO | WO-2015134394 A1 | 9/2015 |
| WO | WO-2015148554 A1 | 10/2015 |

OTHER PUBLICATIONS

Agnes, et al. Doping of the nanocrystalline semiconductor zinc oxide with the donor indium, Amer Institute of Phystcs, vol. 83, No. 6, 1204, (Aug. 11, 2003).

Beckman, et al., Bridging Dimensions: Demultiplexing Ultrahigh-Density nanowire Circuits, Science 2005, 310: 465-468.

(56) References Cited

OTHER PUBLICATIONS

Beckman, et al. Fabrication of Conducting. Silicon nanowire Arrays, J. Appi. Phys. 96 (10), 5921-5923'(2004).
Behnen. Quantitative examination of the thermoelectric power of n-typesilicon in the phono drag regime.Journal of Applied Physics, vol. 67, pp. 287-292, Jan. 1, 1990.
Bera, et al. Marked Effects of Alloying on the Thermal Conductivity of nanoporous Materials, Mar. 19, 2010, American Physical Society Physical Review Letters, 104, pp. 115502-01 to 115502-4.
Boukai, et al. Silicon nanowires as efficient thermoelectric materials. nature, vol. 451, pp. 168-171, Jan. 10, 2008.
Boukai, et al. Size-Dependent transport and thermoelectric properties of individual polycrystalline bismuth nanowires. Advanced Materials, 18, pp. 864-869, 2006.
Boukai. Thermoelectric properties of bismuth and silicon nanowires. Dissertation (Ph.D.), California Institute of Technology. 2008.
Bunimovich, et al. Quantitative Real-Time Measurements of DnA Hybridization with Alkylated nonoxidized Silicon nanowires in Electrolyte Solution, JACS 2006, 128: 16323-16331.
Chadwick, et al. Plane waves in an elastic solid conducting heat. Journal of the Mechanics and Physics of Solids 6, 223-230 (1958).
Chen, et al. Dispenser Printed Microscale Thermoelectric Generators for Powering Wireless Sensor Networks. Paper No. IMECE2009-11636, pp. 343-352; 10 pages..
Chen, et al. Recent developments in thermoelectric materials. International Materials Reviews, vol. 48, pp. 45-66, 2003.
Choi, et al. Fabrication of bismuth nanowires with a silver nanocrystal shadowmask, J. Vac. Sci. Tech. A-Vac. Surf. And Films, 18, 1236, 1328 (2000).
Choi, et al. Fabrication of nanometer size photoresist wire patterns With a silver nanocrystal shadowmask. J. Vac. Sci. & Tech. A-Vac. Surf. And Films, 17, 1425 (1999).
Chung, et al. Fabrication and Alignment of Wires in Two-Dimensions. The Journal of PhysiCal Chemistry B. 102. 6685 (1998).
Collier, et al. Nanocrystal superlattices. Annu. Rev. Phys. Chem. 1998, 49: 371-404.
Deresiewicz. Plane waves in a thermoelastic solid. Journal of the Acoustical Society of America 29, 204-209 (1957).
Diehl, et al. Self-Assembly of Deterministic Carbon nanottibe Wiring networks. Angew. 'Chem. Int Ed. 41, 353 (2002).
European search report and opinion dated Feb. 26, 2016 for EP Application No. 13829134.9.
European search report and opinion dated Mar. 25, 2014 for EP Application No. 11835180.8.
Extended European Search Report and Search Opinion dated Oct. 9, 2017 for European Patent Application No. EP 15768608.0.
Fan, et al. Self-Oriented Regular Arrays of Carbon nanotubes and their Field Emission Devices. Science, v. 283, p. 512 (Jan. 22, 1999).
Geballe, et al. Seebeck Effect in Silicon. Physical Review, vol. 98, pp. 940-947, May 15, 1955.
Green, et al., A 160-kilobit molecular electronic memory patterned at 1011 bits per square centimeter, nature 2007, 445: 414-417.
Gurevich. Thermoelectric properties of conductors J. Phys. (U.S.S. R.) 9, 477 (1945).
Harman, et al. Quantum dot superlattice thermoelectric materials and devices. Science, vol. 297, pp. 2229-2232, Sep. 27, 2002.
Haynes, et al. nanosphere Lithography: A Versatile nanofabrication Tool for Studies of Size-Dependent nanoparticle Optics. J. Phys. Chem. B, 105, 5599-5611 (2001).
Heat sinks heat spreaders peltier coolers, novel concepts, Inc., 2014, Available at novelconceptsinc.com http://www.novelconceptsinc.com/heat-spreaders.htm, accessed on Aug. 21, 2017, 2 pages.
Heath, et al. A Defect-Tolerant Computer Architecture: Opportunities for nanotechnology, Science 1998, 280: 1716-1721.
Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.
Herring. Theory of the thermoelectric power of semiconductors. Physical Review, vol. 96, No. 5, pp. 1163-1187, 1954.
Hicks, et al., Thermoelectric figure of merit of a one-dimensional conductor. Physical Review B 47, 1 6631-6634 (1993).
Hochbaum, et al. Enchanced thermoelectric performance of rough silicon nanowires, Jan. 2008, nature Publishing Group, vol. 451, pp. 1-6.
Hsu, et al. Cubic AgPbmSbTe2+m: Bulk thermoelectric materials with high Figure of Merit. Science, vol. 303, pp. 818-821, Feb. 6, 2004.
Huang, et al. Metal-assisted chemical etching of silicon: a review. Adv Mater. Jan. 11, 2011;23(2):285-308. doi: 10.1002/adma.201001784.
Huang, et al. Spontaneous formation of nanoparticle strip patterns through dewetting. nature Materials vol. 4, p. 896 (2005).
Hulteen, et al. nanosphere lithography: A materials general fabrication process for periodic particle array surfaces, J. Vac. Sci. Technol. 1995, 13: 1553-1558.
Humphrey, et al. Reversible thermoelectric nanomaterials. Physical Review Letters 94, 096601 (2005).
Husain, et al. Nanowire-based very-high-frequency electromechanical resonator. Applied physics letters, vol. 83, No. 6, Aug. 11, 2003, pp. 1240-1242.
Ihab, et al. Manipulation of thermal phonons: a phononic crystal route to high-ZT thermoelectrics. Photonic and Phononic Properties of Engineered nanostructures, SPIE. 1000 20th ST. Bellingham, WA 98225-6705. Feb. 10, 2011; 7946:1-9.
International search report and written opinion dated Feb. 9, 2009 for PCT/US2008/070309.
International search report and written opinion dated Apr. 7, 2017 for PCT Application No. US-201664501.
International search report and written opinion dated Apr. 15, 2009 for PCT/US2008/064439.
International search report and written opinion dated Apr. 26, 2013 for PCT/US2013/021900.
International search report and written opinion dated May 29, 2012 for PCT/US2011/057171.
International search report and written opinion dated Jul. 3, 2015 for PCT Application No. US2015/022312.
International search report and written opinion dated Jul. 17, 2012 for PCT Application No. PCT/US2012/047021.
International search report and written opinion dated Aug. 7, 2017 for PCT Application US-201730868.
International search report and written opinion dated Dec. 27, 2013 for PCT/US2013/055462.
International search report dated Feb. 10, 2014 for PCT/US2013/067346.
Joannopoulos, et al. Photonic crystals: putting a new twist on light, nature 1997, 386: 143-149.
Jung, et al. Circuit Fabrication at 17 nm Half-Pitch by nanoimprint-tithography. nanoLetters, 6, 351 (2006).
Koga, et al. Experimental proof-of-principle investigation of enhanced Z3DT in (100) oriented Si/Ge superlattices. Applied Physics Letters 77, 1490-1492 (2000).
Lee, et al. Enhanced thermoelectric figure-of-merit in nanostructured p-type silicon germanium bulk alloys. nano. Lett. 2008; 8(12):4670-4674.
Lee, et al nanoporous Si as an Efficient Thermoelectric Material. nano Letter, 8, 2008, 3750-3754.
Lee, et al. nanostructured bulk thermoelectric materials and their properties. ICT 2005. 24th International Conference on Thermoelectrics (ICT). 2005 284-287.
Li, et al. Measuring thermal and thermoelectric properties of one-dimensional nanostructures using a microfabricated device. Journal of heart transfer, vol. 125, pp. 881-888, Oct. 2003.
Li et al. Thermal Conductivity of Individual Silicon Nanowires. Appl Phys Lett 83(14):2934-2936 (Oct. 6, 2003).
Lifshitz, et al. Thermoelastic damping in micro- and nanomechanical systems. Physical Review B 61, 5600-5609 (2000).
Liu, et al. Thermal conduction in ultrahigh pure and doped single-crystal silicon layers at high temperatures. Journal of Applied Physics 98, 123523 (2005).

(56) References Cited

OTHER PUBLICATIONS

Llaguno, et al. Observation of thermopower oscillations in the coulomb blockade regime in a semiconducting carbon nanotube. nano Lett. 4, 45-49 (2004).
Mahan, et al. The best thermoelectric. PnAS 93, 7436-7439 (1996).
Mahan, et al. Thermoelectric materials: new approaches to an old problem. Physics Today 50, pp. 42-47, Mar. 1997.
Majumdar. Thermoelectricity in Semiconductor nanostructures. Science Feb. 6, 2004; 303(5659):777-778. DOI: 10.1126/science.1093164.
Maranganti, et al. Length scales at which classical elasticity breaks down for various materials. Physical Review Letters 98, 195504 (2007).
Martin. nanomaterials—A membrane based synthetic approach. Science, v. 266, p. 1961-1966 (Dec. 23, 1994).
Melosh, et al. Ultra-high density nanowire lattices and circuits. Science, vol. 300, pp. 112-115, Apr. 4, 2003.
Morales, et al. A laser ablation method for the synthesis of semiconductor crystalline nanowires. Science, vol. 279, pp. 208-211, Jan. 9, 1998.
NDT Resource Center, Thermal Conductivity. Downloaded Nov. 26, 2013. https://www.nde-ed.org/EducationResources/CommunityCollege/Materials/Physical_Chemical/ThermalConductivity.htm.
Notice of allowance dated Jan. 22, 2016 for U.S. Appl. No. 14/667,177.
Notice of allowance dated Jun. 15, 2016 for U.S. Appl. No. 13/278,074.
Notice of allowance dated Jul. 13, 2011 for U.S. Appl. No. 12/125,043.
Notice of allowance dated Jul. 29, 2015 for U.S. Appl. No. 12/175,027.
Notice of allowance dated Jul. 29, 2016 for U.S. Appl. No. 14/624,506.
Notice of allowance dated Aug. 18, 2017 for U.S. Appl. No. 14/700,082.
Notice of allowance dated Oct. 2, 2013 for U.S. Appl. No. 12/125,043.
Notice of allowance dated Oct. 8, 2015 for U.S. Appl. No. 14/667,177.
Notice of allowance dated Nov. 6, 2015 for U.S. Appl. No. 14/667,177.
Notice of allowance dated Dec. 10, 2015 for U.S. Appl. No. 14/667,177.
Office action dated Jan. 9, 2015 for U.S. Appl. No. 12/175,027.
Office action dated Jan. 23, 2015 for U.S. Appl. No. 13/278,074.
Office action dated Feb. 2, 2017 for U.S. Appl. No. 14/700,082.
Office action dated Feb. 12, 2015 for U.S. Appl. No. 13/550,424.
Office action dated Feb. 18, 2011 for U.S. Appl. No. 12/125,043.
Office action dated Apr. 19, 2017 for U.S. Appl. No. 14/372,443.
Office action dated Apr. 25, 2013 for U.S. Appl. No. 13/278,074.
Office action dated May 23, 2013 for U.S. Appl. No. 12/175,027.
Office action dated Jun. 16, 2015 for U.S. Appl. No. 13/278,074.
Office action dated Jun. 22, 2011 for U.S. Appl. No. 12/175,027.
Office action dated Jun. 23, 2016 for U.S. Appl. No. 14/372,443.
Office action dated Jun. 26, 2017 for U.S. Appl. No. 14/989,225.
Office action dated Jun. 28, 2016 for U.S. Appl. No. 14/624,506.
Office action dated Jun. 29, 2016 for U.S. Appl. No. 13/550,424.
Office action dated Jun. 30, 2014 for U.S. Appl. No. 12/175,027.
Office action dated Jul. 18, 2014 for U.S. Appl. No. 13/278,074.
Office action dated Aug. 7, 2013 for U.S. Appl. No. 12/175,027.
Office action dated Aug. 28, 2015 for U.S. Appl. No. 13/550,424.
Office action dated Oct. 7, 2016 for U.S. Appl. No. 14/989,225.
Office action dated Nov. 10, 2010 for U.S. Appl. No. 12/175,027.
Office action dated Nov. 17, 2015 for U.S. Appl. No. 14/372,443.
Office action dated Nov. 18, 2015 for U.S. Appl. No. 13/278,074.
Office action dated Nov. 27, 2013 for U.S. Appl. No. 12/175,027.
Pearson. Survey of thermoelectric studies of the group-1 metals at low temperatures carried out at the national-research-laboratories, Ottawa. Soviet Physics-Solid State 3, 1024-1033 (1961).
Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Silverstein, et al. Porous polymers. John Wiley & Sons, 2011.
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
U.S. Appl. No. 15/585,376 Office Action dated Sep. 7, 2018.
Venkatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.
Wallarah Minerals, Downloaded Mar. 26, 2015. http://www.wallarahminerals.com.au/high-temperature-seebeck-probes.htm.
Wang, et al. A new type of lower power thermoelectric microgenerator fabricated by nanowire array thermoelectric material. Microelectronic Engineering. 2005; 77:223-229.
Wang, et al. Complementary Symmetry Silicon nanowire Logic: Power-Efficient Inverters with Gain**, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).
Wang, et al., Silicon p-FETs from Ultrahigh Density nanowire Arrays, nano Letters 2006, 6: 1096-1100.
Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5(4):761-778 (1996).
Wolfsteller; et al., "Comparison of the top-down and bottom-up approach to fabricate nanowire-based silicon/germanium heterostructures. Thin Solid Films 518.9 (2010): 2555-2561.".
Wu, et al. Single-crystal metallic nanowires and meta semiconductor nanowires heterostructures. nature, 430. p. 61'(2004).
Xu, et al. Controlled fabrication of long quasione-dimensional superconducting nanowire arrays. nano letters, vol. 8, No., 1, Dec. 6, 2007, pp. 136-141.
Yablonovitch. Photonic band-gap structures, J. Opt. Soc. Am. B. 1993, 10: 283-297.
Yang, et al. Encoding Electronic Properties.by Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.

(56) References Cited

OTHER PUBLICATIONS

Yang, et al. Thermal conductivity of simple and tubular nanowire composites in the longitudinal direction. Physiucal Review B, 72, 125418, 2005, p. 1-7.
Yu, et al. Reduction of thermal conductivity in phononic nanomesh structures. nature nanotechnology. 2010; 5:718-721.
Yu-Ming, et al. Semimetal-semicinductor transition in bi1_xSbx alloy nanowires and their thermoelectric properties. Applied Physics Letter, Volov. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. Nanowire Crossbar Arrays as Address Decoders for Integrated nanosystems, Science 2003, 302: 1377-1379.
Zhou. Determination of transport properties in chromium disilicide nanowires via combined thermoelectric and structural characterizations. nano Letters 7, 1649-1654 (2007).
Zhou, et al. Verticaly aligned Zn2SiO4 nanotube/ZnO nanowire Heterojunction Arrays. Small, v.3. p. 622-626 (2007).
EP17793266 Search Report dated Oct. 18, 2019.

* cited by examiner

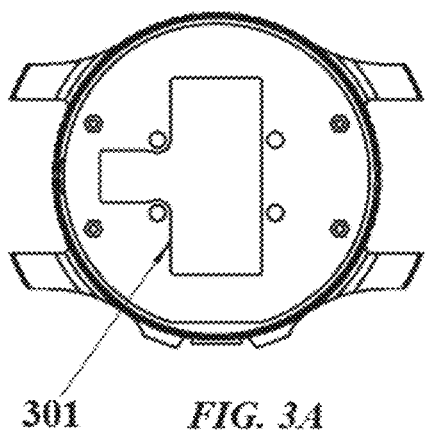
301  FIG. 3A
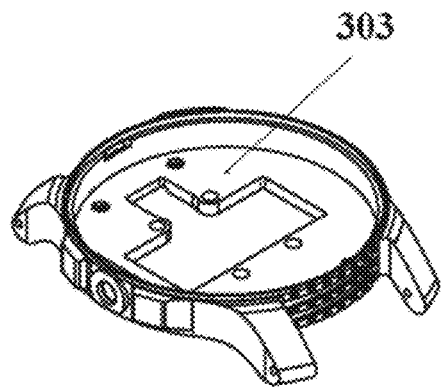
FIG. 3B
302  FIG. 3C
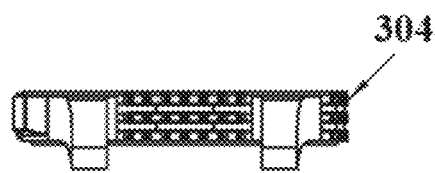
FIG. 3D
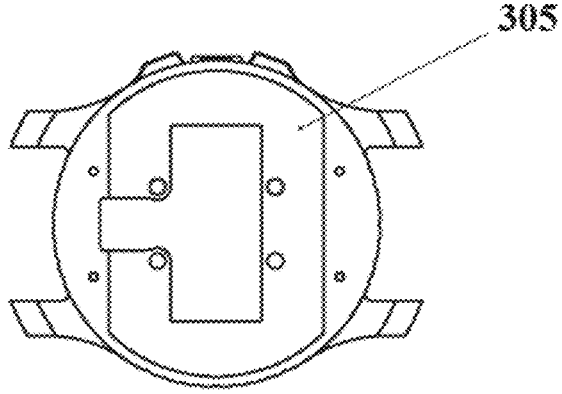
FIG. 3E

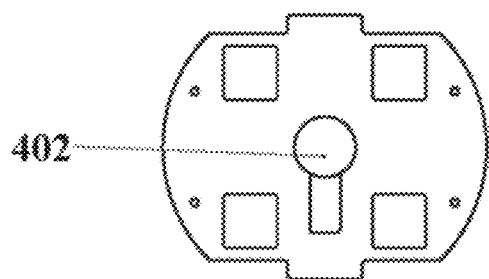 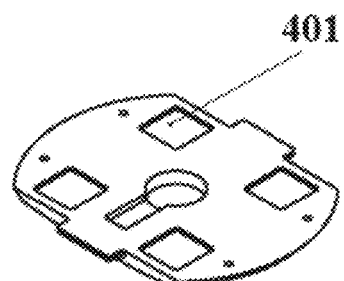
FIG. 4A  FIG. 4B
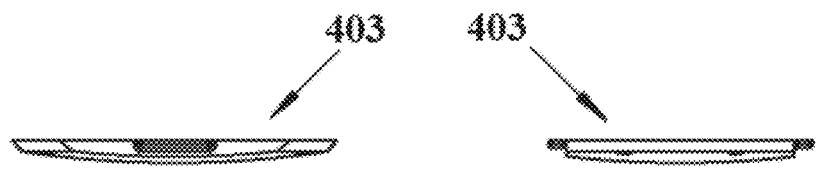
FIG. 4C
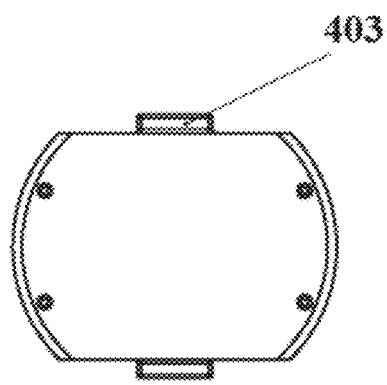
FIG. 4D

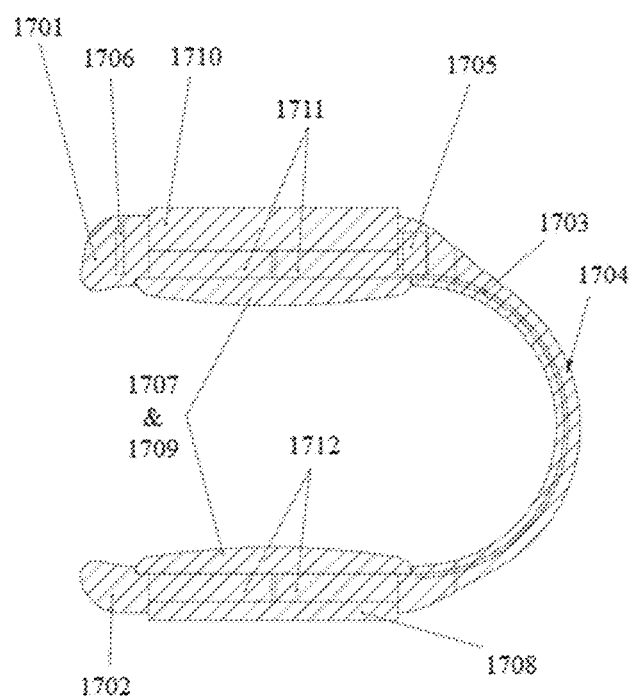 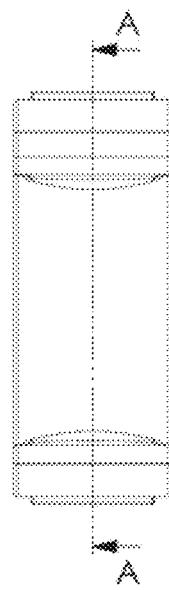
*FIG. 19A*  *FIG. 19B*

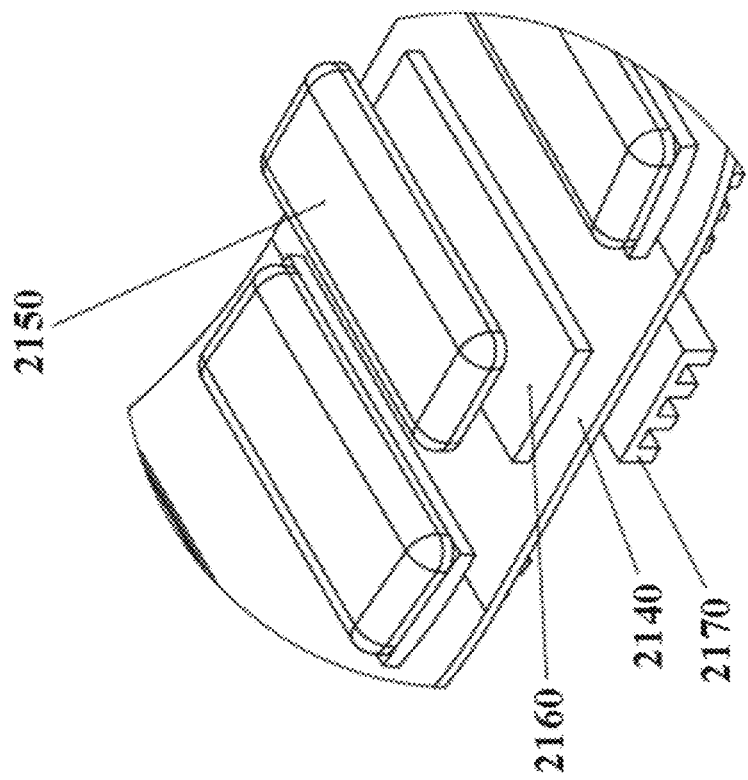
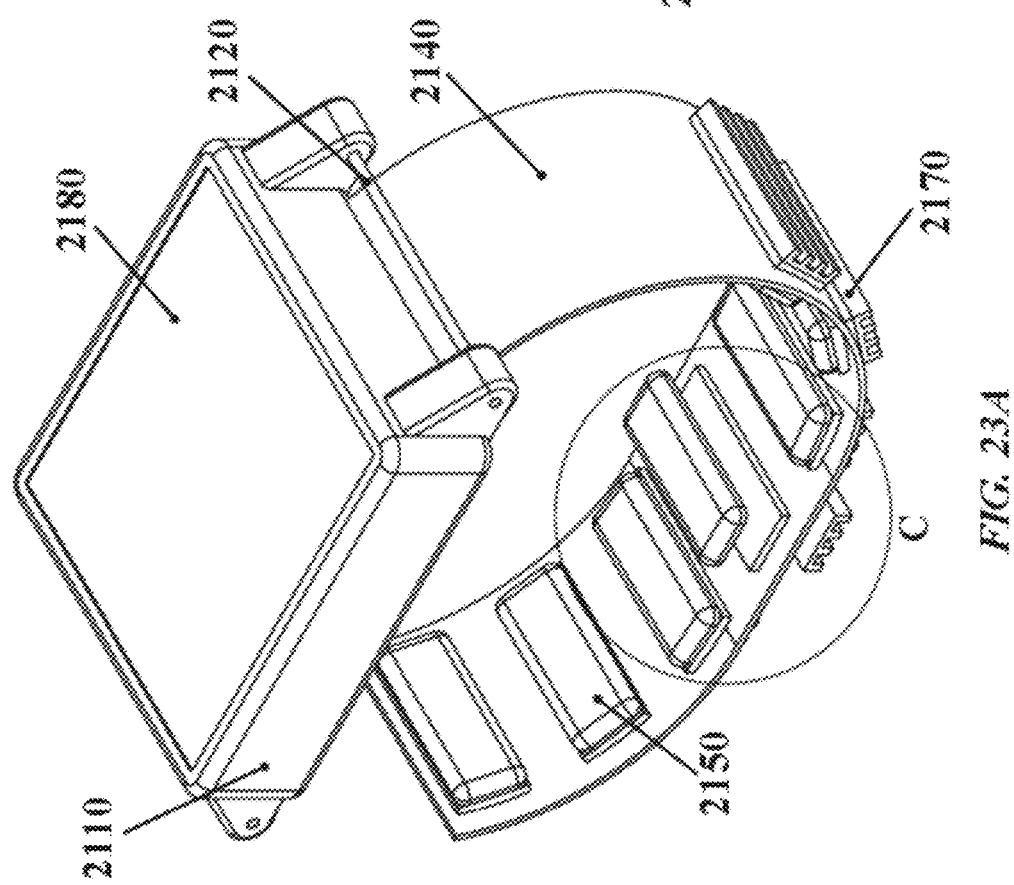
FIG. 23A
FIG. 23B

THERMOELECTRIC DEVICES AND SYSTEMS

CROSS-REFERENCE

This application is a continuation of U.S. application Ser. No. 15/585,376, filed on May 3, 2017, which claims priority to and benefit of U.S. Provisional Patent Application No. 62/331,404, filed on May 3, 2016, U.S. Provisional Patent Application No. 62/408,015, filed on Oct. 13, 2016, and U.S. Provisional Patent Application No. 62/421,120, filed on Nov. 11, 2016, each of which is entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2\sigma/k$, where 'S' is the Seebeck coefficient, 'a' is the electrical conductivity, and 'k' is thermal conductivity. Z is typically employed as the indicator of the COP and the efficiency of thermoelectric devices—that is, COP scales with Z. A dimensionless figure-of-merit, ZT, may be employed to quantify thermoelectric device performance, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with small figure-of-merit limits their applications in providing efficient thermoelectric cooling.

SUMMARY

Although there are thermoelectric devices currently available, recognized herein are various limitations associated with such thermoelectric devices. For example, some thermoelectric devices currently available may not be flexible and able to conform to objects of various shapes, making it difficult to maximize a surface area for heat transfer. As another example, some thermoelectric devices currently available are substantially thick and not suitable for use in electronic devices that require more compact thermoelectric devices.

In an aspect, a wearable electronic device comprises an electronic display with a user interface for displaying information to a user; and a power management unit operatively coupled with the electronic display, where the power management unit comprises an energy storage device and at least one thermoelectric device in electrical communication with the energy storage device, where the thermoelectric device comprises (i) a heat collecting unit that rests adjacent to a body surface of the user, which heat collecting unit collects thermal energy from the body surface of the user, (ii) a thermoelectric element in thermal communication with the heat collecting unit, and (iii) a heat expelling unit in thermal communication with the thermoelectric element, which heat expelling unit expels thermal energy from the thermoelectric element, where during use the thermoelectric element generates power upon flow of thermal energy from the heat collecting unit, across the thermoelectric element and to the heat expelling unit, wherein at least a portion of the power is stored in the energy storage device.

In some embodiments, the wearable electronic device is integrated with the power management unit. In some embodiments, the power management unit provides at least about 10% of a power requirement of the wearable electronic device. In some embodiments, the power management unit provides at least about 20% of a power requirement of the wearable electronic device. In some embodiments, the power management unit provides at least about 30% of a power requirement of the wearable electronic device. In some embodiments, the power management unit provides at least about 40% of a power requirement of the wearable electronic device. In some embodiments, the power management unit provides at least about 60% of a power requirement of the wearable electronic device. In some embodiments, the power management unit provides at least about 80% of a power requirement of the wearable electronic device. In some embodiments, the power management unit further comprises an external power unit for providing external power to charge the energy storage device.

In some embodiments, the wearable electronic device further comprises a casing containing the electronic display and the power management unit. In some embodiments, the heat expelling unit is at a side portion of the casing. In some embodiments, the casing is in thermal communication with the heat collecting unit. In some embodiments, the casing is in thermal communication with the heat expelling unit. In some embodiments, the casing is in thermal communication with both of the heat collecting unit and the heat expelling unit. In some embodiments, the casing is substantially waterproof or water resistant.

In some embodiments, the casing comprises lugs. In some embodiments, the lugs are in thermal communication with the heat expelling unit. In some embodiments, the lugs dissipate heat. In some embodiments, the lugs do not dissipate heat.

In some embodiments, the casing further comprises a bottom subassembly. In some embodiments, the bottom subassembly comprises a conductive plate. In some embodiments, the bottom subassembly comprises the thermoelectric element. In some embodiments, the bottom subassembly comprises a conductive backing. In some embodiments, during use the conductive backing is in thermal communication with the body of the user. In some embodiments, the bottom subassembly snaps into the casing. In some embodiments, the bottom subassembly comprises threads and the bottom subassembly threads into the casing. In some embodiments, the threads are thermally conductive.

In some embodiments, the heat expelling unit includes one or more heat sinks. In some embodiments, the one or more heat sinks are heat fins. In some embodiments, thermal communication between the thermoelectric element and the heat expelling unit is provided by at least one heat pipe. In some embodiments, thermal communication between the thermoelectric element and the heat expelling unit is provided by a heat spreader plate.

In some embodiments, the wearable electronic device further comprises a control unit operatively coupled to the electronic display and the power management unit, where the control unit regulates the display of the information on the user interface. In some embodiments, the wearable electronic device is a watch. In some embodiments, the user interface is a graphical user interface. In some embodiments, the user interface is an analog user interface. In some embodiments, the power management unit is included in a clasp that secures the electronic display to the body surface of the user. In some embodiments, the wearable electronic device further comprises a flexible circuit operatively coupled and in electrical communication with the electronic display and the power management unit. In some embodiments, the flexible circuit is a flexible printed circuit. In some embodiments, the flexible circuit is a flexible-flat cable.

In some embodiments, the wearable electronic device further comprises one or more power generation units in electrical communication with the energy store device. In some embodiments, the one or more power generation units are selected from the group consisting of a solar cell, an inductive coupling unit, a radio frequency coupling unit, and a kinetic power generation unit.

In an aspect, a method for using a wearable electronic device comprises activating the wearable electronic device, where the wearable electronic device comprises an electronic display with a user interface for displaying information to a user and a power management unit operatively coupled with the electronic display, where the power management unit comprises an energy storage device and at least one thermoelectric device in electrical communication with the energy storage device, where the thermoelectric device comprises (i) a heat collecting unit that rests adjacent to a body surface of the user, which heat collecting unit collects thermal energy from the body surface of the user, (ii) a thermoelectric element in thermal communication with the heat collecting unit, and (iii) a heat expelling unit in thermal communication with the thermoelectric element, which heat expelling unit expels thermal energy from the thermoelectric element; and using the thermoelectric element to generate power upon flow of thermal energy from the heat collecting unit, across the thermoelectric element and to the heat expelling unit, where at least a portion of the power is stored in the energy storage device.

In some embodiments, the wearable electronic device is integrated with the power management unit. In some embodiments, the power management unit provides at least about 10% of a power requirement of the wearable electronic device. In some embodiments, the power management unit provides at least about 20% of a power requirement of the wearable electronic device. In some embodiments, the power management unit provides at least about 30% of a power requirement of the wearable electronic device. In some embodiments, the power management unit provides at least about 40% of a power requirement of the wearable electronic device. In some embodiments, the power management unit provides at least about 60% of a power requirement of the wearable electronic device. In some embodiments, the power management unit provides at least about 80% of a power requirement of the wearable electronic device. In some embodiments, the power management unit further comprises an external power unit for providing external power to charge the energy storage device.

In some embodiments, the wearable electronic device further comprises a casing containing the electronic display and the power management unit. In some embodiments, the heat expelling unit is at a side portion of the casing. In some embodiments, the casing is in thermal communication with the heat collecting unit. In some embodiments, the casing is in thermal communication with the heat expelling unit. In some embodiments, the casing is in thermal communication with both of the heat collecting unit and the heat expelling unit. In some embodiments, the casing is substantially waterproof or water resistant.

In some embodiments, the casing comprises lugs. In some embodiments, the lugs are in thermal communication with the heat expelling unit. In some embodiments, the lugs dissipate heat. In some embodiments, the lugs do not dissipate heat.

In some embodiments, the casing further comprises a bottom subassembly. In some embodiments, the bottom subassembly comprises a conductive plate. In some embodiments, the bottom subassembly comprises the thermoelectric element. In some embodiments, the bottom subassembly comprises a conductive backing. In some embodiments, during use the conductive backing is in thermal communication with the body of the user. In some embodiments, the bottom subassembly snaps into the casing. In some embodiments, the bottom subassembly comprises threads and the bottom subassembly threads into the casing. In some embodiments, the threads are thermally conductive.

In some embodiments, the heat expelling unit includes one or more heat sinks. In some embodiments, the one or more heat sinks are heat fins. In some embodiments, thermal communication between the thermoelectric element and the heat expelling unit is provided by at least one heat pipe. In some embodiments, thermal communication between the thermoelectric element and the heat expelling unit is provided by a heat spreader plate.

In some embodiments, the wearable electronic device further comprises a control unit operatively coupled to the electronic display and the power management unit, where the control unit regulates the display of the information on the user interface. In some embodiments, the wearable electronic device is a watch. In some embodiments, the user interface is a graphical user interface. In some embodiments, the user interface is an analog user interface. In some embodiments, the power management unit is included in a clasp that secures the electronic display to the body surface of the user. In some embodiments, the wearable electronic device further comprises a flexible circuit operatively coupled and in electrical communication with the electronic display and the power management unit. In some embodiments, the flexible circuit is a flexible printed circuit. In some embodiments, the flexible circuit is a flexible-flat cable.

In some embodiments, the wearable electronic device further comprises one or more power generation units in electrical communication with the energy store device. In some embodiments, the one or more power generation units are selected from the group consisting of a solar cell, an inductive coupling unit, a radio frequency coupling unit, and a kinetic power generation unit.

In an aspect, a method for manufacturing a wearable electronic device, comprising (i) assembling an electronic display with a user interface for displaying information to a user, and (ii) assembling a power management unit to yield the wearable electronic device, where the power management unit is operatively coupled with the electronic display, wherein the power management unit comprises an energy storage device and at least one thermoelectric device in electrical communication with the energy storage device, where the thermoelectric device comprises (i) a heat collecting unit that rests adjacent to a body surface of the user, which heat collecting unit collects thermal energy from the body surface of the user, (ii) a thermoelectric element in thermal communication with the heat collecting unit, and (iii) a heat expelling unit in thermal communication with the thermoelectric element, which heat expelling unit expels thermal energy from the thermoelectric element, where the wearable device is configured such that, during use, the thermoelectric element generates power upon flow of thermal energy from the heat collecting unit, across the thermoelectric element, and to the heat expelling unit, where at least a portion of the power is stored in the energy storage device.

In some embodiments, the wearable electronic device comprises a casing containing the electronic display and the power management unit. In some embodiments, the casing comprises a top side and a bottom side and wherein the electronic display is disposed adjacent to the top side of the casing. In some embodiments, the electronic display and the power management unit are loaded into the casing from the top side of the casing. In some embodiments, the electronic display and the power management unit are loaded into the casing from the bottom side of the casing.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 3A is a top view of the case top heat sink of the wearable device of FIG. 1; FIG. 3B is an isometric view of the case top heat sink of the wearable device of FIG. 1; FIG. 3C is a right side view of the case top heat sink of the wearable device of FIG. 1; FIG. 3D is a front side view of the case top heat sink of the wearable device of FIG. 1; FIG. 3E is a bottom view of the case top heat sink of the wearable device of FIG. 1;

FIG. 4A is a top view of the case back conductor of the wearable device of FIG. 1; FIG. 4B is an isometric view of the case back conductor of the wearable device of FIG. 1; FIG. 4C are side views of the case back conductor of the wearable device of FIG. 1; FIG. 4D is a bottom view of the case back conductor of the wearable device of FIG. 1;

FIG. 19A is a cross-sectional side view of the wearable device of FIG. 17; FIG. 19B is a front view of the wearable device of FIG. 17;

FIG. 23A is a perspective view of the wearable device of FIG. 21A; FIG. 23B is a detail view corresponding to FIG. 23A;

DETAILED DESCRIPTION

Figure 1:
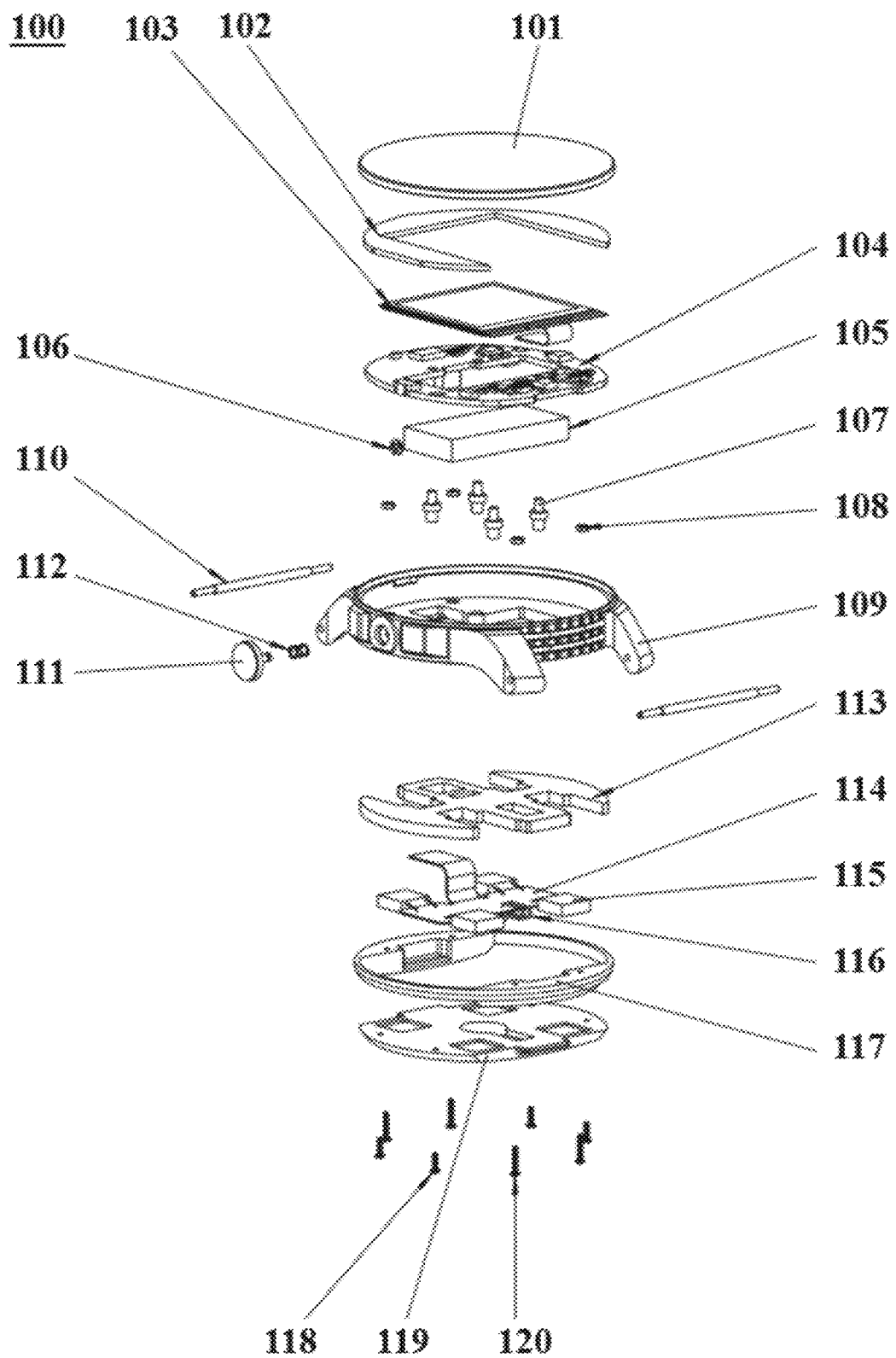
FIG. 1 shows an exploded view of a wearable device, in accordance with an embodiment of the present disclosure.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The term "nanostructure," as used herein, generally refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the dimension (e.g., width) is less than about 1000 nanometers ("nm"), or 500 nm, or 100 nm, or 50 nm, or smaller. Nanostructures can include holes formed in a substrate material. The holes can form a mesh having an array of holes. In other cases, nanostructure can include rod-like structures, such as wires, cylinders or box-like structure. The rod-like structures can have circular, elliptical, triangular, square, rectangular, pentagonal, hexagonal, heptagonal, octagonal or nonagonal, or other cross-sections.

The term "nanohole," as used herein, generally refers to a hole, filled or unfilled, having a width or diameter less than or equal to about 1000 nanometers ("nm"), or 500 nm, or 100 nm, or 50 nm, or smaller. A nanohole filled with a metallic, semiconductor, or insulating material can be referred to as a "nanoinclusion."

The term "nanowire," as used herein, generally refers to a wire or other elongate structure having a width or diameter that is less than or equal to about 1000 nm, or 500 nm, or 100 nm, or 50 nm, or smaller.

The term "n-type," as used herein, generally refers to a material that is chemically doped ("doped") with an n-type dopant. For instance, silicon can be doped n-type using phosphorous or arsenic.

The term "p-type," as used herein, generally refers to a material that is doped with a p-type dopant. For instance, silicon can be doped p-type using boron or aluminum.

The term "metallic," as used herein, generally refers to a substance exhibiting metallic properties. A metallic material can include one or more elemental metals.

The term "monodisperse," as used herein, generally refers to features having shapes, sizes (e.g., widths, cross-sections, volumes) or distributions (e.g., nearest neighbor spacing, center-to-center spacing) that are similar to one another. In some examples, monodisperse features (e.g., holes, wires) have shapes or sizes that deviate from one another by at most about 20%, 15%, 10%, 5%, 4%, 3%, 2%, 1%, 0.5%, or 0.1%. In some cases, monodisperse features are substantially monodisperse.

The term "etching material," as used herein, generally refers to a material that facilitates the etching of substrate (e.g., semiconductor substrate) adjacent to the etching material. In some examples, an etching material catalyzes the etching of a substrate upon exposure of the etching material to an oxidizing agent and a chemical etchant.

The term "etching layer," as used herein, generally refers to a layer that comprises an etching material. Examples of etching materials include silver, platinum, chromium, molybdenum, tungsten, osmium, iridium, rhodium, ruthenium, palladium, copper, nickel and other metals (e.g., noble metals), or any combination thereof, or any non-noble metal that can catalyze the decomposition of a chemical oxidant, such as, for example, copper, nickel, or combinations thereof.

The term "etch block material," as used herein, generally refers to a material that blocks or otherwise impedes the etching of a substrate adjacent to the etch block material. An etch block material may provide a substrate etch rate that is reduced, or in some cases substantially reduced, in relation to a substrate etch rate associated with an etching material. The term "etch block layer," as used herein, generally refers to a layer that comprises an etch block material. An etch block material can have an etch rate that is lower than that of an etching material.

The term "reaction space," as used herein, generally refers to any environment suitable for the formation of a thermoelectric device or a component of the thermoelectric device. A reaction space can be suitable for the deposition of a material film or thin film adjacent to a substrate, or the measurement of the physical characteristics of the material film or thin film. A reaction space may include a chamber, which may be a chamber in a system having a plurality chambers. The system may include a plurality of fluidically separated (or isolated) chambers. The system may include multiple reactions spaces, with each reaction space being fluidically separated from another reaction space. A reaction space may be suitable for conducting measurements on a substrate or a thin film formed adjacent to the substrate.

The term "current density," as used herein, generally refers to electric (or electrical) current per unit area of cross section, such as the cross section of a substrate. In some examples, current density is electric current per unit area of a surface of a semiconductor substrate.

The term "adjacent" or "adjacent to," as used herein, includes 'next to', 'adjoining', 'in contact with', and 'in proximity to'. In some instances, adjacent components are separated from one another by one or more intervening layers. The one or more intervening layers may have a thickness less than about 10 micrometers ("microns"), 1 micron, 500 nanometers ("nm"), 100 nm, 50 nm, 10 nm, 1 nm, 0.5 nm or less. For example, a first layer adjacent to a second layer can be in direct contact with the second layer. As another example, a first layer adjacent to a second layer can be separated from the second layer by at least a third layer.

Wearable Devices with Thermoelectric Modules

Another aspect of the present disclosure provides a wearable electronic device (e.g., watch) with at least one thermoelectric module or unit. Such thermoelectric module or unit may be used to provide at least some or all of the power for use by the wearable electronic device. The electronic device may be a watch, such as a smart watch. The thermoelectric module or unit may be flexible.

The wearable electronic device may be wearable on various body parts of a user. For example, the wearable electronic device may be wearable on an arm, hand, wrist, foot, ankle, or neck of the user, or an article of clothing of or other object worn by the user. The wearable electronic device may be substantially waterproof or water resistant. In some cases, the wearable electronic device may be water resistant but not waterproof.

The wearable electronic device may include a power management unit that includes one or more thermoelectric devices and, in some cases, an energy storage device, such as a battery. The battery may be a solid state battery (e.g., lithium ion battery).

The wearable electronic device may include a user interface. The user interface may be a digital or analog user interface. The user interface may be a graphical user interface.

The wearable electronic device may be charged by the one or more thermoelectric devices. The one or more thermoelectric devices may provide at least about 10%, at least about 20%, at least about 30%, at least about 40%, at least about 50%, at least about 60%, at least about 70%, at least about 80%, at least about 90%, or more of the power requirement of the wearable electronic device. The wearable electronic device may be charged by one or more external or alternate sources of energy. The wearable electronic device may be charged by both the thermoelectric device and an alternate energy source. The wearable electronic device may be charged by both the thermoelectric and an external energy source. External or alternate sources of energy may include wired charging, inductive charging, radio frequency (RF) charging, solar charging, and kinetic charging. The wearable electronic device may be at least partially charged using a charging connector that directly attaches to a power management unit of the wearable electronic device. The wearable electronic device may be at least partially charged using an inductive unit in electrical communication with the power management unit. The inductive unit may generate power for the power management unit and/or energy storage device upon coupling to an external magnetic field. The wearable electronic device may be at least partially charged using a RF charging unit in electrical communication with the power management unit. The RF charging unit may generate power for the power management unit and/or energy storage device upon coupling to a RF transmitter. The wearable electronic device may be at least partially charged using solar cells in electrical communication with the power management unit. The solar cells may generate power for the power management unit and/or energy storage device upon exposure to light. The wearable electronic device may be at least partially charged using a kinetic power generation unit in electrical communication with the power management unit. The kinetic power generation unit may generate power for the power management unit and/or energy storage device upon motion of a user's body.

The wearable device may include one or more heat collecting units, one or more thermoelectric elements, and one or more heat expelling units. The one or more heat collecting units may rest adjacent to a body surface of a user when the wearable device is donned, and may comprise a case back conductor, and upper body heat conductor plate, a lower body heat conductor plate, and one or more body heat conductor nodes. The one or more thermoelectric elements may be in thermal communication with the one or more heat collecting units. The one or more thermoelectric elements may also be in thermal communication with the one or more heat expelling units. Thermal communication between the thermoelectric elements and the heat expelling units may be provided by a heat pipe, a vapor chamber, a heat spreader plate, or a combination thereof. The one or more heat expelling units may expel thermal energy from the one or more thermoelectric elements, and may comprise a case top heat sink, a top side heat sink, a bottom side heat sink, and one or more external heat sink nodes.

Reference will now be made to the figures, wherein like numerals refer to like parts throughout. It will be appreciated that the figures and features therein are not necessarily drawn to scale.

FIG. 1 shows an exploded view of a wearable device 100. The wearable device 100 in the illustrated example is a watch. The wearable device 100 may include one or more of a top glass 101, a display retainer 102, an electronic display 103, a main printed circuit board (PCB) 104, a battery 105, a retaining ring 106, one or more standoffs 107, one or more captive nuts 108, a case top heat sink 109, one or more spring bars 110, a watch button 111, a button spring 112, an insulator spacer 113, a flexible printed circuit 114, one or more thermoelectric generators (TEGs) 115, a vibration motor (VIB) 116, an insulator ring 117, one or more cosmetic screws 118, a case back conductor 119, and one or more assembly screws 120. The TEGs 115 may be any thermoelectric module or material described herein.

The one or more TEGs 115 may be in thermal communication with the case top heat sink 109 through a thermal conducting medium. In some examples, the one or more TEGs 115 are in thermal communication with the case tope heat sink 109 through at least one heat pipe or vapor chamber. The heat pipe or vapor chamber may serve to expel thermal energy from the TEGs 115 more effectively than bulk thermal conductors.

The wearable device 100 may be coupled to a body part of a user, such as a hand of a user. During use, thermal energy may flow from a hot side of the wearable device 100 through the TEGs 115 to a cold side of the wearable device 100. Upon the flow of thermal energy, the TEGs 115 may generate power that may be stored as electrical energy in the battery 105, directed to the main PCB 104, and/or used by the electronic display 103.

The main PCB 104 may include one or more central processing units (CPUs). The CPUs may be coupled to the electronic display 103 to present information to a user, such as time, electronic mail, or notifications, or the like.

The top glass 101 may be formed of a material which magnifies an image, such as a lens. The watch lens may be a transparent glass or plastic component which may be adhered to a recessed groove in the top of the case top heat sink 109. The watch lens may cover the top of the assembly and hold the internal components inside of the case top. Using paint, a decal, silk screen, pad printing or similar, a mask may be created to selectively expose or hide certain internal components.

The display retainer 102 may have a cutout which allows the display retainer 102 to complementarily receive the outer perimeter of the electronic display 103. The outer perimeter of the display retainer 102 may also be notched so as to be complementarily received by a matching key feature in the case top heat sink 109. When assembled, this may allow the display retainer 102 to locate and lock the electronic display 103 in a plane parallel to the top surface of the watch lens 101.

The electronic display 103 may be a low-power screen which displays the graphical user interface. The electronic display 103 may be a capacitive touchscreen or a resistive touchscreen. As an alternative, the electronic display 103 may be a passive display.

The main printed circuit board (PCB) 104 may include one or more of electrical components, wiring, and firmware necessary for power management, sensing, display, button inputs, diagnostics, and/or vibration outputs. The main PCB 104 may include an onboard energy storage device.

The battery 105 may provide energy storage for the electrical system. The battery 105 may be charged by electrical energy that is generated by the TEGs 115. The battery 105 may be charged by an external power source, such as electrical energy from a power grid.

The retaining ring 106 may be an E-style external side-mount ring which seats in a groove in the watch button. The retaining ring 106 may fasten the watch button 111 to the case top.

The one or more standoffs 107 may be used as spacers to hold the main PCB 104 off of the watch body pieces. The top edges of these standoffs 107 may also support the bottom of the electronic display 103, maintaining a specified separation between the electronic display 103, the main PCB 104, and the case top. In the illustrated example, there are four standoffs 107, but other numbers of standoffs may be used.

The one or more captive nuts 108 may be recessed in the case top heat sink. Captive nuts 108 may comprise inserts which allow the assembly screws 120 to be threaded into place. In the illustrated example, there are four captive nuts 108, but other numbers of captive nuts may be used.

The case top heat sink 109 may include a highly conductive body which is exposed to the ambient air. A thermal contact plane with a smooth and flat bottom surface may be pressed against the "cold side" of the TEGs 115. This thermal contact plane creates a thermal pathway between the TEG "cold side" and the ambient air. The case top may act as a heat sink, minimizing the temperature gradient between the ambient air and the TEG "cold side". The external ridge and groove features increase the exposed surface area which improves the heat transfer to air. The case top may also hold one or more of an electronic display 103, a main PCB 104, a battery 105, and a watch lens. The case top may include lugs which allow for the attachment of a watch strap via the spring bars 110. The lugs may be in thermal communication with the heat expelling unit. The lugs may dissipate heat. Alternatively, or in addition to, the lugs may not dissipate heat. The case top may include features for positioning and guiding the watch button 111. The case top may be produced from a material with a high coefficient of thermal conductivity, such as, for example, an aluminum or copper alloy.

The one or more spring bars 110 may be used to attach and detach different watch bands to the assembly. In the illustrated example, there are two spring bars 110, but other numbers of spring bars may be used.

The watch button 111 may transfer a push input from the user into an edge-mounted SMT switch on the main PCB 104. Depressing the watch button 111 compresses the button spring 112. The watch button 111 may be an interface element, which is produced from a material with a high coefficient of thermal conductivity such as an aluminum or copper alloy. The watch button 111 may be used for one or more of menu navigation, user-interface manipulation, and power cycling.

The button spring 112 may act as a pre-load which keeps the watch button 111 extended and/or not in direct contact with the switch on the main PCB 104, thereby minimizing accidental presses by the user of the wearable device. The button spring 112 may be held in place between the watch button 111 and the case top heat sink 109.

The insulator spacer 113 may fill in other voids in the assembly around one or more of the TEGs 115, the battery 105, and other exposed wires or electronic components. The insulator spacer 113 may be made from a compressible urethane foam material. The insulator spacer 113 may aid in the insulation between the case back conductor 119 and the case top heat sink 109. The insulator spacer 113 may also serve to minimize vibrations or movements in one or more of the TEG wiring, the vibration motor wiring, and the TEG/VIB flexible printed circuit (FPC) 114.

The TEG/VIB FPC 114 may allow the TEGs 115 and vibration motor 116 to be electrically connected to the main PCB 104.

The one or more TEGs 115 may be solid state devices which convert a temperature gradient between two opposing surfaces into electrical energy. The two opposing surfaces may be referred to as a "cold side" and a "hot side". The cold side may be at a lower temperature than the hot side. In the wearable device, the cold side of the TEGs 115 may comprise a case top heat sink 109. The hot side of the TEGs 115 may comprise a case back conductor 119.

The vibration motor 116 may provide haptic feedback and user notifications via vibrations transferred to the case back conductor 119.

The insulator ring 117 may retain the case back and transfer the clamping load from the assembly screws 120 through the case back and into the TEGs 115. The insulator ring 117 may be made from a low thermal conductivity plastic material. The insulator ring 117 may also separate the case back conductor 119 from the case top heat sink 109. The insulator ring 117 may have a low thermal conductivity, such that the insulator ring creates a poor heat pathway from the case back conductor 119 to the case top heat sink 109. This insulating effect maximizes the temperature gradient created across the hot and cold sides of the TEGs 115.

The one or more cosmetic screws 118 may be made from the same material and the same screw type as the assembly screws 120. The cosmetic screws 118 may be fastened in place through the case back conductor 119. The cosmetic screws 118 may be added in place to create an aesthetically pleasing circular bolt pattern on the bottom of the watch assembly. In the illustrated example, there are four cosmetic screws 118, but other numbers of cosmetic screws may be used.

The case back conductor 119 may comprise a highly conductive body which can be exposed to the user's body (e.g., wrist) on one side and/or in direct contact with the TEGs 115 on the opposing side. The case back may create a heat pathway which conducts heat from the user's body to the "hot side" of each of the one or more TEGs 115. Wherever the case back is not in contact with a TEG surface or air, the case back body is insulated from the case top. The case back conductor 119 may be produced from a material with a high coefficient of thermal conductivity such as an aluminum or copper alloy.

The one or more assembly screws 120 may pull the watch enclosure together. When threaded into the captive nuts 108, assembly screw heads may pull the insulator ring 117 against the case back conductor 119, which may, in turn, push the TEGs 115 against the case top heat sink 109. The assembly screws 120 ensure the "hot side" and "cold side" of the TEGs 115 are pressed against the case back and case top, respectively. In the illustrated example, there are four assembly screws 120, but other numbers of assembly screws may be used.

Figure 2:
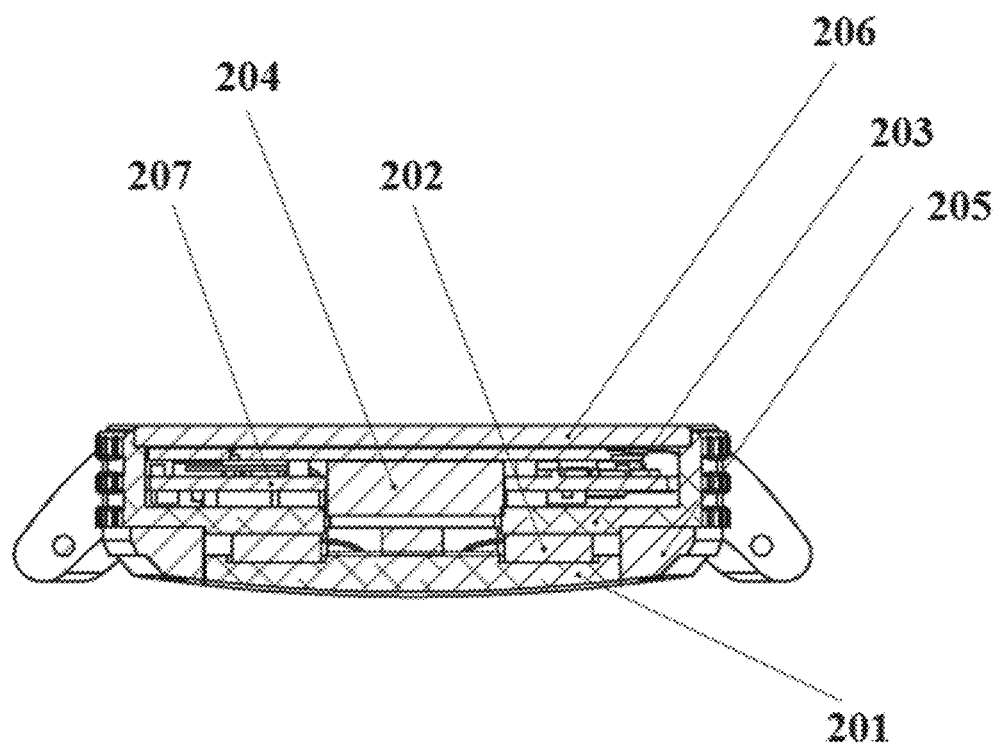
FIG. 2 shows a section view of the wearable device of FIG. 1, in accordance with an embodiment of the present disclosure.

FIG. 2 shows a section view of the wearable device of FIG. 1. The wearable device may include one or more of a case back conductor 201, one or more thermoelectric generators (TEGs) 202, a case top heat sink 203, a battery 204, an insulator ring 205, a watch lens 206, and a main PCB 207.

During operation of the wearable device, the case back conductor 201 may efficiently draw body heat from the user's body (e.g, wrist) to the "hot side" (which may be the bottom side) of the TEG 202. The "cold side" (which may be the top side) of the TEG may be connected to the case top heat sink 203, which may efficiently dissipate heat from the TEG to the ambient air. The TEG may use this temperature gradient across its "hot side" and "cold side" to generate electrical energy. This electrical energy may be stored in the battery 204. The insulator ring 205 may create a poor heat pathway from the case back conductor to the case top heat sink, thereby maximizing the temperature gradient across the "hot side" and "cold side" of the TEG. The watch lens 206 may hold the wearable device's internal components inside of the case top. The main PCB 207 may include the electrical components, wiring, and firmware necessary for power management, sensing, display, button inputs, diagnostics, and vibration outputs.

FIGS. 3A-3E show various views of the case top heat sink of the wearable device of FIG. 1. FIG. 3A is a top view of the case top heat sink of the wearable device. FIG. 3B is a perspective view of the case top heat sink of the wearable device. FIG. 3C is a right side view of the case top heat sink of the wearable device. FIG. 3D is a front side view of the case top heat sink of the wearable device. FIG. 3E is a bottom view of the case top heat sink of the wearable device. The wearable device's case top heat sink may include one or more of a cutout 301, a button bearing 302, a thermal contact plane 303, a set of ridges and grooves 304, and a contact surface 305.

The thermal contact plane 303 (shown in FIG. 3B) may be a material which sits above the TEGs and which may create a thermal pathway between the "cold side" of the TEGs and the exposed surface area in contact with ambient air. The thermal contact plane may contain a cutout 301 (shown in FIG. 3A), which may be a through-hole cutout which allows thicker components to be recessed below the thermal contact plane. The contact surface 305 (shown in FIG. 3E) may be a flat and smooth contact area, which allows for good thermal contact between the case top heat sink and the "cold-side" of the TEGs. This surface may be coated in a thermally conductive paste, pad, or epoxy to enhance the quality of the TEG surface contact. The set of ridges and grooves 304 (shown in FIG. 3D) may comprise features that increase the exposed surface area of the watch case, thereby increasing the overall heat transfer to ambient air. The button bearing 302 (shown in FIG. 3C) may act as a bearing surface and guide for the watch button.

FIGS. 4A-4D show various views of the case back conductor of the wearable device of FIG. 1. FIG. 4A is a top view of the case back conductor of the wearable device. FIG. 4B is a perspective view of the case back conductor of the wearable device. FIG. 4C are side views of the case back conductor of the wearable device. FIG. 4D is a bottom view of the case back conductor of the wearable device. The case back conductor of the wearable device may include one or more of a TEG contact surface 401, a vibration motor recess 402, and one or more tabs 403.

The TEG contact surface 401 (shown in FIG. 4B) may be a flat and smooth contact area, which may allow for good thermal contact between the case back and the "hot side" of the TEGs. This surface may be coated in a thermally conductive paste, pad, or epoxy to enhance the quality of the TEG surface contact. The vibration motor recess 402 (shown in FIG. 4A) may be a pocket in which the vibration motor is installed, such that the vibration motor may be placed as close to the wearable device user's body (e.g., wrist) as possible. The one or more tabs 403 (shown in FIGS. 4C-D) may interface with the insulator ring. The one or more assembly screws may be tightened down, causing the case back to clamp the TEGs against the case top heat sink. In the illustrated example, there are two tabs, but other numbers of tabs may be used.

Figures 5A, 5B, 5C:
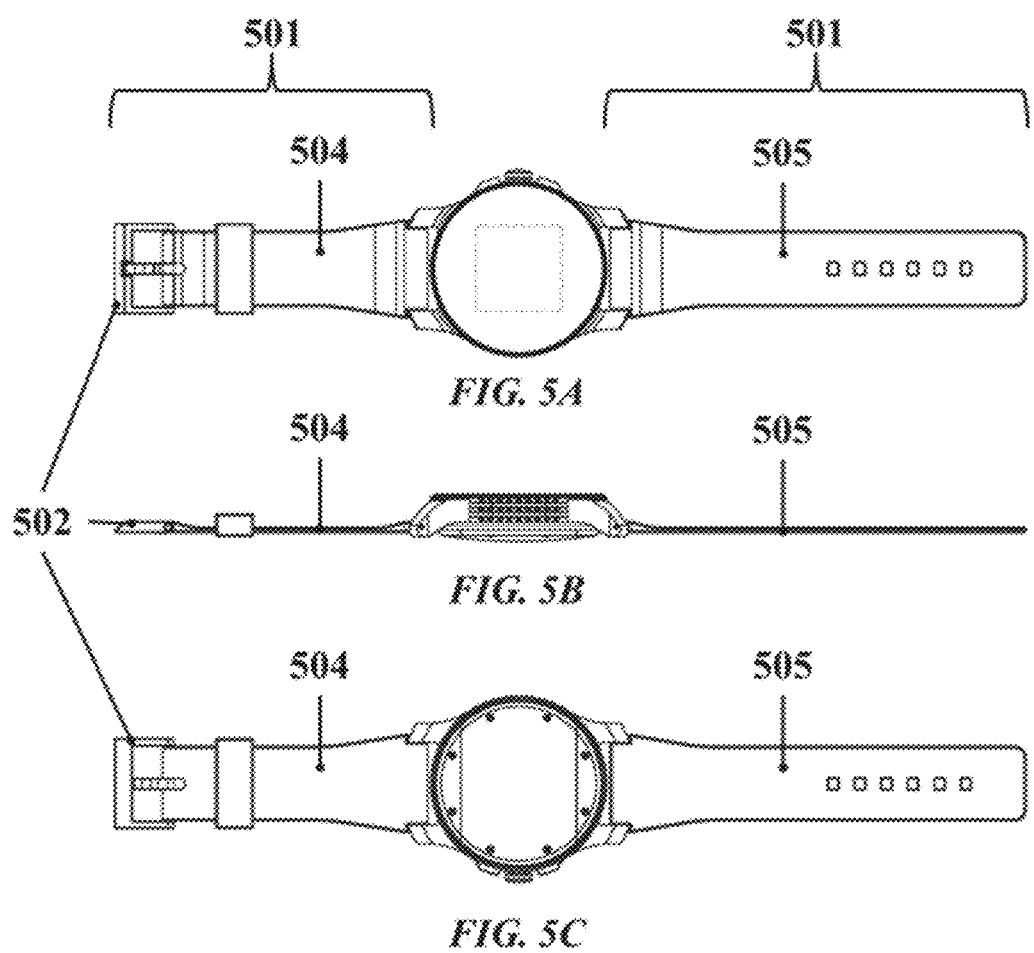
FIG. 5A is a top view of the wearable device of FIG. 1.
FIG. 5B is a left side view of the wearable device of FIG. 1.
FIG. 5C is a bottom view of the wearable device of FIG. 1.

FIGS. 5A-C show various views of the wearable device of FIG. 1. FIG. 5A is a top view of the wearable device. FIG. 5B is a left side view of the wearable device. FIG. 5C is a bottom view of the wearable device.

The wearable device may include a watch band 501. The watch band 501 may ensure that the user of the wearable device can comfortably tighten the watch strap, such that the case back conductor of the wearable device is solidly pressed against their body (e.g., wrist). A tight thermal connection between the case back conductor and the user's body (e.g., wrist) may ensure a sufficient temperature gradient in the case back conductor for electrical power generation by the TEGs. The watch band may be made from a flexible material, such as silicone or TPE, with a conventional buckle with discrete adjustment points, to allow comfortable tightening of the watch band.

The watch band 501 may include one or more of a clasp 502 and one or more straps. The one or more straps may include a top strap 504 and a bottom strap 505, which may be wrapped around either side of the wearable device user's body (e.g., wrist) for secure wearing. The top strap may have a clasp at the end. The bottom strap may have a row of several holes. The clasp may be used to secure the one or more straps of the wearable device around the user's body (e.g., wrist). The clasp may adjust to the size of the user's body for comfortable and secure wearing.

FIG. 5A additionally shows the case top heat sink of the wearable device. FIG. 5B additionally shows the ridges and grooves of the wearable device. FIG. 5C additionally shows the case back conductor of the wearable device.

The wearable device can include at least about 1, 2, 3, 4, 5, 6, 7, 8, 9, 10, 50, 100, 500, or 1000 or more thermoelectric generators. Each thermoelectric generator can include a plurality of thermoelectric elements. Examples of thermoelectric elements are provided elsewhere herein.

The one or more thermoelectric generators of the wearable device can individually or collectively provide output power of at least about 1 microwatts ($\mu$W), 10 $\mu$W, 100 $\mu$W, 1 milliwatt (mW), 10 mW, 20 mW, 30 mW, 40 mW, 50 mW, 100 mW, or 1 watt (W), in some cases from 1 $\mu$W to 10 mW, at a voltage of at least about 1 millivolt (mV), 2 mV, 3 mV, 4 mV, 5 mV, 10 mV, 20 mV, 30 mV, 40 mV, 50 mV, 100 mV, 200 mV, 300 mV, 400 mV, 500 mV, 1 volt (V), 2 V, 3 V, 4 V, 5 V or 10 V, in some cases from about 10 mV to 10 V. In some situations, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and can be used to power circuits directly or to trickle charge a power storage unit such as a battery. An auxiliary power supply, such as a battery, can also be included in the apparatus to provide reserve power in times of intermittent bodily contact, decreased power output or increased power consumption.

Figure 17:
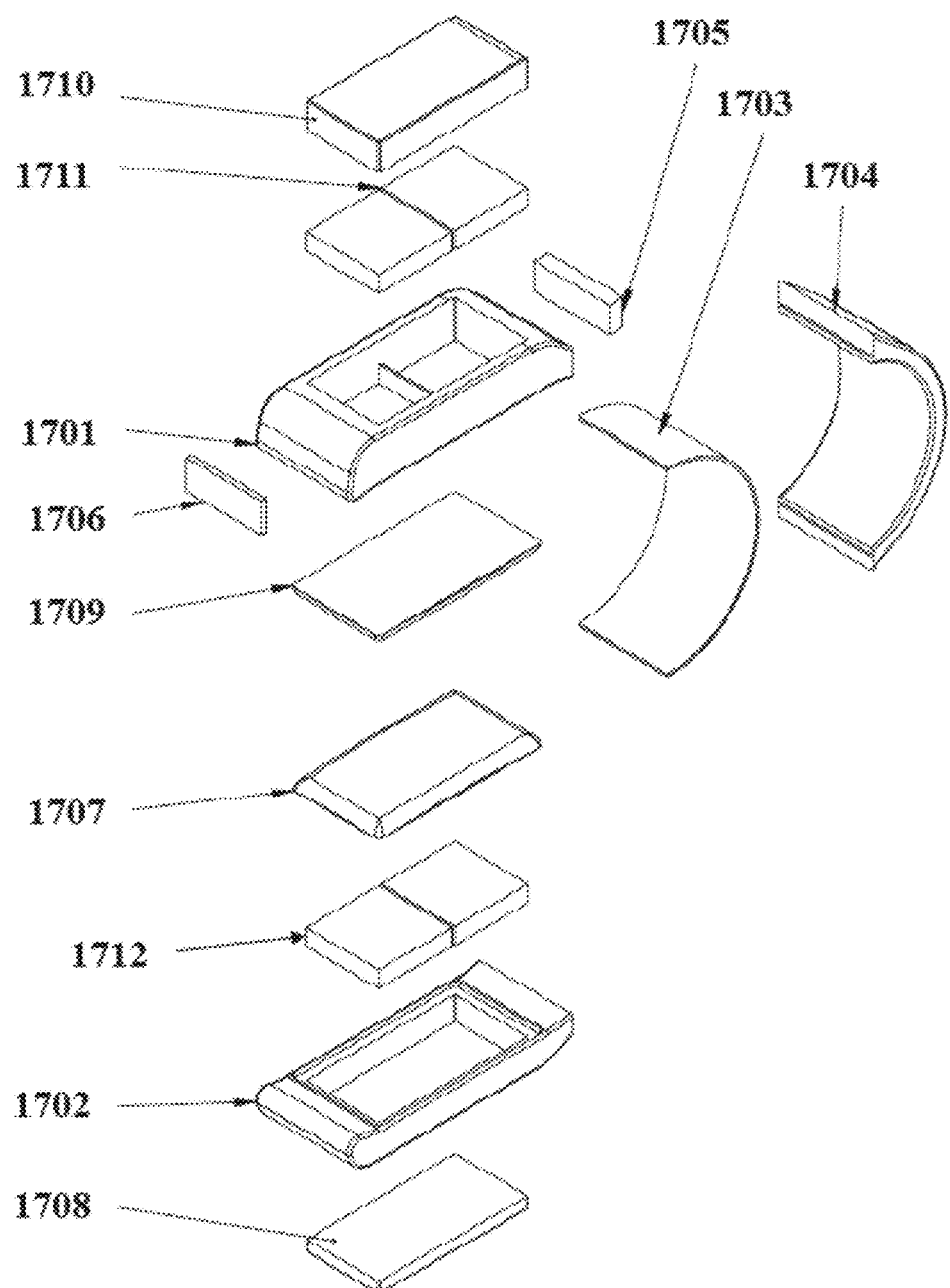
FIG. 17 shows an exploded view of a wearable device, in accordance with an embodiment of the present disclosure.

FIG. 17 shows another example of a wearable device 1700. The wearable device includes a top enclosure 1701 and a bottom enclosure 1702. The top enclosure 1701 may encase upper TEGs 1711 and serve as the chassis to which an upper body heat conductor plate 1709 and top side heat sink 1710 attach. The top enclosure 1701 may be mechanically joined to the spring band 1704. This enclosure may sit across a dorsal or top side of either of a user's body (e.g., wrist). Electronics, including elements of the processing circuitry, sensors, energy harvesting & storage circuits, user interface elements, or communication systems, may be located inside this enclosure. The bottom enclosure 1702 may encase the lower TEGs 1712 and serve as the chassis to which the lower body heat conductor plate 1707 and bottom side heat sink 1708 attach. The bottom enclosure 1702 may be mechanically joined to the spring band 1704. This enclosure may sit across the palmar or bottom side of either of a user's body (e.g., wrist). Like the top enclosure 1701, a variety of electronics may also be located and mounted inside this enclosure.

The wearable device 1700 may further include a flexible circuit 1703 such as a flexible printed circuit or a flexible-flat cable or similar. The flexible circuit 1703 may electrically connect components in the top enclosure 1701 (e.g., located on the palmar side of the user's wrist) to those in the bottom enclosure 1702 (e.g., located on the distal side of the user's wrist). Additional TEGs, sensors, or circuit elements may also be connected to the flexible circuit 1703 at a variety of positions, allowing components to be located inside the spring band 1704 (i.e., where they may contact the user's body). The spring band 1704 may serve as the mechanical connection between components in the top enclosure 1701 (e.g., located on the palmar side of the user's wrist) to those in the bottom enclosure 1702 (e.g., located on the distal side of the user's wrist). This leaf-spring like structure may flex open to allow a user to place the device onto their body (e.g., wrist). This flexibility may also allow for users of different sizes (e.g., users with different wrist sizes) to make use of the same product. The spring band 1704 and flexible circuit 1703 can also be manufactured in different sizes to cover an even larger variation in user size (e.g., user wrist thickness). The spring band may maintain a slight compression on the top and bottom sides of the wrist, ensuring that the surfaces of the body heat conductor plates 1707 and 1709 are in good thermal contact with the user's skin. In some situations, the wearable device 1700 further includes a battery 1705 that provides energy storage for the electrical system and a main PCB 1706 which includes the electrical components, wiring, and firmware necessary for power management, sensing, display, user inputs, diagnostics, and interface outputs.

In some situations, the lower body heat conductor plate 1707 includes a highly conductive body which is exposed to the user's body (e.g., wrist) on one side and in direct contact with the TEGs on the opposing side. The body heat conductor plate may create a heat pathway which conducts heat from the user's body to the "hot-side" of each of the TEGs. Wherever the conductor plate is not in contact with a TEG surface or air, the conductor plate may be insulated from the opposing heat sink 1708. The lower body heat conductor plate 1707 may be produced from a material with a high coefficient of thermal conductivity such as an aluminum or copper alloy. In some situations, the surface that is to be in contact with the user's body (e.g., wrist) may be formed in a domed or contoured shape so as to optimize the thermal contact area between the exposed surface and the user's skin. The upper body heat conductor plate 1709 may allow for a second thermal pathway through an additional set of TEGs. In some situations, the design of the wearable device 1700 can be further segmented, adding additional skin contact points and thermal pathways around the perimeter of the user's body (e.g., wrist).

The bottom side heat sink 1708 may include a highly conductive body which is exposed to the ambient air. A thermal contact plane with a smooth and flat bottom surface may be pressed against the "cold-side" of the TEGs (with or without thermal paste in-between). This thermal contact plane may create a thermal pathway between the TEG "cold-side" and the ambient air. In this configuration, the bottom side heat sink 1708 serves to minimize the temperature gradient between the ambient air and the TEG "cold-side". The top side heat sink 1710 may complete the thermal pathway to ambient air for the TEGs on the top side of the assembly.

Figure 18A:
FIG. 18A is a top view of the wearable device of FIG. 17.
Figure 18B:
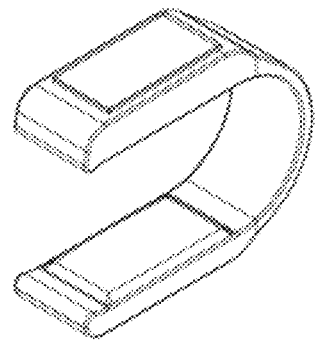
FIG. 18B is a perspective view of the wearable device of FIG. 17.
Figure 18C:
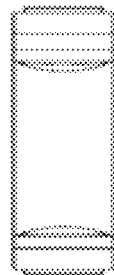
FIG. 18C is a front view of the wearable device of FIG. 17.
Figure 18D:
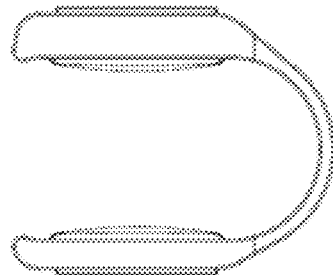
FIG. 18D is a side view of the wearable device of FIG. 17.

FIGS. 18A-18D show various views of the wearable device 1700. FIG. 18A is a top view of the wearable device. FIG. 18B is a perspective view of the wearable device. FIG. 18C is a front view of the wearable device. FIG. 18D is a side view of the wearable device.

Figure 20A:
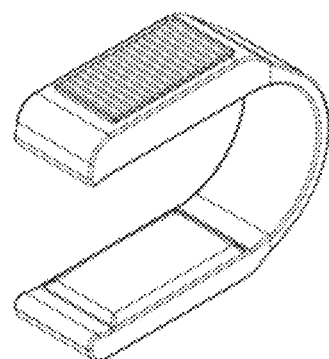
FIG. 20A is a perspective view of the wearable device of FIG. 17 with heatsink fins.
Figure 20B:
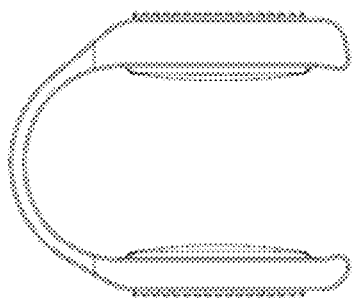
FIG. 20B is a side view of the wearable device of FIG. 17 with heatsink fins.
Figure 20C:
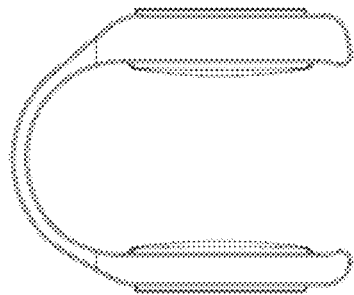
FIG. 20C is a side view of the wearable device of FIG. 17 without heatsink fins.

FIG. 19A is a cross-sectional side view at section A-A (FIG. 19B) of the wearable device 1700. The wearable device may comprise, as shown in FIG. 19A, a top enclosure 1701, a bottom enclosure 1702, a flexible circuit 1703, a spring band 1704, a battery 1705, a PCB 1706, bottom and top side heat sinks 1708 & 1710, lower and upper heat conductor plates 1707 & 1709 and TEGs 1711 & 1712. The TEGs may be solid state devices which convert a temperature gradient between two opposing surfaces into electrical energy. Each device may comprise one or more TEGs, for example, about 1, 2, 3, 4, 5, 6, 7, 8, 9, 10, 12, 14, 16, 18, or 20 or more TEGs. The surface area of the heat sink that is exposed to ambient air can be re-sized, reshaped, and further modified to lower the thermal resistance as heat is transferred to the surrounding environment via convection and/or radiation. For example, features such as grooves, fins, and pins (FIGS. 20A and 20B) can be used to increase the exposed surface area and increase convective heat loss, and colored finishes can be used to maximize radiation. In some cases, the heat sink is made from a solid block, i.e., without heat fins (FIG. 20C).

Figure 21A:
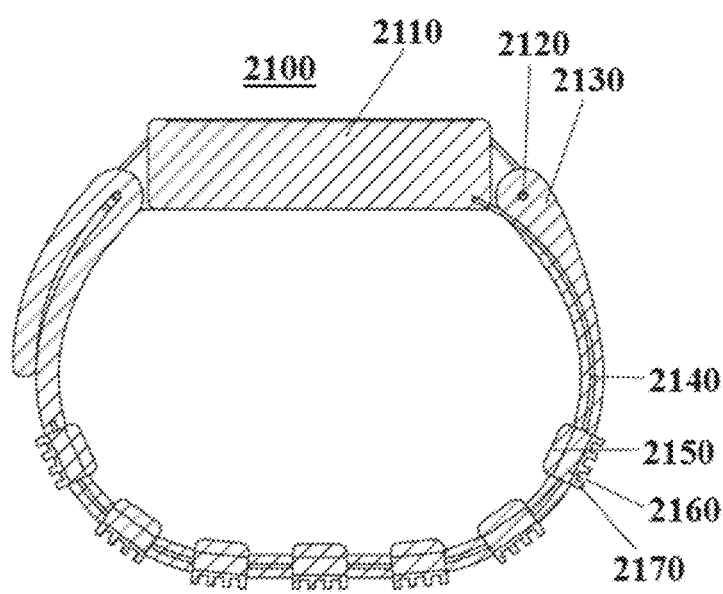
FIG. 21A is a cross-sectional side view of a wearable device, in accordance with an embodiment of the present disclosure.
Figure 21B:
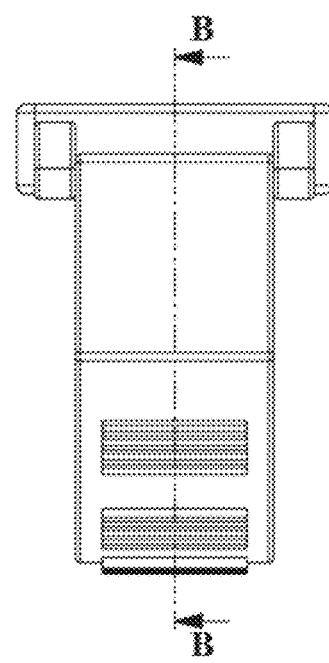
FIG. 21B is a front view of the wearable device shown in cross-section in FIG. 21A.

FIG. 21A is a cross-sectional side view at section B-B (FIG. 21B) and shows another example of a wearable device 2100. The wearable device 2100 includes a wearable module 2110, one or more hinge/spring bars 2120, a strap enclosure 2130, a flexible circuit 2140, one or more body heat conductor nodes 2150, one or more TEGs 2160, and one or more external heat sink nodes 2170.

The wearable module 2110 may take the form of a wristwatch, fitness tracker, or other device which may serve as a focal point for user interaction. The wearable module 2110 may house additional electronics, such as processing circuitry, one or more wireless modules, power management circuitry, one or more batteries, one or more displays, one or more vibration motor, and the like.

The hinge/spring bar 2120 may serve as the attachment point between the strap enclosure 2130 and the wearable module. In this example, on one side (right) the strap enclosure is pinned (i.e., free to rotate) around a spring bar. Further, in this example, the strap enclosure 2130 wraps around a second hinge/spring bar to allow a user to don/doff the wearable device 2100 with some degree of adjustability.

The strap enclosure 2130 may serve as the chassis for each conductor node 2150, TEG 2160, and external heat sink node 2170 thermal circuit assembly. The strap enclosure may also encase the flexible circuit 2140 or similar wiring which allows each TEG 2160 to be electrically connected to one another and the wearable module 2110. The strap enclosure 2130 may serve as the method of donning/doffing the wearable device 2100 and may include a clasp or other attachment method which allows for some degree of adjustability for users of different sizes (e.g., users with different wrist sizes). The strap enclosure 2130 may be made from a durable but flexible material, such as fabric, leather, TPU, TPE, silicone, or the like. In this example, a "Milanese" loop retention method is employed, where one end of the strap enclosure is looped around a fixed hinge point of the wearable module and doubled back on top of itself. The free end of the strap enclosure can then be held in place with magnets, Velcro, snaps, or the like (not shown).

The flexible circuit 2140 (which may take the form of a flexible printed circuit, a flexible-flat cable, or the like) may electrically connect components in the wearable module 2110 (which may be located, for example, on a dorsal side of a user's wrist) to those in the strap enclosure 2130 (which may be located, for example, on a palmar side of a user's wrist). TEGs, sensors, or circuit elements may be connected to the flexible circuit 2140 at a variety of positions, allowing components to be located adjacent to the user's body (e.g., around the circumference of the user's wrist). The flexible circuit 2140 may connect to the wearable module 2110 through a board-mounted connector, a soldered joint, flying leads, spring pins, contact pads, or the like (not shown).

Each body heat conductor node 2150 may comprise a highly conductive body which can be exposed to the user's body (e.g., wrist) on one side, and in direct contact with a TEG 2160 on the opposing side. A body heat conductor node 2150 may create a heat pathway which can conduct heat from the user's body to a "hot-side" of each TEG 2160. Wherever the body heat conductor node is not in contact with a TEG surface or air, the body heat conductor node may be insulated from an opposing external heat sink node 2170. Each body heat conductor node 2150 may be produced from a material with a high coefficient of thermal conductivity, such as an aluminum or copper alloy. The surface of each body heat conductor node 2150 intended to be in contact with the user's body (e.g., wrist) may be formed in a domed or contoured shape so as to optimize the thermal contact area and comfort between the exposed surface and the user's skin. In the illustrated example, there are seven body heat conductor nodes 1250 which may contact the user's body (e.g., wrist) at a variety of positions, but other numbers of body heat conductor nodes may be used.

As described herein, the one or more TEGs 2160 are solid state devices which convert a temperature gradient between two opposing surfaces into electrical energy. The two opposing surfaces may be referred to as the "cold-side" and "hot-side". The one or more TEGs 2160 may be sandwiched between one or more body heat conductor nodes 2150 on the "hot-side" and one or more external heat sink nodes 2170 on the "cold-side". In this illustrated example, there are seven TEGs 2160 sandwiched between body heat conductor nodes 2150 and external heat sink nodes 2170 and located at a variety of positions along the strap enclosure 2130 (i.e., located at a variety of positions around a perimeter of the user's wrist). An advantage of placing the TEG circuits around the perimeter of the user's body (e.g., wrist) is that one or more TEGs 2160 can be placed at, for example, the underside of the wrist, where there is a potential for an elevated skin temperature and thus an increased temperature gradient across each TEG (i.e., an increased temperature gradient between the user's skin, a body heat conductor mode, a TEG, an external heat sink node, and ambient air).

Each external heat sink node 2170 may comprise a highly conductive body which can be exposed to ambient air. Further, each external heat sink node 2170 may comprise a thermal contact plane with a smooth and flat bottom surface that can be pressed against the "cold-side" of each TEG 2160 (with or without thermal paste or other conductive material in-between). This thermal contact plane may create a thermal pathway between the TEG "cold-side" and the ambient air. In this configuration, each external heat sink node 2170 may serve to minimize the temperature gradient between the ambient air and the TEG "cold-side". The surface area of each external heat sink node 2170 exposed to ambient air may be re-sized, reshaped, and/or further modified to lower the thermal resistance as heat is transferred to the surrounding environment via convection and/or radiation. For example, features such as grooves, fins, and pins may be used to increase the exposed surface area of each external heat sink node 2170 to increase convective heat loss. Further, a variety of finishes may be used to maximize heat transfer from each external heat sink node 2170 to the surrounding environment via radiation.

Figure 22:
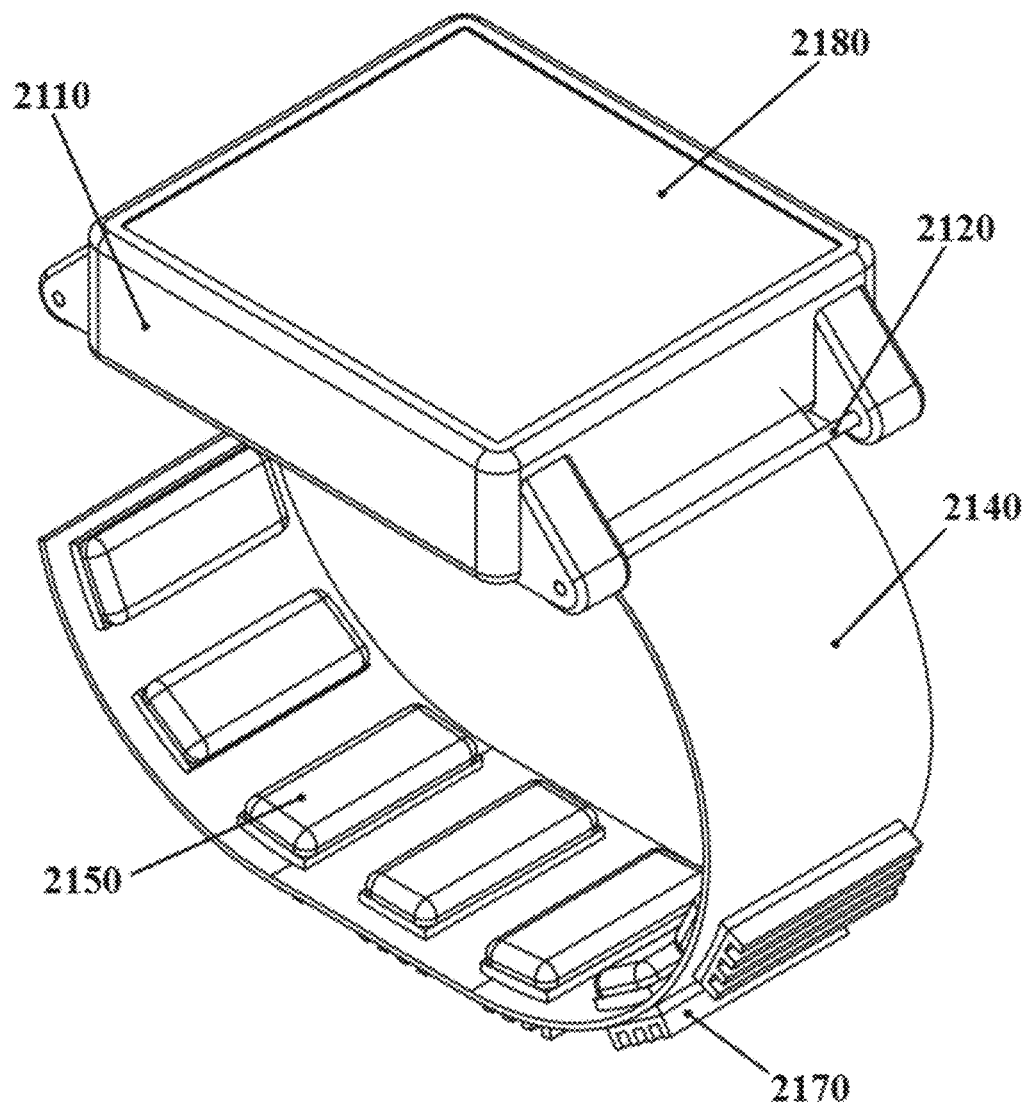
FIG. 22 is a perspective view of the wearable device of FIG. 21A.

FIG. 22 shows a perspective view of the wearable device 2100 of FIG. 21A without the strap enclosure 2130. As shown, wearable module 2210 may comprise a display

2180. The display 2180 may be formed of a material which magnifies an image, such as a lens. The display may be a transparent glass or plastic component which may be adhered to a recessed groove in the top of the wearable module 2210. The display may cover the wearable module 2210 and hold internal components inside of the wearable module. Using paint, a decal, silk screen, pad printing or similar, a mask may be created to selectively expose or hide certain internal components. The display 2180 may be an electronic display. The display 2180 may be a low-power screen which displays a graphical user interface. The display 2180 may be a capacitive touchscreen or a resistive touchscreen. As an alternative, the display 2180 may be a passive display.

FIG. 23A is a perspective view of the wearable device of FIG. 21A. FIG. 23B is a detail view corresponding to detail C of FIG. 23A. An example arrangement of a body heat conductor node 2150, a TEG 2160, and an external heat sink node 2170 are provided in FIG. 23B. As shown and as described herein, body heat conductor node 2150 is located so as to be in contact with a user's skin when wearable device 2100 is donned by a user. For user comfort, body heat conductor node 2150 may comprise rounded chamfered edges (as shown), chamfered edges, beveled edges, or any edge configuration that may promote user comfort.

Figure 24:
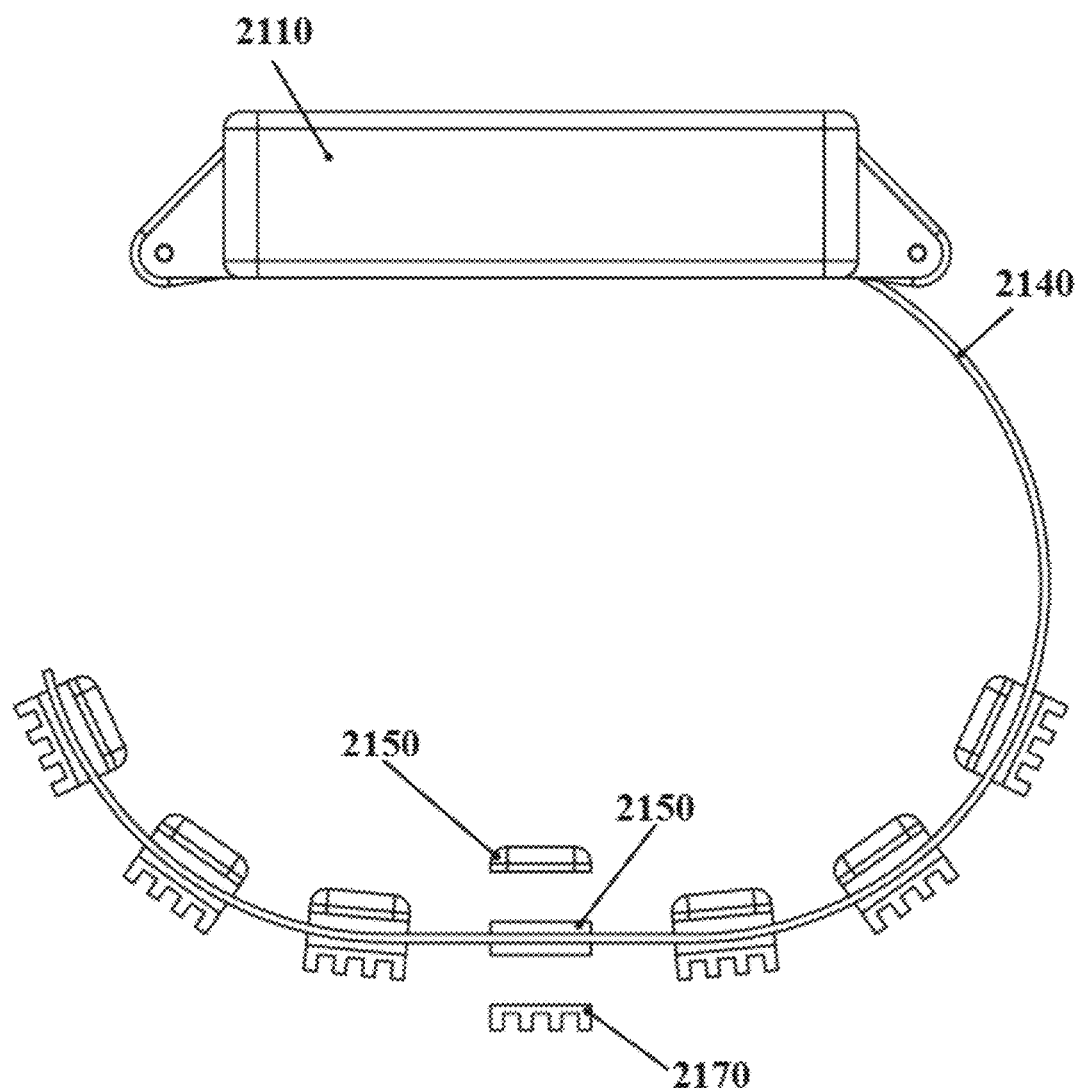
FIG. 24 is an expanded side view of the wearable device of FIG. 21A.

FIG. 24 is an expanded side view of the wearable device of FIG. 21A, showing an example arrangement of a body heat conductor node 2150, a TEG 2160, and an external heat sink node 2170 along flexible circuit 2140.

Figure 25A:
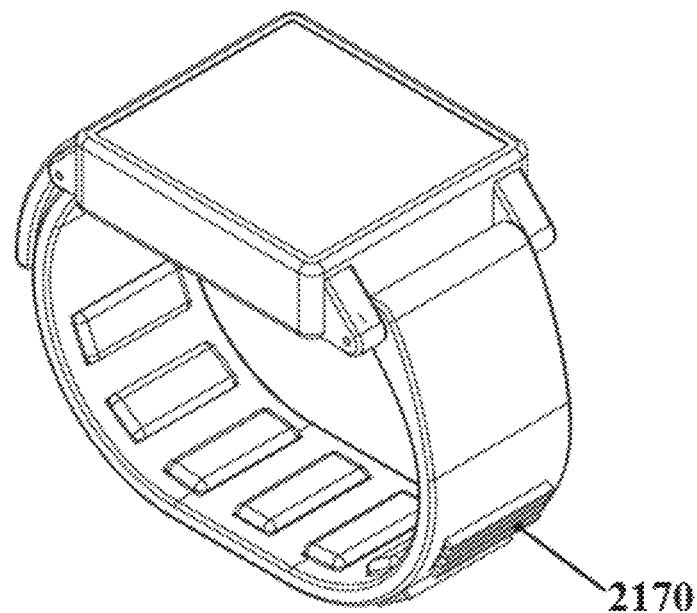
FIG. 25A is a perspective view of the wearable device of FIG. 21A.
Figure 25B:
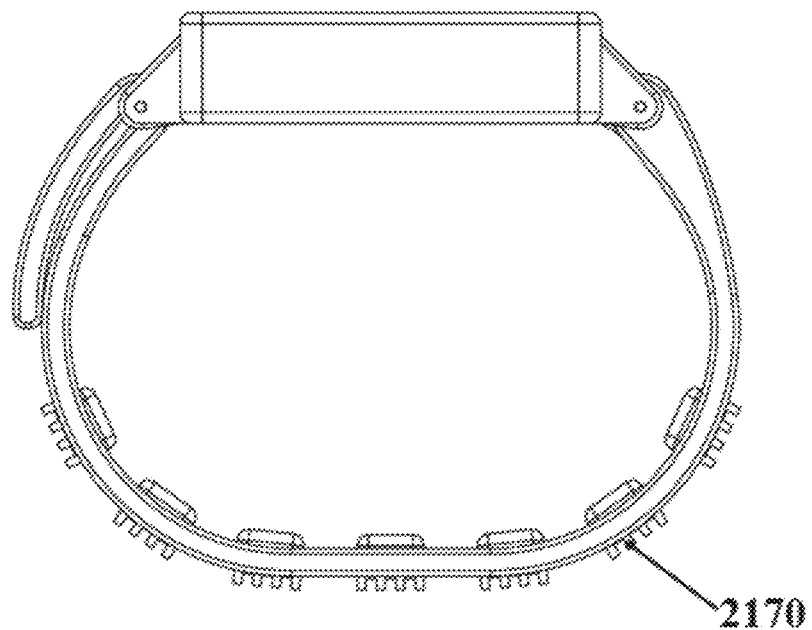
FIG. 25B is a side view of the wearable device of FIG. 21A.

FIG. 25A is a perspective view of the wearable device of FIG. 21A. FIG. 25B is a side view of the wearable device of FIG. 21A. As described herein, body heat conductor nodes 2170 may comprise features such as grooves, fins (shown), and pins to increase the exposed surface area and increase convective heat loss.

Figure 26A:
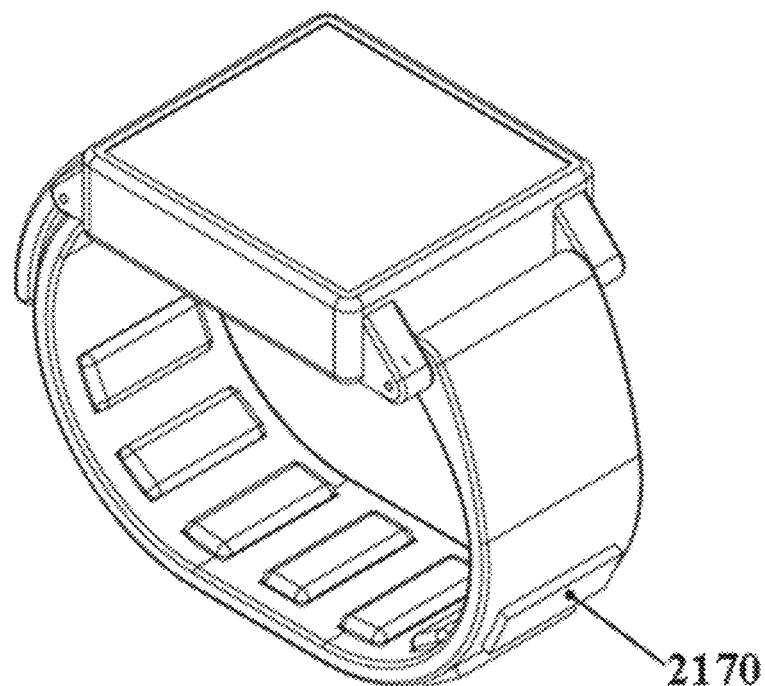
FIG. 26A is a perspective view of an alternative embodiment of the wearable device of FIG. 21A.
Figure 26B:
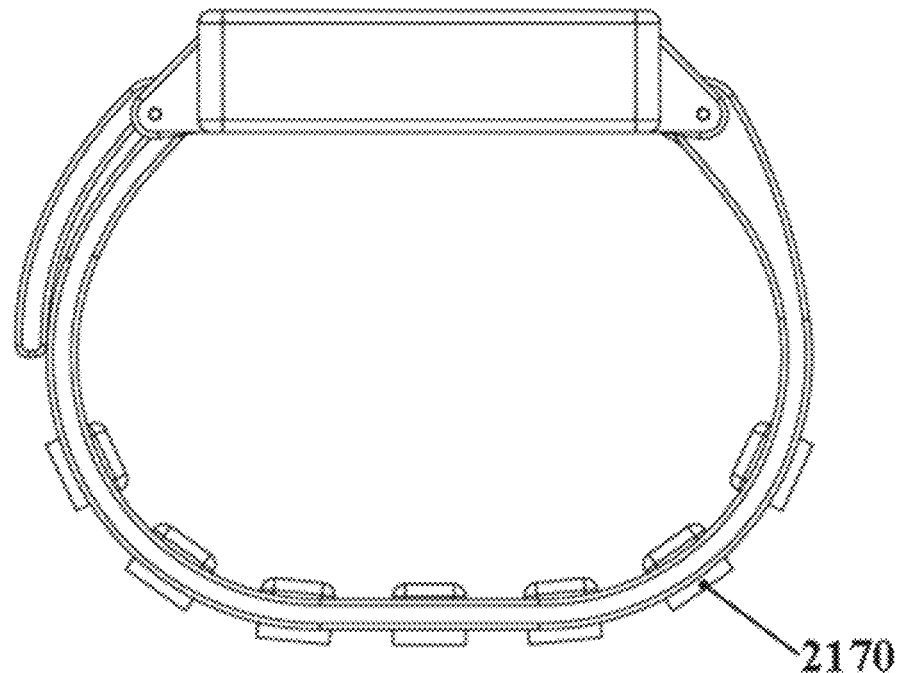
FIG. 26B is a side view of an alternative embodiment of the wearable device of FIG. 21A.

FIG. 26A is a perspective view of an alternative embodiment of the wearable device of FIG. 21A. FIG. 26B is a side view of an alternative embodiment of the wearable device of FIG. 21A. As shown in this alternative embodiment, body heat conductor nodes 2170 may be made from a solid block of conductive material (i.e., without fins).

Methods of Using and Manufacturing Wearable Devices with Thermoelectric Modules

Another aspect of the present disclosure provides a method for using a wearable electronic device (e.g., watch) with at least one thermoelectric module or unit. The wearable electronic device may include an electronic display with a user interface and a power management unit. The power management unit may be coupled or integrated with the electronic display. The power management unit may include an energy storage device and a thermoelectric device in electrical communication. The thermoelectric device may include a heat collecting unit, one or more thermoelectric elements, and a heat expelling unit. The heat collecting unit may be in thermal communication with the thermoelectric element. The thermoelectric element may be in thermal communication with the heat expelling unit. Using the wearable electronic device may include activating the wearable electronic device. Using the wearable electronic device may include using the thermoelectric device to generate power. The power may be generated by the flow of heat from the heat collection unit, across the thermoelectric element, and to the heat expelling unit. The generated power may be used to power the electronic display. A portion of the generated power may be stored in the energy storage device.

Activating the wearable device may include positioning the heat collecting unit of the wearable device adjacent to a heat source. The heat source may be a body surface of the user. Positioning the heat collecting unit of the wearable device adjacent to a heat source may initiate the generation of power. Activating the wearable electronic device may include depressing a button to physically activating the wearable device. The button may be a single button or multiple buttons. The buttons may comprise a button spring that physically actuates the button. Depressing the button may transfer an input from the user to a PCB board of the wearable electronic device to activate the wearable electronic device. Activation of the wearable electronic device may include activation of the user interface. The user interface may include a touchscreen. The touchscreen may be a capacitive touch screen. The touch screen may be a resistive touch screen. Applying pressure or contact to the user interface may transfer input from the user to a PCB board of the wearable electronic device to activate the wearable electronic device.

The wearable electronic device may include a smart watch, a fitness tracker, a portable electronic device, or any combination thereof. In one example, the wearable electronic device is a watch. The watch may be substantially waterproof or water resistant. In some cases, the water may be water resistant but not waterproof. The watch may include a user interface. The user interface may enable the user to access different functionalities of the watch. The user interface may be actuated by buttons. The user interface may be actuated through use of a touchscreen. The user interface may be actuated by both buttons and the use of a touch screen. The touchscreen may be a capacitive touch screen. The touch screen may be a resistive touch screen.

The watch may include one or more power generation units in electrical communication with the power management unit in addition to the thermoelectric device. The power generation unit may include a solar cell, inductive coupling unit, RF coupling unit, and a kinetic power generation unit. The watch may include one or more solar cells. The solar cells may be integrated in the body of the watch or the band of the watch. The solar cells may generate power during exposure to light. The watch may have at least about 1, 2, 3, 4, 5, 6, 8, 10, 15, 20, or more solar cells integrated into the body and/or band of the watch. The inductive coupling unit may be integrated into the power management unit of the watch. The inductive coupling unit may generate power inductively. The RF coupling unit may be integrated into the power management unit of the watch. The RF coupling unit may generate power from RF waves. The kinetic power generation unit may be integrated into the power management unit of the watch. The kinetic power generation unit may generate power by motion of the user's body.

Figure 27A:
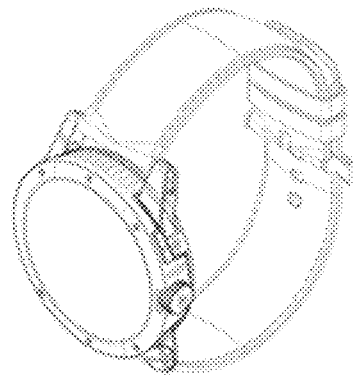
FIG. 27A is a perspective view of an alternative embodiment of the wearable device of FIG. 1.
Figure 27C:
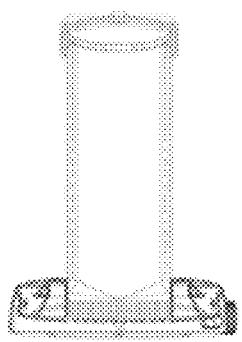
FIG. 27C is a top view of an alternative embodiment of the wearable device of FIG. 1.
Figure 27B:
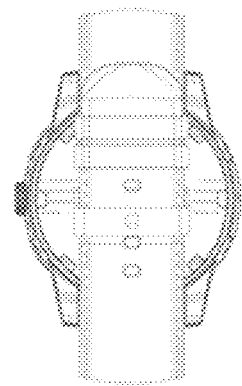
FIG. 27B is a back view of an alternative embodiment of the wearable device of FIG. 1.
Figure 27D:
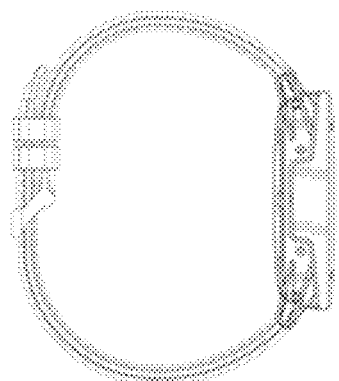
FIG. 27D is a left side view of an alternative embodiment of the wearable device of FIG. 1.
Figure 27E:
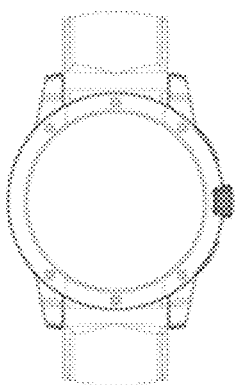
FIG. 27E is a front view of an alternative embodiment of the wearable device of FIG. 1.
Figure 27F:
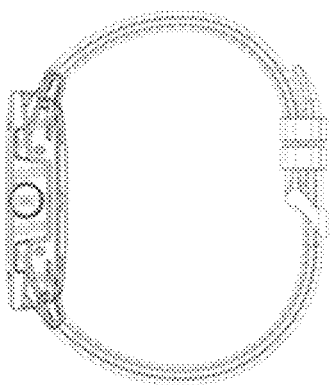
FIG. 27F is a right side view of an alternative embodiment of the wearable device of FIG. 1.
Figure 27G:
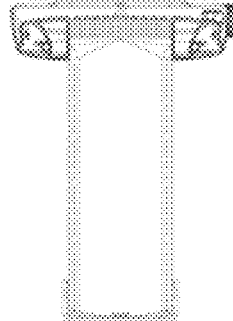
FIG. 27G is a bottom view of an alternative embodiment of the wearable device of FIG. 1.

FIGS. 27A-27G are illustrations of a wearable electronic device that is a watch. FIG. 27A is a perspective view of an example watch and band. FIG. 27B is a back view an example watch and band. FIG. 27C is a top view of an example watch and band. FIG. 27D is a left side view of an example watch and band. FIG. 27E is a front view of an example watch and band. FIG. 27F is a right side view of an example watch and band. FIG. 27G is a bottom view of an example watch and band. The heat collecting unit of the watch may include the watch back. The watch back may be held against the skin of a user by the watch band. The watch back may collect the heat of the user and direct the heat into the thermoelectric unit. The casing of the watch may include a case top heat sink. The case top heat sink may be a part of the heat expelling unit. The case top heat sink may draw heat from the thermoelectric element and expel the heat from the wearable device. In one example, the case top heat sink may comprise vents at the top and bottom surface of the wearable device. In some cases, the wearable device may include at least 1, 2, 3, 4, 5, 6, 7, 8, 9, 10, 15, or 20 vents. The one or more vents may have various shapes and/or sizes. The one or more vents may each be circular, triangular, square, rectangular, or partial shapes or combinations thereof. The one or more vents may be situated at various locations of a body of the wearable device, such as top, bottom, left side, right side, back side or front side. The one or more vents may permit the flow of thermal energy to or from an interior portion of the wearable device, which may permit heat transfer.

Figure 28A:
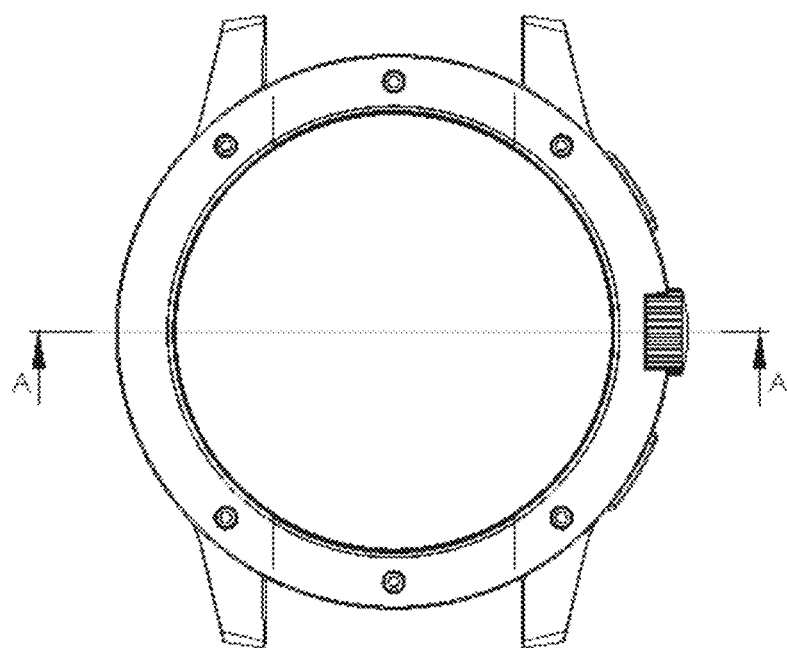
FIG. 28A is a top view of an exemplary top loading wearable device.
Figure 28B:
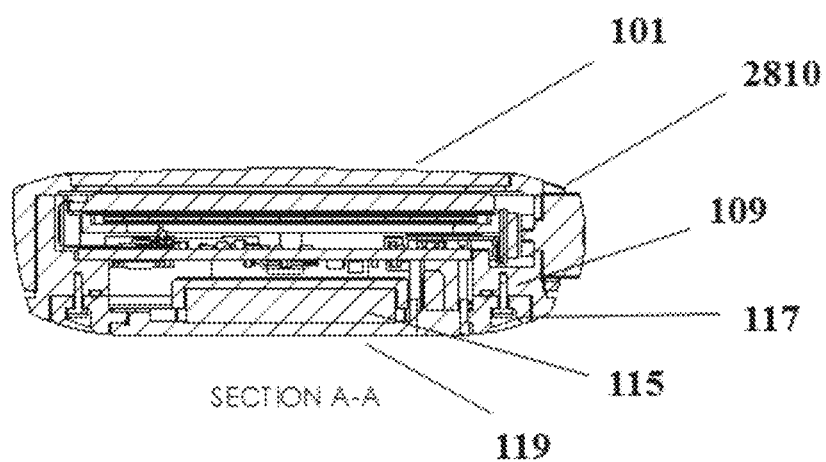
FIG. 28B is a cross-sectional view of the components of an exemplary top loading wearable device.
Figure 28C:
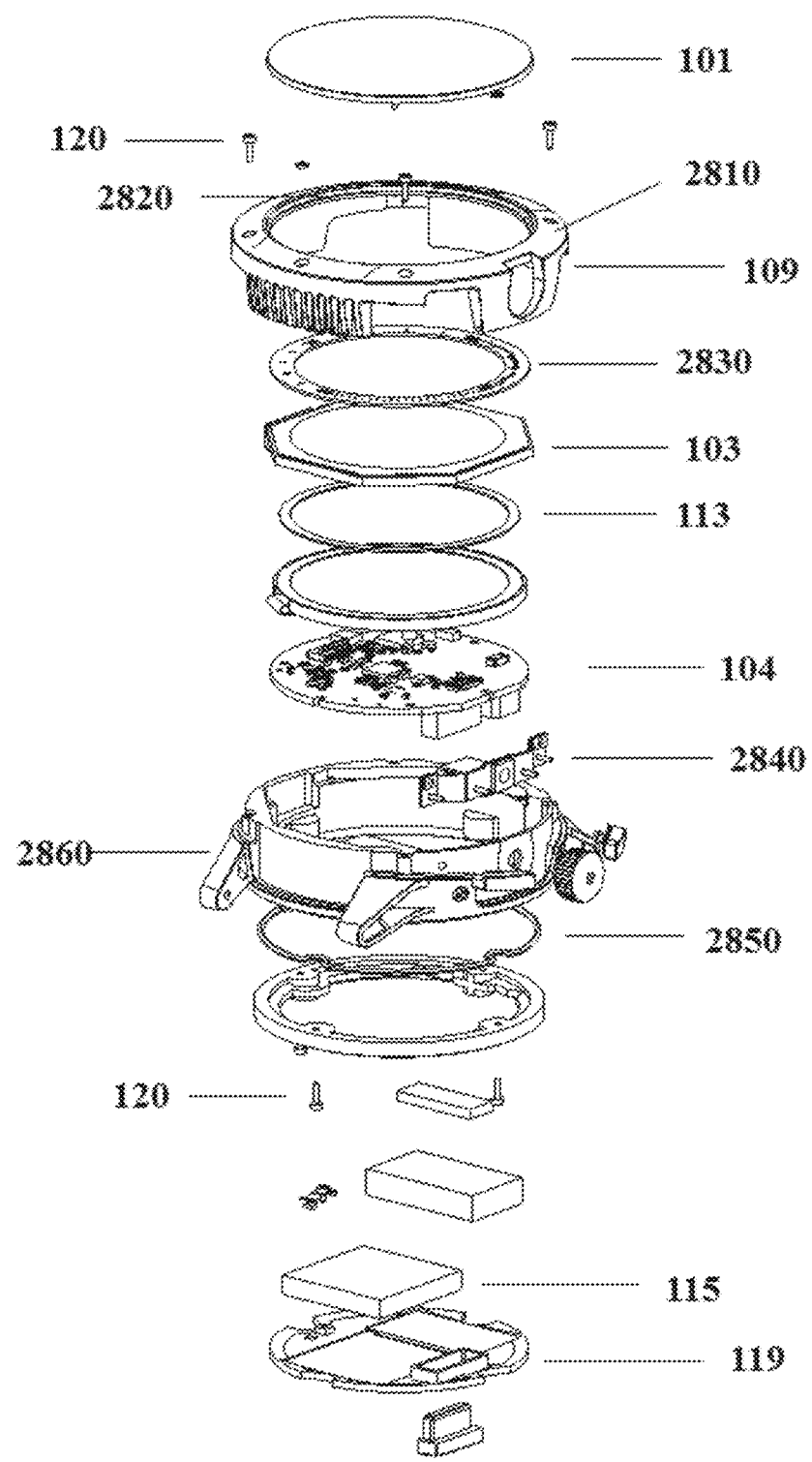
FIG. 28C is an exploded view of an exemplary top loading wearable device.

FIGS. 28A-28C show an alternative embodiment of a wearable electronic device that is a watch. FIG. 28A is a view of the face of the watch. The face of the watch may include a cosmetic dial, fastening screws, lugs, and buttons and knobs. FIG. 28B shows a cross-sectional view the center of the watch. The center of the watch is defined by the line A-A in FIG. 28A. The watch may include a top glass 101, a sealing bezel 2810, a case top conductor 109, an insulator ring 117, a TEG 115, and a case back conductor 119. FIG. 28C is an exploded view of the components of the watch. The watch may include a top glass 101, fastening screws 120, glass sealing gasket 2820, sealing bezel 2810, case top heat conductor 109, cosmetic dial 2830, electronic display 103, insulator spacer 113, PCB 104, button FPC assembly 2840, insulating ring with lugs 2860, O-ring 2850, TEG 115, and case back conductor 119. The case top may be a one piece case top. The one piece case top may include the case top conductor. The lugs may be attached to the insulator ring. The lugs may not dissipate heat from the heat expelling unit.

Another aspect of the present disclosure provides a method for manufacturing a wearable electronic device (e.g., watch) with at least one thermoelectric module or unit. The method may include assembling an electronic display with a user interface and a power management unit to yield a wearable electronic device. The power management unit may be operatively coupled with the electronic display. The power management unit may include an energy storage device and a thermoelectric device in electrical communication with the energy storage device. The thermoelectric device may include a heat collecting unit, a thermoelectric element, and a heat expelling unit. The heat collecting unit may be in thermal communication with the thermoelectric element. The thermoelectric element may be in thermal communication with the heat expelling unit. During use of the wearable electronic device the thermoelectric unit may generate power upon flow of thermal energy from the heat collecting unit, across the thermoelectric element, and to the heat expelling unit. The generated power may be used to power the electronic display and user interface. A portion of the power may be stored in the energy storage device.

The wearable electronic device may be a watch. The watch may include a case that contains the electronic display and power management unit. The case may be assembled from multiple components. The electronic display may be positioned adjacent to the top of the watch case. The top of the watch case may include a transparent material and the electronic display may be visible through the top of the watch case. The components of the watch may be assembled into the watch case from the top side, the bottom side, or both sides.

Figure 29A:
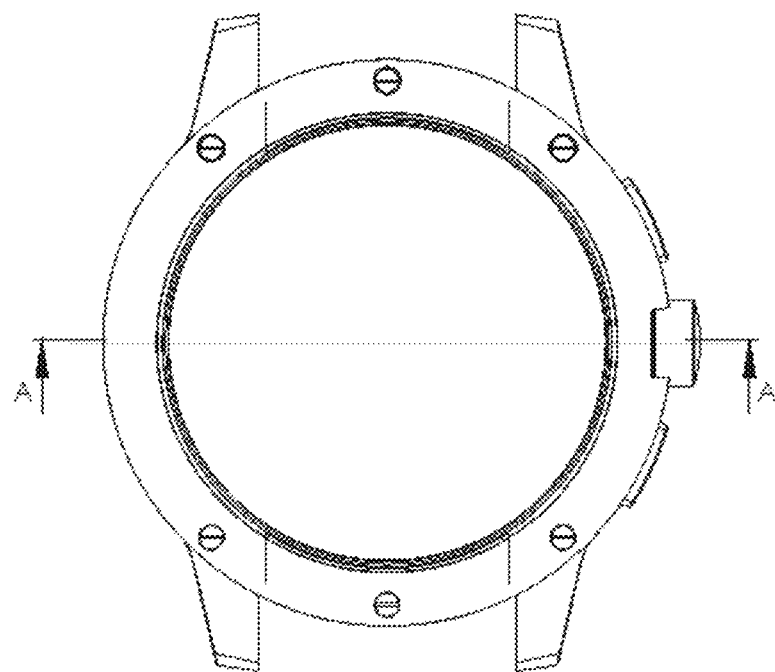
FIG. 29A is a top view of an alternative embodiment of a top loading wearable device.
Figure 29B:
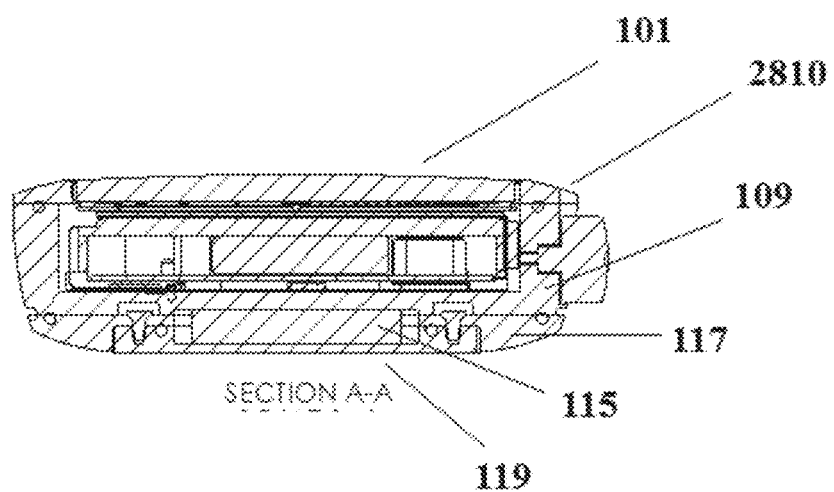
FIG. 29B is a cross-sectional view of the components of an alternative embodiment of a top loading wearable device.
Figure 29C:
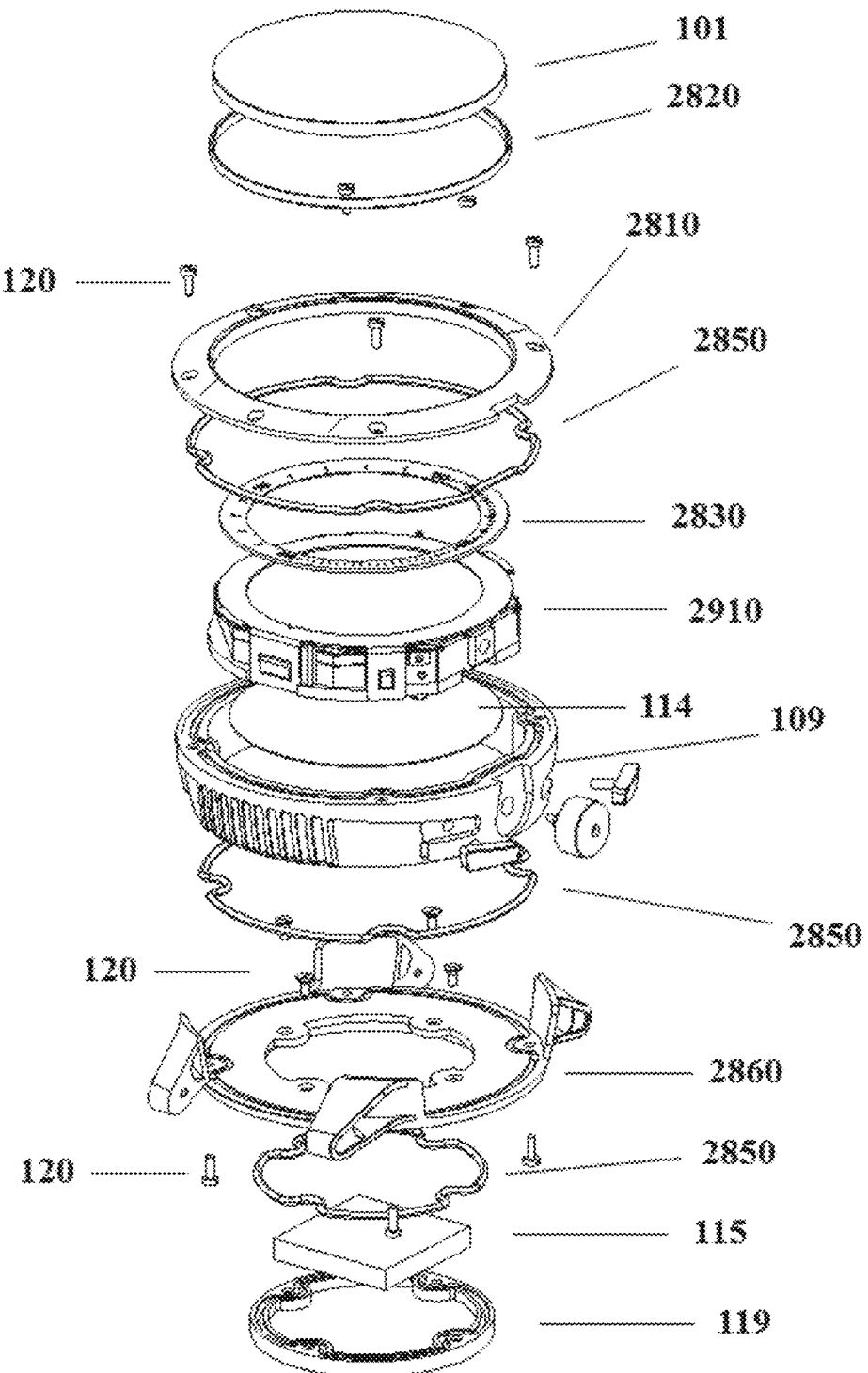
FIG. 29C is an exploded view of an alternative embodiment of a top loading wearable device.

FIGS. 29A-29C show an example watch that is assembled from the top side of the case. FIG. 29A is a view of the face of the watch. The face of the watch may include a cosmetic dial, fastening screws, lugs, and buttons and knobs. FIG. 29B shows a cross-sectional view of the center of the watch. The center of the watch is defined by the line A-A in FIG. 29A. The top surface of the watch may include a top glass 101 and a sealing bezel 2810. The center portion of the watch may include a case top heat conductor 109. The bottom portion of the watch, which may be the portion in contact with a body surface of the user, may include an insulator ring 117, one or more TEGs 115, and a case back conductor 119. FIG. 29C is an exploded view of the components of an example watch assembled from the top side of the case. The components may include top glass 101, glass sealing gasket 2820, fastening screws 120, sealing bezel 2810, O-rings 2850, cosmetic dial 2830, electronics and display subassembly 2910, flexible printed circuit 114, case top conductor 109, O-ring 2850, Insulator ring with lugs 2860, TEG 115, and case back conductor 119. The case back conductor 119 may collect heat from a body surface of a user. The heat may be directed across the TEG 115 to the heat expelling unit. The heat expelling unit may be the case top conductor 109. The case top conductor 109 may include conductive fins to increase heat dissipation. Alternatively, or in addition to, the case top conductor 109 may include vents to increase heat dissipation. The lugs may be positioned on the insulator ring 2860. The lugs may not aid in the dissipation of heat. The case may be sealed at the top side and the bottom side. The case may be sealed at the top side by a sealing gasket 2820 and sealing bezel 2810. The sealed case may allow for the watch to be resistant to damage from water and other liquids. The sealed case may be substantially waterproof or water resistant. In some cases, the sealed case may be water resistant but not waterproof.

Figure 30A:
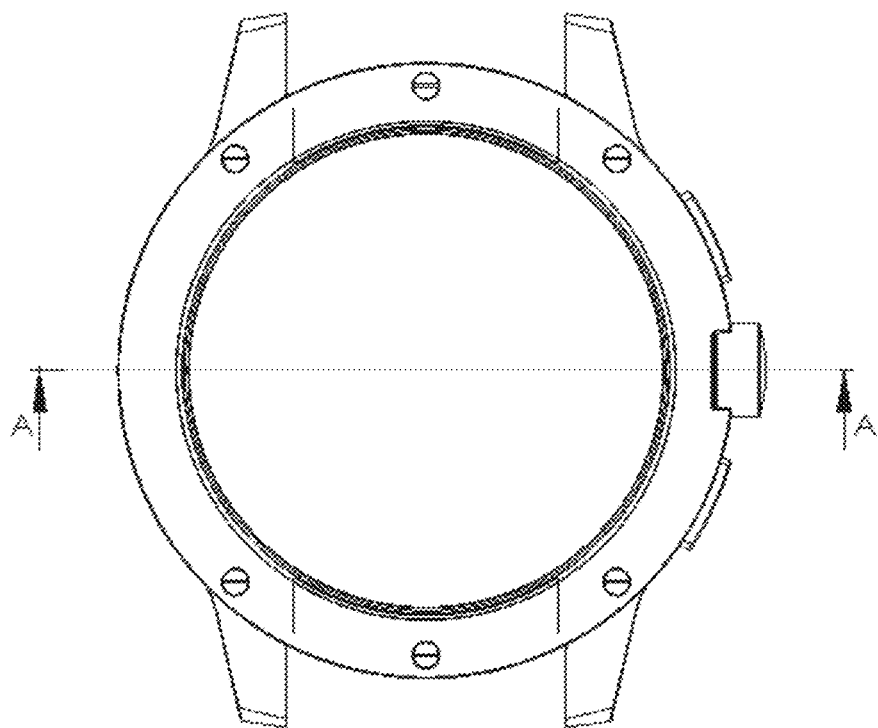
FIG. 30A is a top view of an alternative embodiment of a top loading wearable device.
Figure 30B:
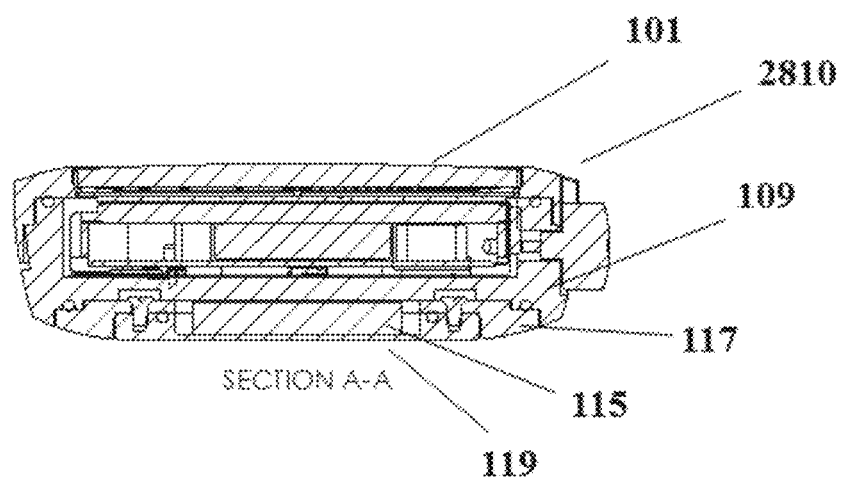
FIG. 30B is a cross-sectional view of the components of an alternative embodiment of a top loading wearable device.
Figure 30C:
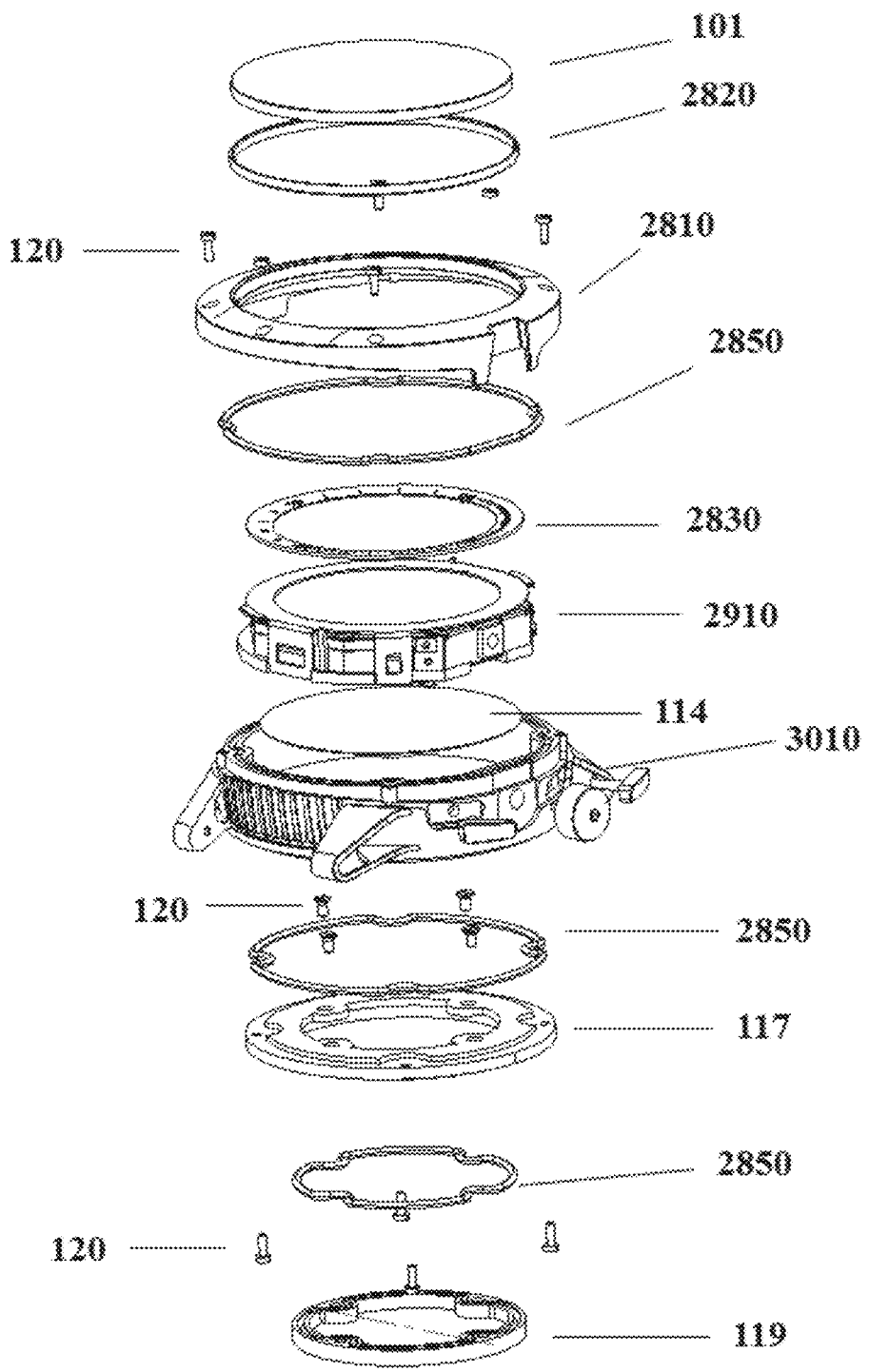
FIG. 30C is an exploded view of an alternative embodiment of a top loading wearable device.

FIGS. 30A-30C show an alternative example watch that is assembled from the top side of the case. FIG. 30A is a view of the face of the watch. The face of the watch may include a cosmetic dial, fastening screws, lugs, and buttons and knobs. FIG. 30B shows a cross-sectional view of the center of the watch. The center of the watch is defined by the line A-A in FIG. 30A. The top surface of the watch may include a top glass 101 and a sealing bezel 2810. The center portion of the watch may include a case top heat conductor 109. The bottom portion of the watch, which may be the portion in contact with a body surface of the user, may include an insulator ring 117, one or more TEGs 115, and a case back conductor 119. FIG. 30C is an exploded view of the components of an alternative example watch assembled from the top side of the case. The components may include top glass 101, glass sealing gasket 2820, fastening screws 120, sealing bezel 2810, O-rings 2850, cosmetic dial 2830, electronics and display subassembly 2910, flexible printed circuit 114, case top conductor with lugs 3010, insulator ring 117, and case back conductor 119. The case back conductor 119 may collect heat from a body surface of a user. The heat may be directed across the TEG 115 to the heat expelling unit. The heat expelling unit may be the case top conductor 3010. The case top conductor 3010 may include conductive fins and lugs to increase heat dissipation. Alternatively, or in addition to, the case top conductor 3010 may include vents to increase heat dissipation. The lugs may aid in the dissipation of heat. The case may be sealed at the top side and the bottom side. The case may be sealed at the top side by a sealing gasket 2820 and sealing bezel 2810. The sealed case may allow for the watch to be resistant to damage from water and other liquids. The sealed case may be substantially waterproof or water resistant.

Figure 31A:
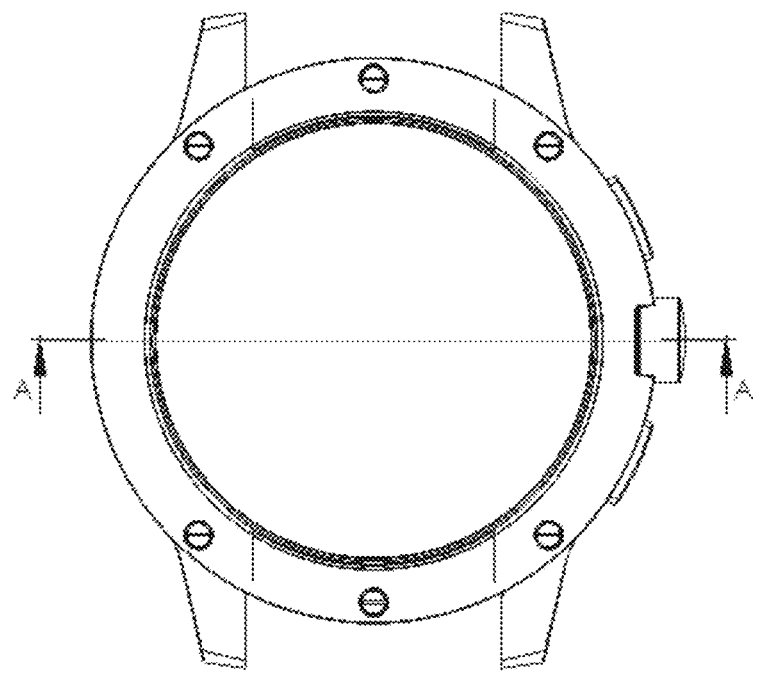
FIG. 31A is a top view of an exemplary bottom loading wearable device.
Figure 31B:
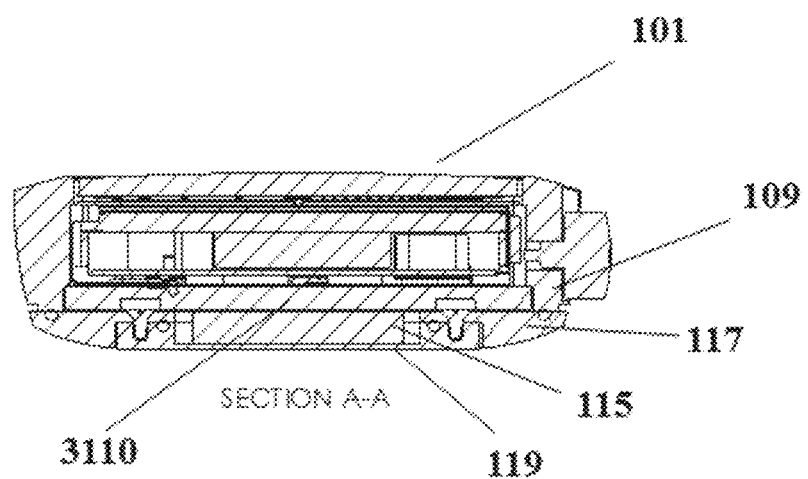
FIG. 31B is a cross-sectional view of the components of an exemplary bottom loading wearable device.
Figure 31C:
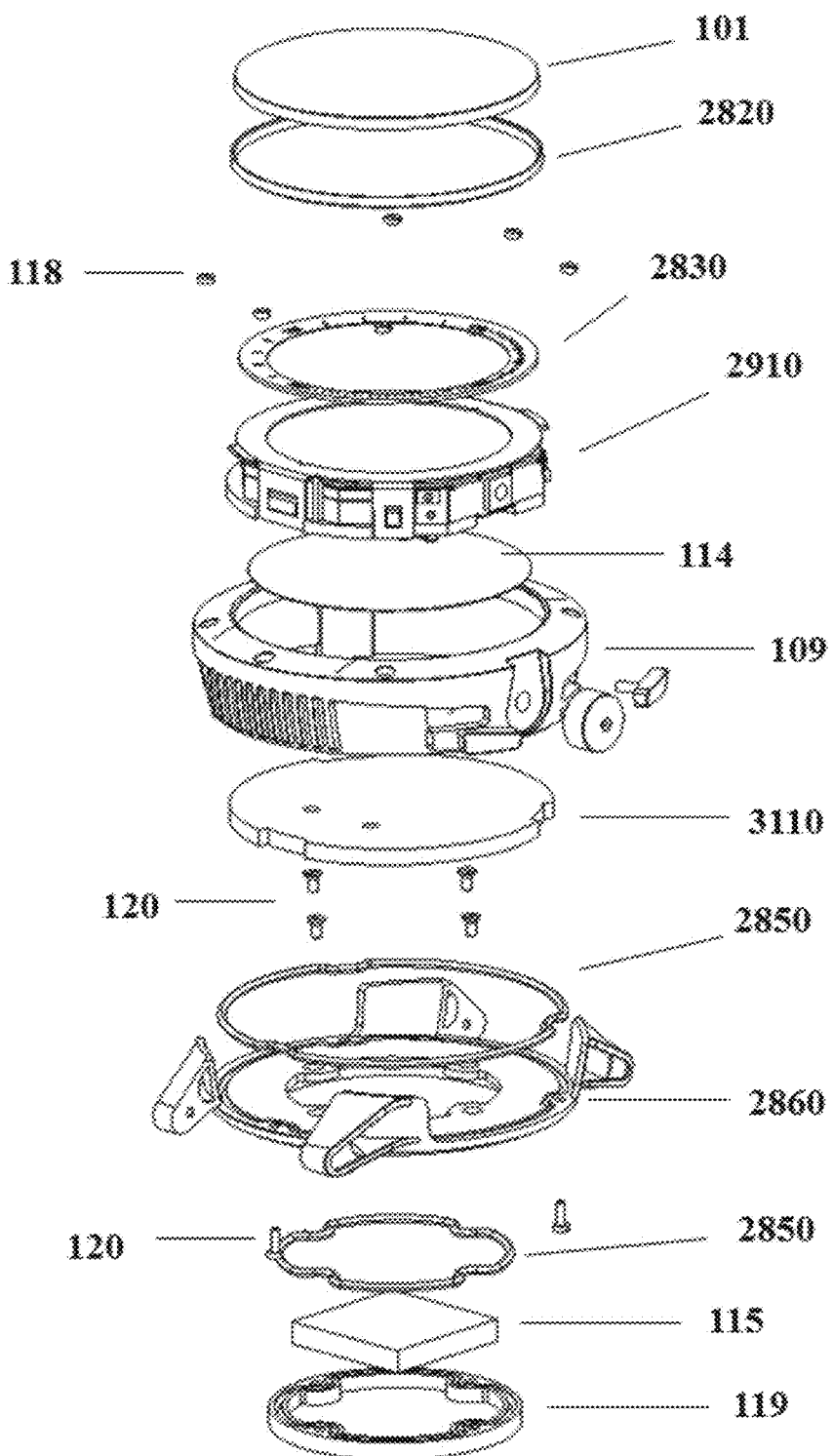
FIG. 31C is an exploded view of an exemplary bottom loading wearable device.

FIGS. 31A-31C show an example watch that is assembled from the bottom side of the case. FIG. 31A is a view of the face of the watch. The face of the watch may include a cosmetic dial, cosmetic screws, lugs, and buttons and knobs. FIG. 31B shows a cross-sectional view of the center of the watch. The center of the watch is defined by the line A-A in FIG. 31A. The top surface of the watch may include a top glass 101 and the center portion of the watch may include a case top heat conductor 109. The bottom portion of the watch, which may be the portion in contact with a body surface of the user, may include heat spreader plate 3110, one or more TEGs 115, and a case back conductor 119. FIG. 31C is an exploded view of the components of an example watch assembled from the bottom side of the case. The components may include top glass 101, glass sealing gasket 2820, cosmetic screws 118, electronics and display subassembly 2910, flexible printed circuit 114, case top conductor 109, heat spreader plate 3110, fastener screws 120, O-rings 2850, insulator ring with lugs 2860, TEG 115, and case back conductor 119. The case back conductor 119 may collect heat from a body surface of a user. The heat may be directed across the TEG 115 to the heat expelling unit. The heat expelling unit may be the case top conductor 109. The case top conductor 109 may include conductive fins to increase heat dissipation. Alternatively, or in addition to, the case top conductor 109 may include vents to increase heat dissipation. The lugs may be positioned on the insulator ring 2860. The lugs may not aid in the dissipation of heat. The case may be sealed at the top side and the bottom side. The case may be sealed at the bottom side with an O-ring 2850 and fastener screws 120. A watch assembled from the bottom side may enable the watch to be more resistant to damage from water and liquids than a watch assembled from the top side. The sealed case may be substantially waterproof or water resistant.

Figure 32A:
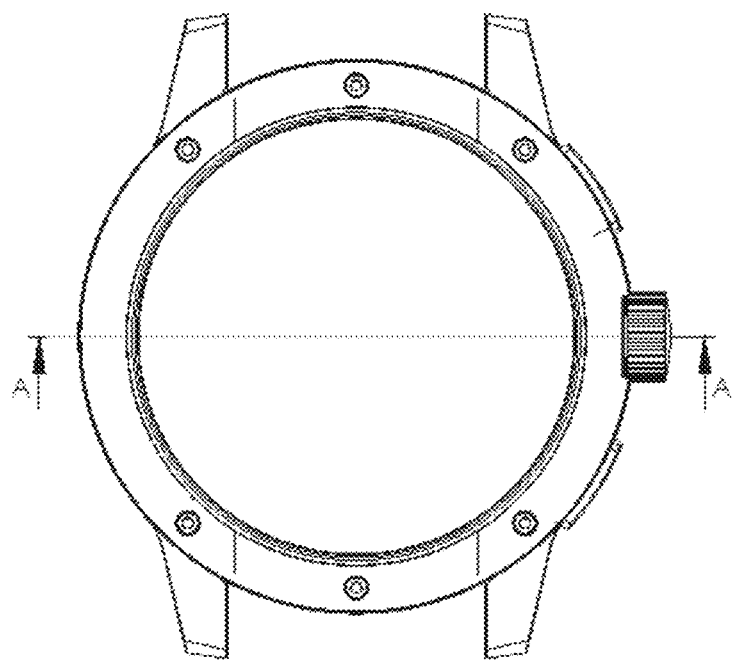
FIG. 32A is a top view of an alternative embodiment of a bottom loading wearable device.
Figure 32B:
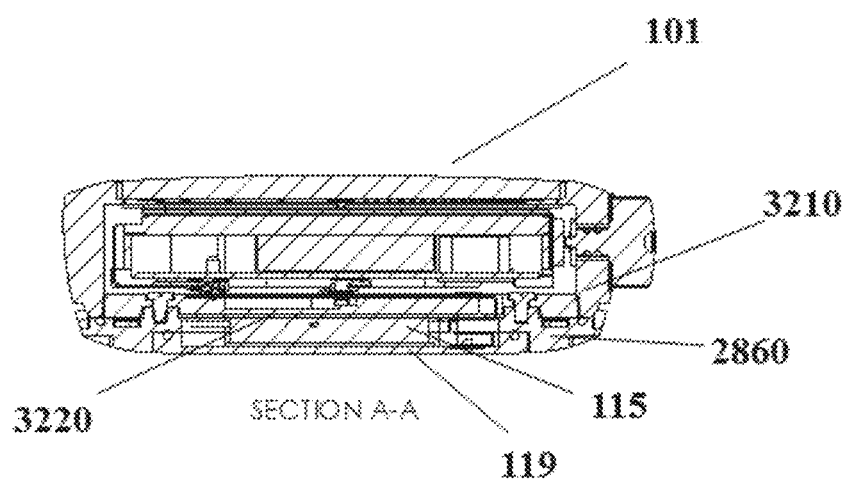
FIG. 32B is a cross-sectional view of the components of an alternative embodiment of a bottom loading wearable device.
Figure 32C:
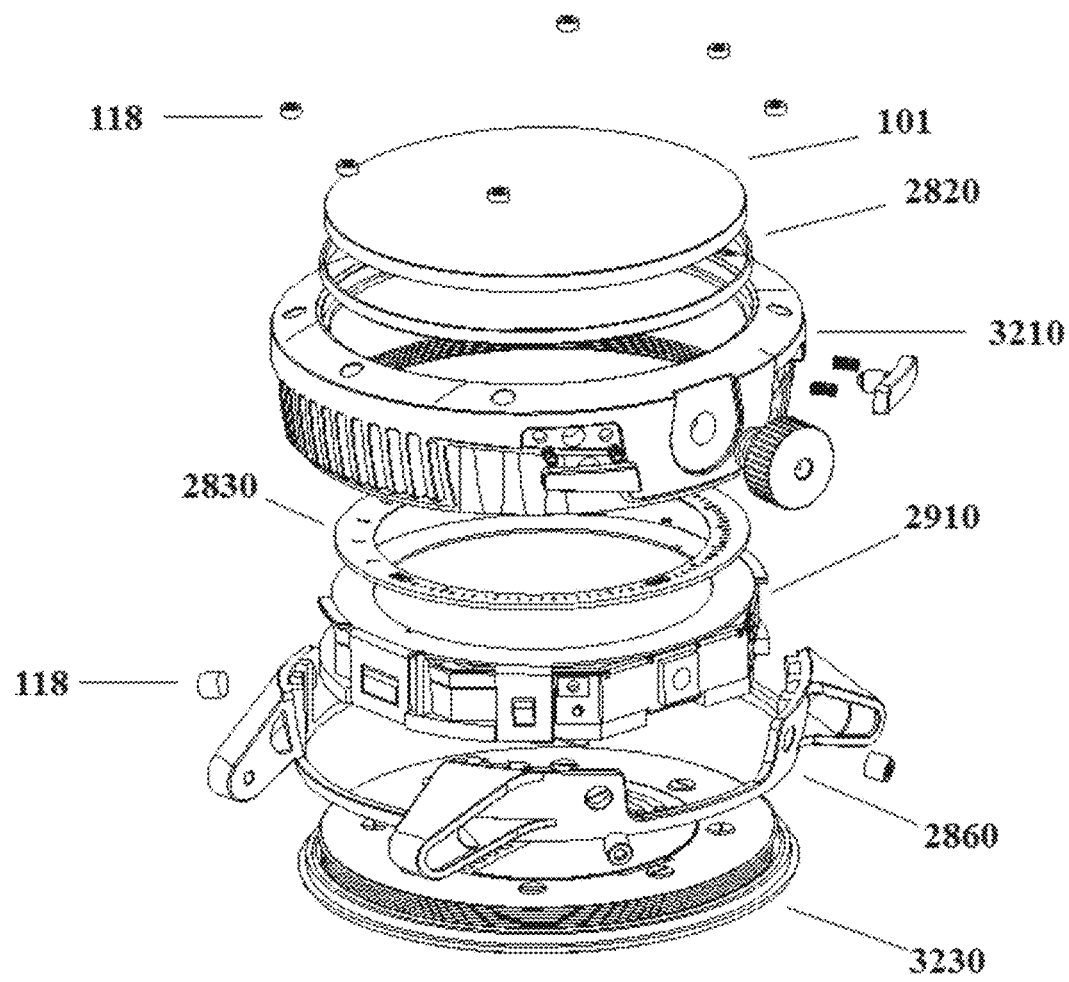
FIG. 32C is an exploded view of the of an alternative embodiment of a bottom loading wearable device.

FIGS. 32A-32E show an alternative example watch that is assembled from the bottom side of the case and includes a separate threaded in bottom subassembly. FIG. 32A is a view of the face of the watch. The face of the watch may include a cosmetic dial, cosmetic screws, lugs, and buttons and knobs. FIG. 32B shows a cross-sectional view of the center of the watch. The center of the watch is defined by the line A-A in FIG. 32A. The top surface of the watch may include a top glass 101 and the center portion of the watch may include a threaded case top conductor 3210. The bottom portion of the watch, which may be the portion in contact with a body surface of the user, may include a threaded heat spreader plate 3220, an insulator ring with lugs 2860, one or more TEGs 115, and a case back conductor 119. FIG. 32C is an exploded view of the components of an alternative example watch assembled from the bottom side of the case. The components may include top glass 101, glass sealing gasket 2820, cosmetic screws 118, threaded case top conductor 3210, cosmetic dial 2830, electronics and display subassembly 2910, insulator ring with lugs 2860, and threaded case bottom subassembly 3230. The threaded case bottom subassembly 3230 may comprise the heat collecting unit and the thermoelectric element. The insulating ring 2860 may comprise the lugs. The lugs may not aid to dissipate heat.

Figure 32D:
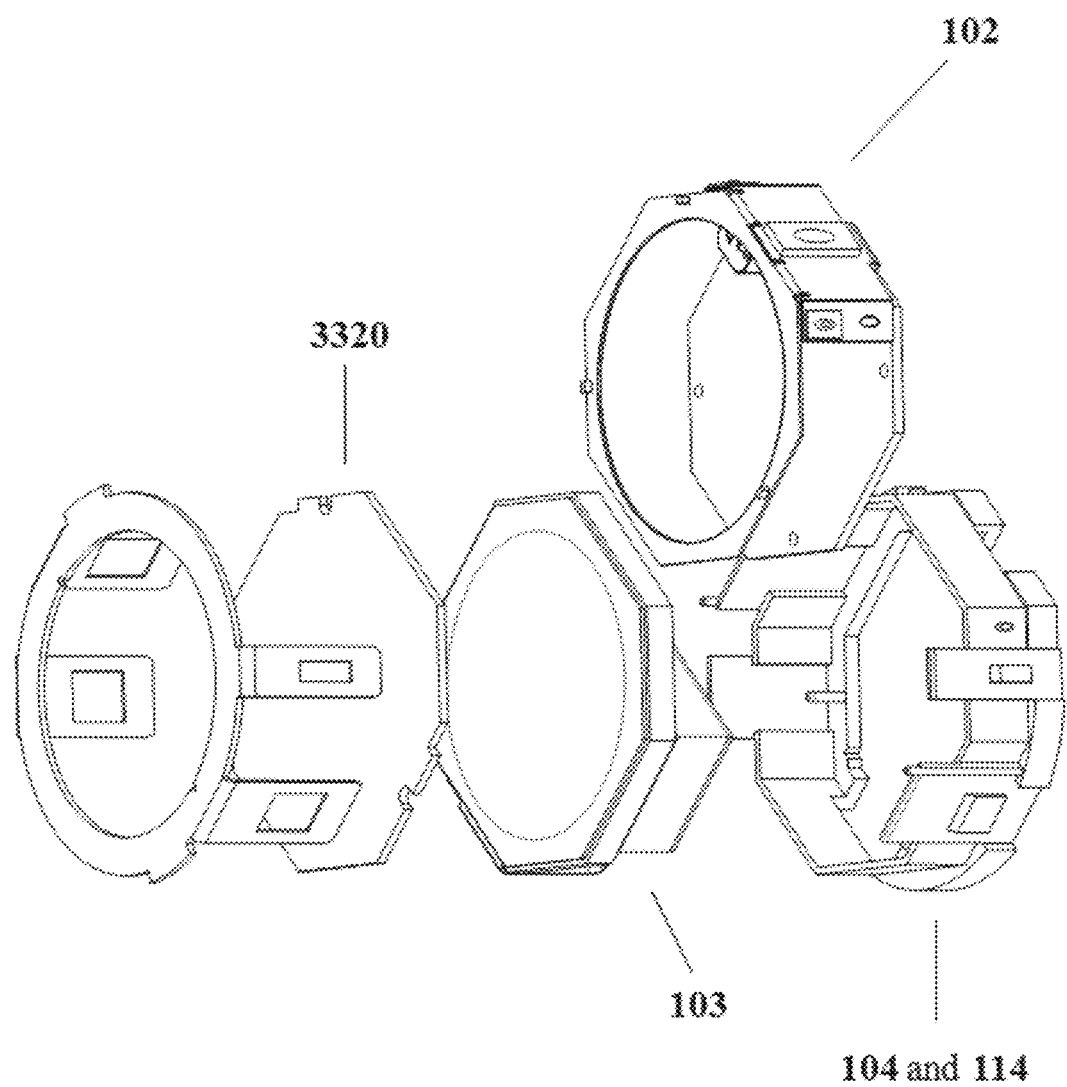
FIG. 32D is an exploded view of an electronics and display subassembly of an alternative embodiment of a bottom loading wearable device.

FIG. 32D is an exploded view of an electronic and display subassembly 2910 for a watch assembled from the bottom side of the case. The components may include a main PCB 104, FPC 114, display retainer 102, electronic display 103, and light guide 3320.

Figure 32E:
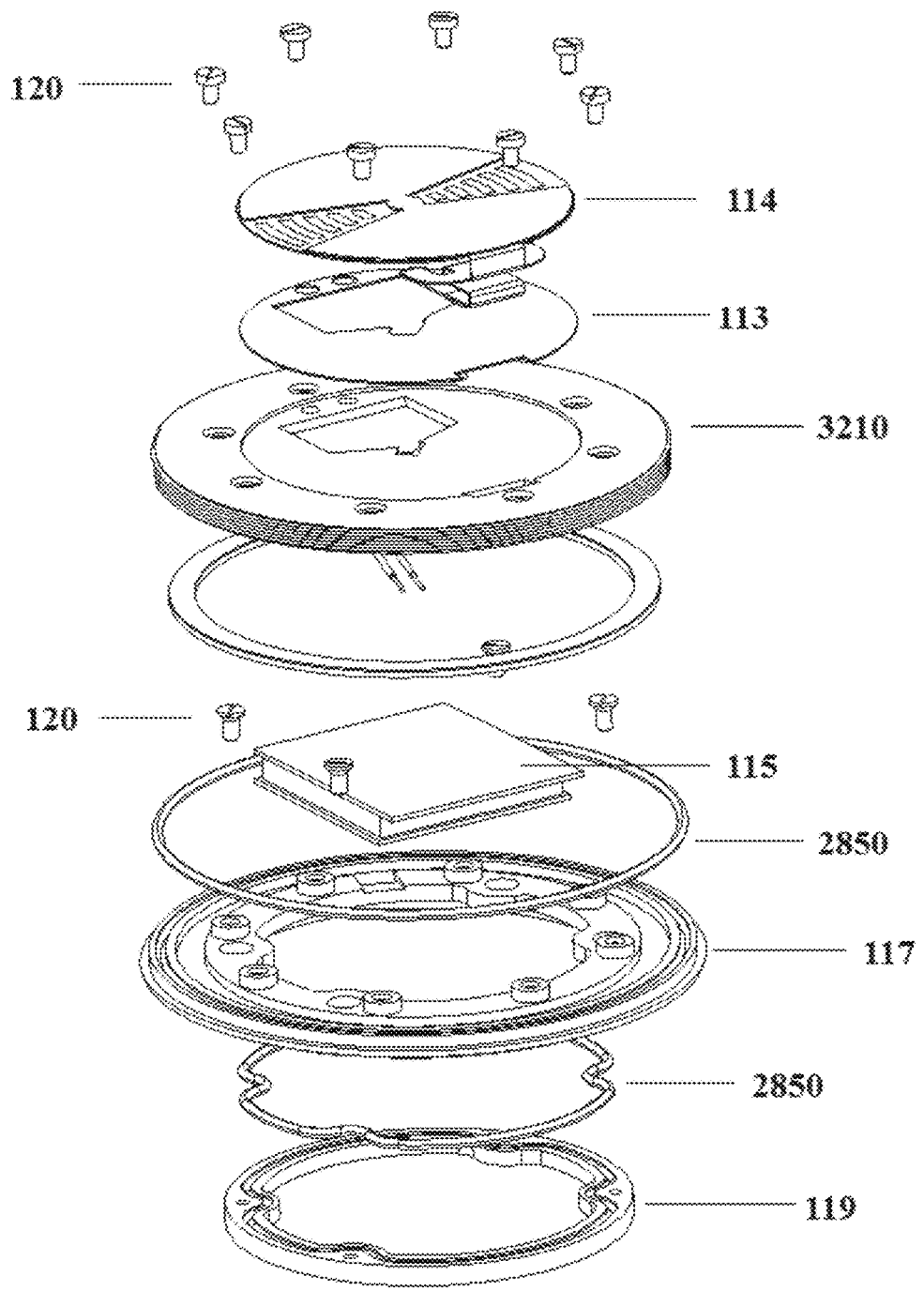
FIG. 32E is an exploded view of a case bottom subassembly of an alternative embodiment of a bottom loading wearable device.

FIG. 32E is an exploded view of an example threaded case bottom subassembly 3230 for a watch assembled from the bottom side of the case. The components may include fastener screws 120, flexible printed circuit 114, insulator spacer 113, threaded heat spreader plate 3210, TEG 115, O-rings 2850, insulator ring 117, and case back conductor 119. The threaded case bottom subassembly 3230 may mate with the threads from the threaded case top conductor 3210. The threads from the threaded case bottom subassembly 3230 may aid in the dissipation of heat. Threading the threaded case bottom subassembly 3230 into the threaded case top conductor 3210 may seal the watch. The watch may be resistant to damage from water and other liquids. The watch may be substantially waterproof or water resistant.

Figure 33A:
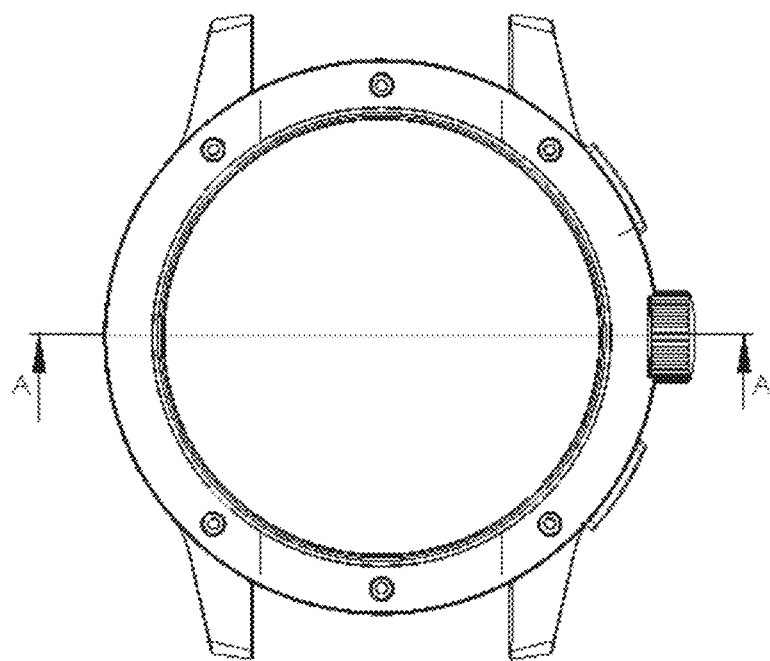
FIG. 33A is a top view of an alternative embodiment of a bottom loading wearable device.
Figure 33B:
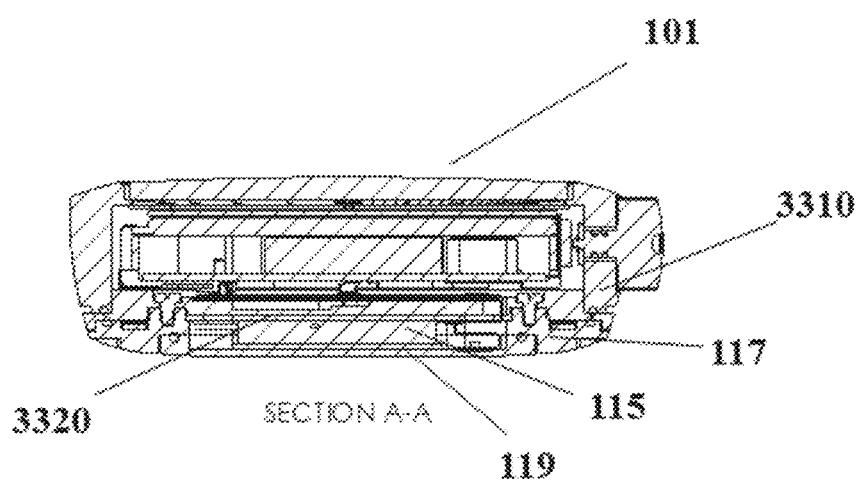
FIG. 33B is a cross-sectional view of the components of an alternative embodiment of a bottom loading wearable device.
Figure 33C:
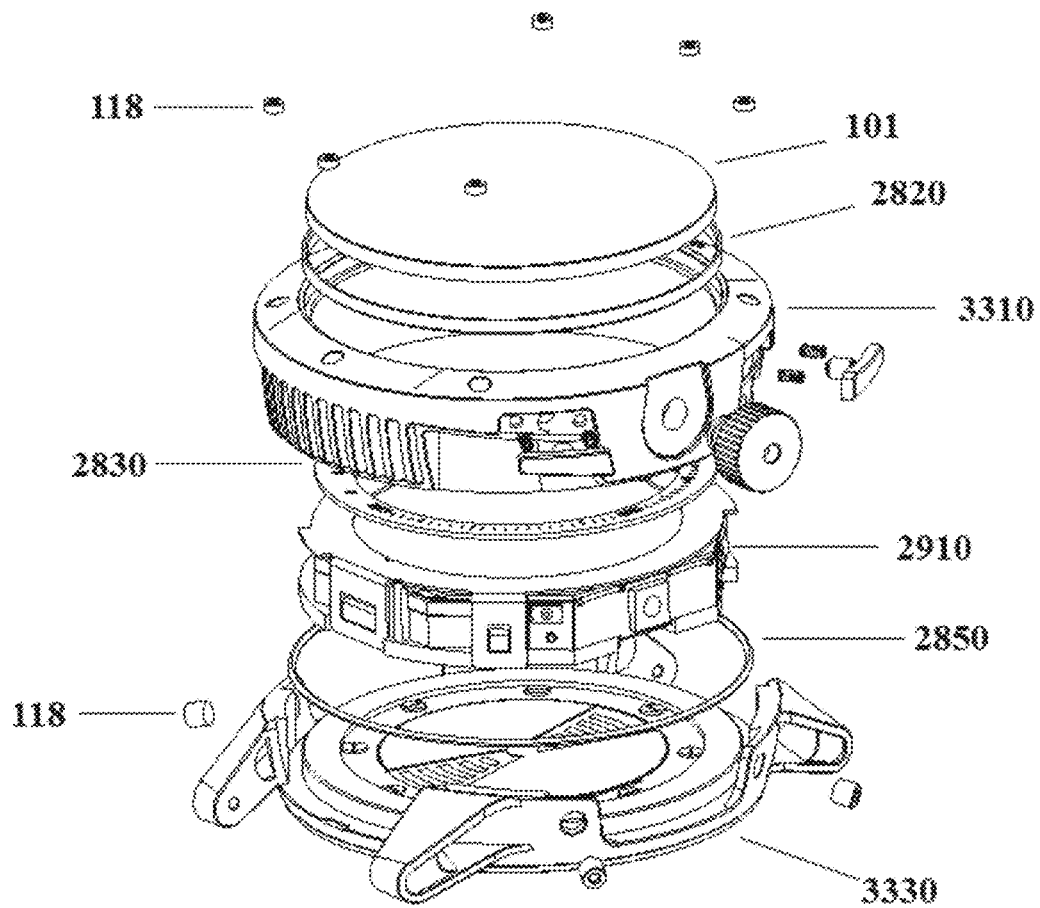
FIG. 33C is an exploded view of the full assembly of an alternative embodiment of a bottom loading wearable device.
Figure 33D:
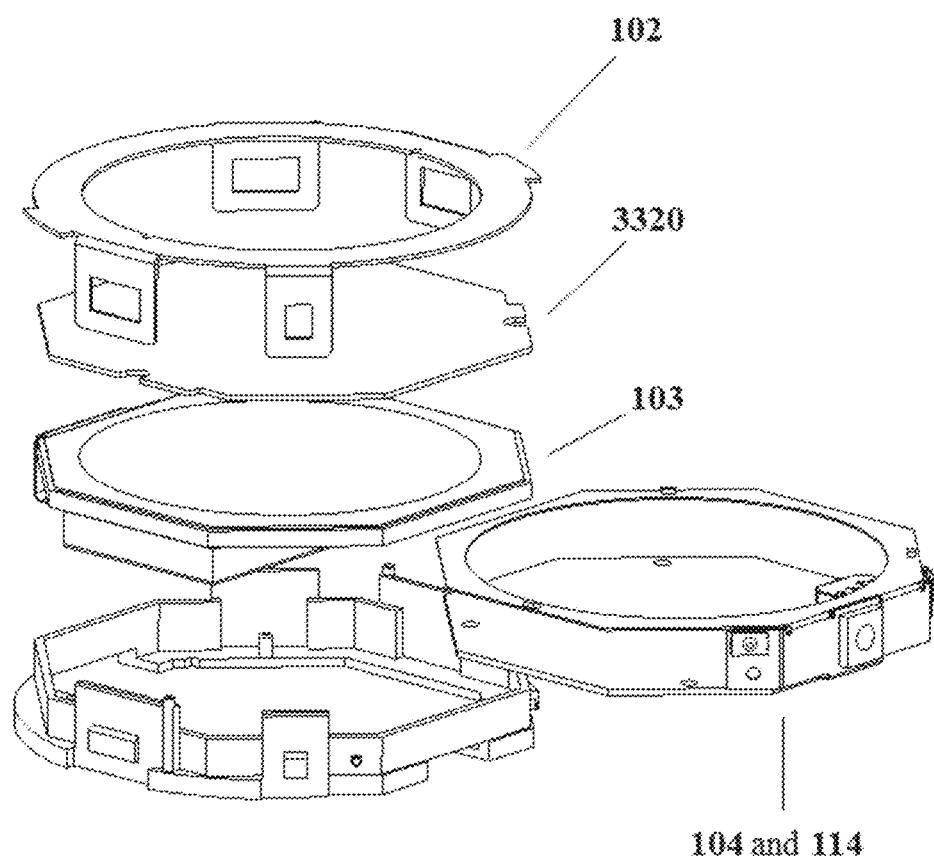
FIG. 33D is an exploded view of an electronics and display subassembly of an alternative embodiment of a bottom loading wearable device.
Figure 33E:
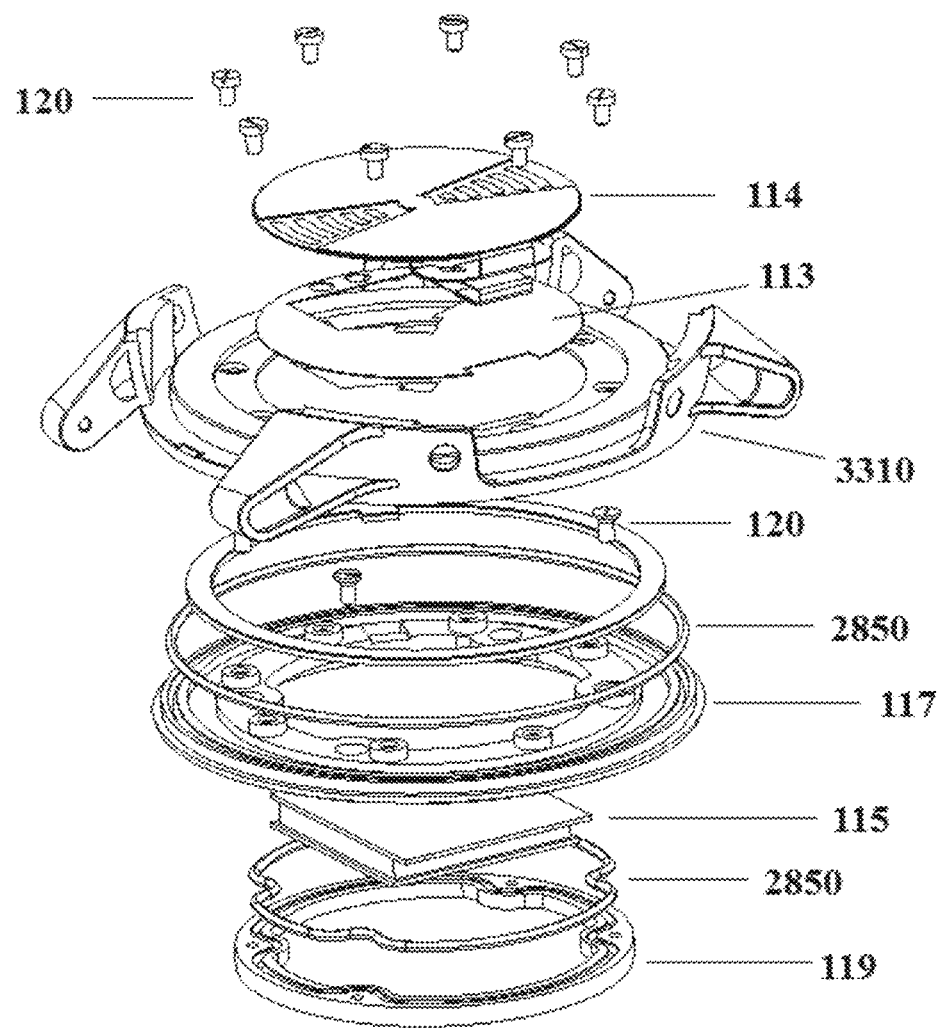
FIG. 33E is an exploded view of a case bottom subassembly of an alternative embodiment of a bottom loading wearable device.

FIGS. 33A-33E show an alternative example watch that is assembled from the bottom side of the case and includes a separate snap-in bottom subassembly. FIG. 33A is a view of the face of the watch. The face of the watch may include a cosmetic dial, cosmetic screws, lugs, and buttons and knobs. FIG. 33B shows a cross-sectional view of the center of the watch. The center of the watch is defined by the line A-A in FIG. 33A. The top surface of the watch may include a top glass 101 and the center portion of the watch may include a snap-in case top conductor 3310. The bottom portion of the watch, which may be the portion in contact with a body surface of the user, may include a snap in heat spreader plate with lugs 3320, an insulator ring 117, one or more TEGs 115, and a case back conductor 119. FIG. 33C is an exploded view of the components of an alternative example watch assembled from the bottom side of the case. The components may include cosmetic screws 118, top glass 101, glass sealing gasket 2820, snap-in case top conductor 3310, cosmetic dial 2830, electronics and display subassembly 2910, O-rings 2850, and snap-in case bottom subassembly 3330. The snap-in case bottom subassembly 3330 may comprise the heat collecting unit and the thermoelectric element. The snap-in case bottom subassembly 3330 may additionally comprise lugs. The lugs may aid in dissipating heat.

FIG. 32D is an exploded view of an electronic and display subassembly 2910 for a watch assembled from the bottom side of the case. The components may include a main PCB 104, FPC 114, display retainer 102, electronic display 103, and light guide 3320.

FIG. 32E is an exploded view of an example snap-in case bottom subassembly 3330 for a watch assembled from the bottom side of the case. The components may include fastener screws 120, flexible printed circuit 114, insulator spacer 113, snap-in heat spreader plate 3310, TEG 115, O-rings 2850, insulator ring 117, and case back conductor 119. The snap-in case bottom subassembly may mate with corresponding features in the snap-in case top conductor 3310. Snapping the snap-in case bottom subassembly 3330 into the snap-in case top conductor 3310 may seal the watch. The watch may be resistant to damage from water and other liquids. The watch may be substantially waterproof or water resistant.

Thermoelectric Elements, Devices and Systems

The present disclosure provides thermoelectric elements, devices and systems that can be employed for use in various applications, such as heating and/or cooling applications, power generation, consumer applications and industrial applications. Such thermoelectric elements may be used with wearable devices of the present disclosure, such as watches. In some examples, thermoelectric materials are used in consumer electronic devices (e.g., smart watches, portable electronic devices, and health/fitness tracking devices). As another example, a thermoelectric material of the present disclosure can be used in an industrial setting, such as at a location where there is heat loss. In such a case, heat can be captured by a thermoelectric device and used to generate power.

Thermoelectric devices of the present disclosure can be used to generate power upon the application of a temperature gradient across such devices. Such power can be used to provide electrical energy to various types of devices, such as consumer electronic devices.

Thermoelectric devices of the present disclosure can have various non-limiting advantages and benefits. In some cases, thermoelectric devices can have substantially high aspect ratios, uniformity of holes or wires, and figure-of-merit, ZT, which can be suitable for optimum thermoelectric device performance. With respect to the figure-of-merit, Z can be an indicator of coefficient-of-performance (COP) and the efficiency of a thermoelectric device, and T can be an average temperature of the hot and the cold sides of the thermoelectric device. In some embodiments, the figure-of-merit (ZT) of a thermoelectric element or thermoelectric device is at least about 0.01, 0.02, 0.03, 0.04, 0.05, 0.06, 0.07, 0.08, 0.09, 0.1, 0.15, 0.2, 0.25, 0.3, 0.35, 0.4, 0.45 0.5, 0.55, 0.6, 0.65, 0.7, 0.75, 0.8, 0.85, 0.9, 0.95, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 25° C. In some case, the figure-of-merit is from about 0.01 to 3, 0.1 to 2.5, 0.5 to 2.0 or 0.5 to 1.5 at 25° C.

The figure of merit (ZT) can be a function of temperature. In some cases, ZT increases with temperature. For example, a thermoelectric having a ZT of 0.5 at 25° C. can have a greater ZT at 100° C.

Thermoelectric devices of the present disclosure can have electrodes each comprising an array of nanostructures (e.g., holes or wires). The array of nanostructures can include a plurality of holes or elongate structures, such as wires (e.g., nanowires). The holes or wires can be ordered and have uniform sizes and distributions. As an alternative, the holes or wires may not be ordered and may not have a uniform distribution. In some examples, there is no long range order with respect to the holes or wires. In some cases, the holes or wires may intersect each other in random directions. Methods for forming patterned or disordered patterns of nanostructures (e.g., holes or wires) are provided elsewhere herein.

The present disclosure provides thermoelectric elements that are flexible or substantially flexible. A flexible material can be a material that can be conformed to a shape, twisted, or bent without experiencing plastic deformation. This can enable thermoelectric elements to be used in various settings, such as settings in which contact area with a heat source or heat sink is important. For example, a flexible thermoelectric element can be brought in efficient contact with a heat source or heat sink, such as by wrapping the thermoelectric element around the heat source or heat sink.

A thermoelectric device can include one or more thermoelectric elements. The thermoelectric elements can be flexible. An individual thermoelectric element can include at least one semiconductor substrate which can be flexible. In some cases, individual semiconductor substrates of a thermoelectric element are rigid but substantially thin (e.g., 500 nm to 1 mm or 1 micrometer to 0.5 mm) such that they provide a flexible thermoelectric element when disposed adjacent one another. Similarly, individual thermoelectric elements of a thermoelectric device can be rigid but substantially thin such that they provide a flexible thermoelectric device when disposed adjacent one another.

Figure 6:
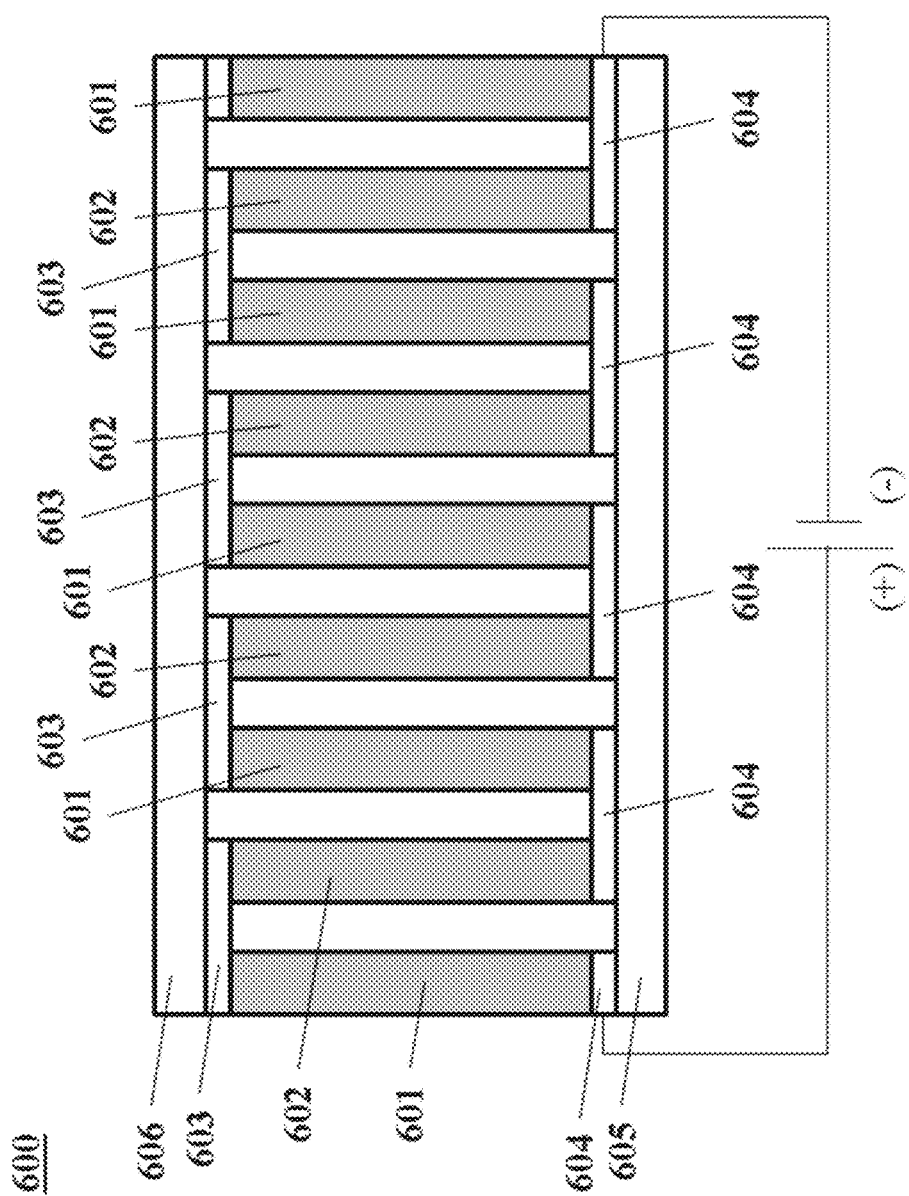
FIG. 6 shows a thermoelectric device having a plurality of elements.

FIG. 6 shows a thermoelectric device 600, in accordance with some embodiments of the present disclosure. The thermoelectric device 600 includes n-type 601 and p-type 602 elements disposed between a first set of electrodes 603 and a second set of electrodes 604 of the thermoelectric device 600. The first set of electrodes 603 connects adjacent n-type 601 and p-type elements, as illustrated.

The electrodes 603 and 604 are in contact with a hot side material 605 and a cold side material 606 respectively. In some embodiments, the hot side material 605 and cold side material 606 are electrically insulating but thermally conductive. The application of an electrical potential to the electrodes 603 and 604 leads to the flow of current, which generates a temperature gradient ($\Delta T$) across the thermoelectric device 600. The temperature gradient ($\Delta T$) extends from a first temperature (average), T1, at the hot side material 605 to a second temperature (average), T2, at the cold side material 606, where T1>T2. The temperature gradient can be used for heating and cooling purposes.

The n-type 601 and p-type 602 elements of the thermoelectric device 600 can be formed of structures having dimensions from nanometers to micrometers, such as, e.g., nanostructures. In some situations, the nanostructures are holes or inclusions, which can be provided in an array of holes (i.e., mesh). In other situations, the nanostructures are rod-like structures, such as nanowires. In some cases, the rod-like structures are laterally separated from one another.

In some cases, the n-type 601 and/or p-type 602 elements are formed of an array of wires or holes oriented along the direction of the temperature gradient. The wires may extend from the first set of electrodes 603 to the second set of electrodes 604. In other cases, the n-type 601 and/or p-type 602 elements are formed of an array of holes oriented along a direction that is angled between about 0° and 90° in relation to the temperature gradient. In an example, the array of holes is orthogonal to the temperature gradient. The holes or wires, in some cases, have dimensions on the order of nanometers to micrometers. In some cases, holes can define a nanomesh.

Figure 7:
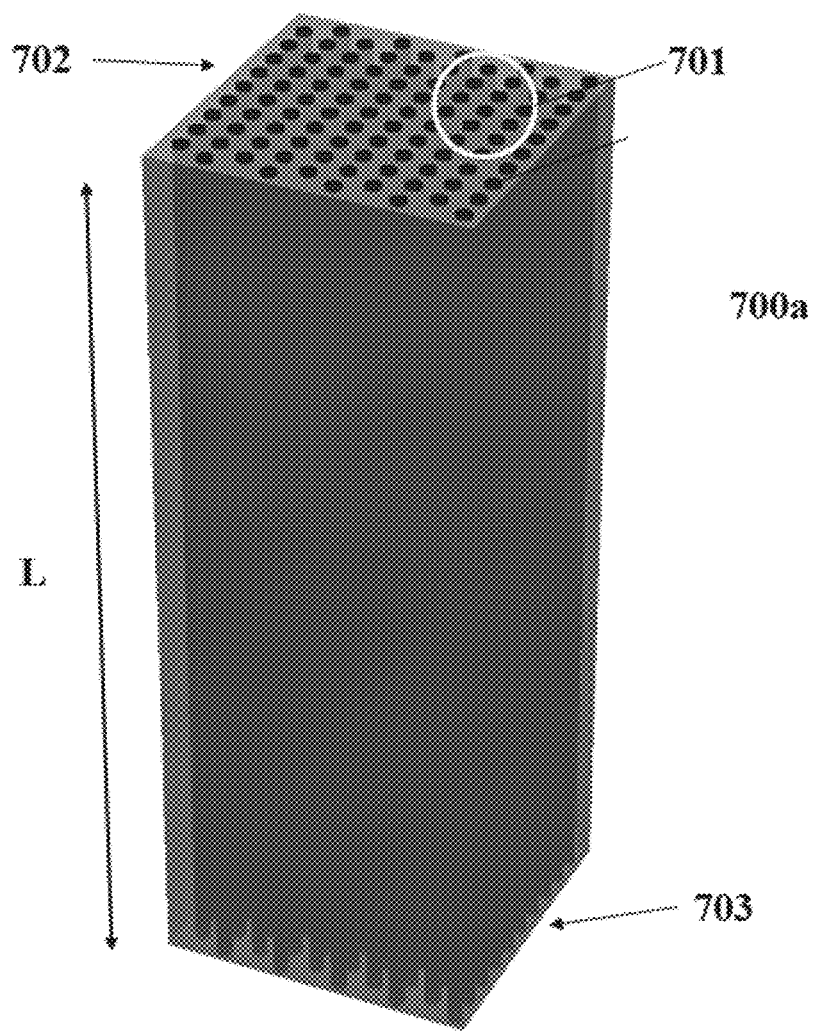
FIG. 7 is a schematic perspective view of a thermoelectric element, in accordance with an embodiment of the present disclosure.
Figure 8:
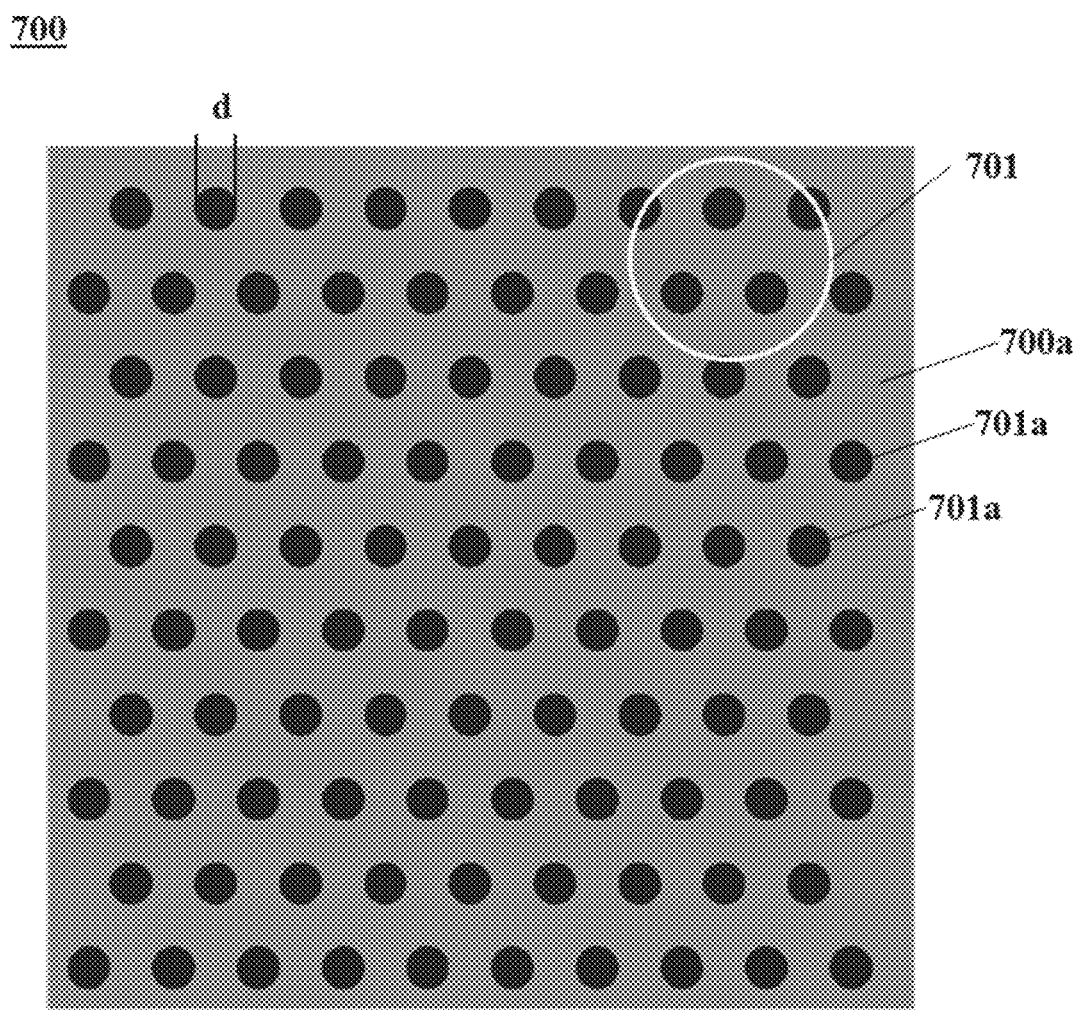
FIG. 8 is a schematic top view of the thermoelectric element of FIG. 7, in accordance with an embodiment of the present disclosure.
Figure 9:
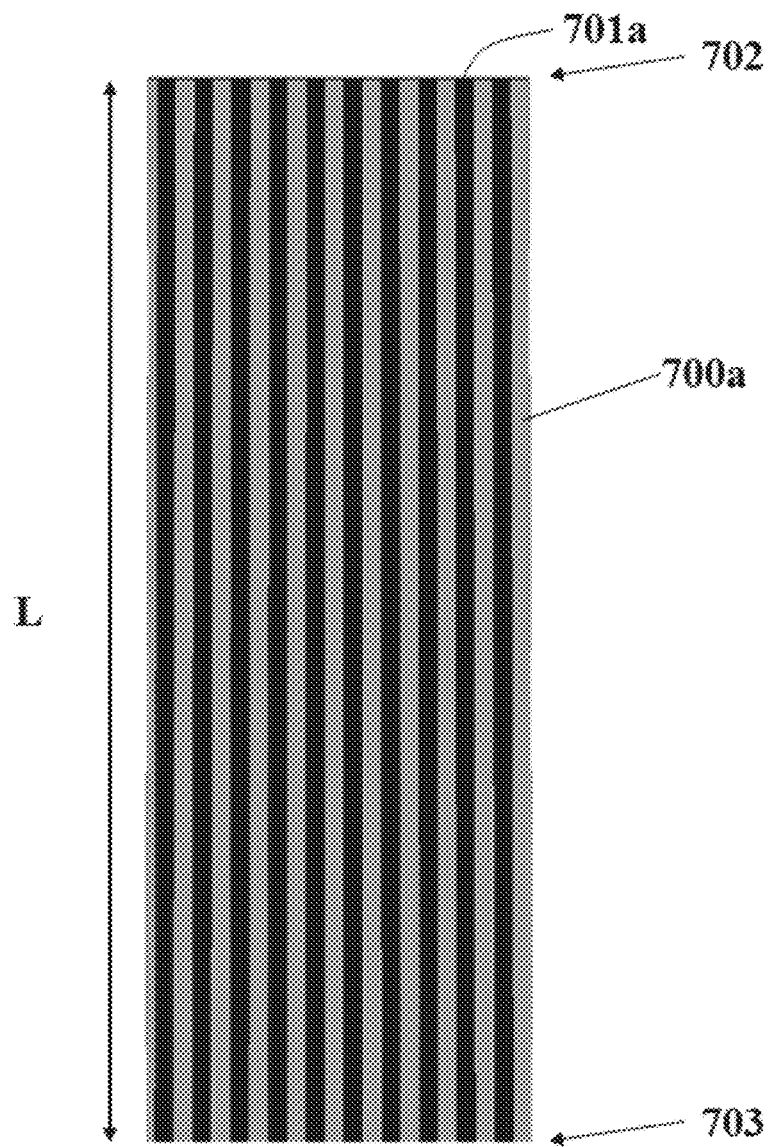
FIG. 9 is a schematic side view of the thermoelectric element of FIGS. 7 and 8, in accordance with an embodiment of the present disclosure.

FIG. 7 is a schematic perspective view of a thermoelectric element 700 having an array of holes 701 (select holes circled), in accordance with an embodiment of the present disclosure. The array of holes can be referred to as a "nanomesh" herein. FIGS. 8 and 9 are perspective top and side views of the thermoelectric element 700. The element 700 can be an n-type or p-type element, as described elsewhere herein. The array of holes 701 includes individual holes 701a that can have widths from several nanometers or less up to microns, millimeters or more. In some embodiments, the holes have widths (or diameters, if circular) ("d") between about 1 nm and 500 nm, or 5 nm and 100 nm, or 10 nm and 30 nm. The holes can have lengths ("L") from about several nanometers or less up to microns, millimeters or more. In some embodiments, the holes have lengths between about 0.5 microns and 1 centimeter, or 1 micron and 500 millimeters, or 10 microns and 1 millimeter.

The holes 701a are formed in a substrate 700a. In some cases, the substrate 700a is a solid state material, such as e.g., carbon (e.g., graphite or graphene), silicon, germanium, gallium arsenide, aluminum gallium arsenide, silicides, silicon germanium, bismuth telluride, lead telluride, oxides (e.g., $SiO_x$, where 'x' is a number greater than zero), gallium nitride and tellurium silver germanium antimony (TAGS) containing alloys. For example, the substrate 700a can be a Group IV material (e.g., silicon or germanium) or a Group III-V material (e.g., gallium arsenide). The substrate 700a may be formed of a semiconductor material comprising one or more semiconductors. The semiconductor material can be doped n-type or p-type for n-type or p-type elements, respectively.

In some cases, the holes 701a are filled with a gas, such as He, Ne, Ar, $N_2$, $H_2$, $CO_2$, $O_2$, or a combination thereof. In other cases, the holes 701a are under vacuum. Alternatively, the holes may be filled (e.g., partially filled or completely filled) with a semiconductor material, an insulating (or dielectric) material, or a gas (e.g., He, Ar, $H_2$, $N_2$, $CO_2$).

A first end 702 and second end 703 of the element 700 can be in contact with a substrate having a semiconductor-containing material, such as silicon or a silicide. The substrate can aid in providing an electrical contact to an electrode on each end 702 and 703. Alternatively, the substrate can be precluded, and the first end 702 and second end 703 can be in contact with a first electrode (not shown) and a second electrode (not shown), respectively.

In some embodiments, the holes 701a are substantially monodisperse. Monodisperse holes may have substantially the same size, shape and/or distribution (e.g., cross-sectional distribution). In other embodiments, the holes 701a are distributed in domains of holes of various sizes, such that the holes 701a are not necessarily monodisperse. For example, the holes 701a may be polydisperse. Polydisperse holes can have shapes, sizes and/or orientations that deviate from one another by at least about 0.1%, 0.5%, 1%, 2%, 3%, 4%, 5%, 10%, 15%, 20%, 30%, 40%, or 50%. In some situations, the device 700 includes a first set of holes with a first diameter and a second set of holes with a second diameter. The first diameter is larger than the second diameter. In other cases, the device 700 includes two or more sets of holes with different diameters.

The holes 701a can have various packing arrangements. In some cases, the holes 701a, when viewed from the top (see FIG. 8), have a hexagonal close-packing arrangement.

In some embodiments, the holes 701a in the array of holes 701 have a center-to-center spacing between about 1 nm and 500 nm, or 5 nm and 100 nm, or 10 nm and 30 nm. In some cases, the center-to-center spacing is the same, which may be the case for monodisperse holes 701a. In other cases, the center-to-center spacing can be different for groups of holes with various diameters and/or arrangements.

The dimensions (lengths, widths) and packing arrangement of the holes 701, and the material and doping configuration (e.g., doping concentration) of the element 700 can be selected to effect a predetermined electrical conductivity and thermal conductivity of the element 700, and a thermoelectric device having the element 700. For instance, the diameters and packing configuration of the holes 701 can be selected to minimize the thermal conductivity, and the doping concentration can be selected to maximize the electrical conductivity of the element 700.

The doping concentration of the substrate 700a can be at least about $10^{18}$ cm$^{-3}$, $10^{19}$ cm$^{-3}$, $10^{20}$ cm$^{-3}$, or $10^{21}$ cm$^{-3}$. In some examples, the doping concentration is from about $10^{18}$ to $10^{21}$ cm$^{-3}$, or $10^{19}$ to $10^{20}$ cm$^{-3}$. The doping concentration can be selected to provide a resistivity that is suitable for use as a thermoelectric element. The resistivity of the substrate 700a can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the substrate 700a is from about 0.001 ohm-cm to 1 ohm-cm, 0.001 ohm-cm to 0.5 ohm-cm, or 0.001 ohm-cm to 0.1 ohm-cm.

The array of holes 701 can have an aspect ratio (e.g., the length of the element 700 divided by width of an individual hole 701a) of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more.

The holes 701 can be ordered and have uniform sizes and distributions. As an alternative, the holes 701 may not be ordered and may not have a uniform distribution. For example, the holes 701 can be disordered such that there is no long range order for the pattern of holes 701.

In some embodiments, thermoelectric elements can include an array of wires. The array of wires can include individual wires that are, for example, rod-like structures.

As an alternative to the array of holes of the element 700, the holes may not be ordered and may not have a uniform distribution. In some examples, there is no long range order with respect to the holes. In some cases, the holes may intersect each other in random directions. The holes may include intersecting holes, such as secondary holes that project from the holes in various directions. The secondary holes may have additional secondary holes. The holes may have various sizes and may be aligned along various directions, which may be random and not uniform.

Figure 10:
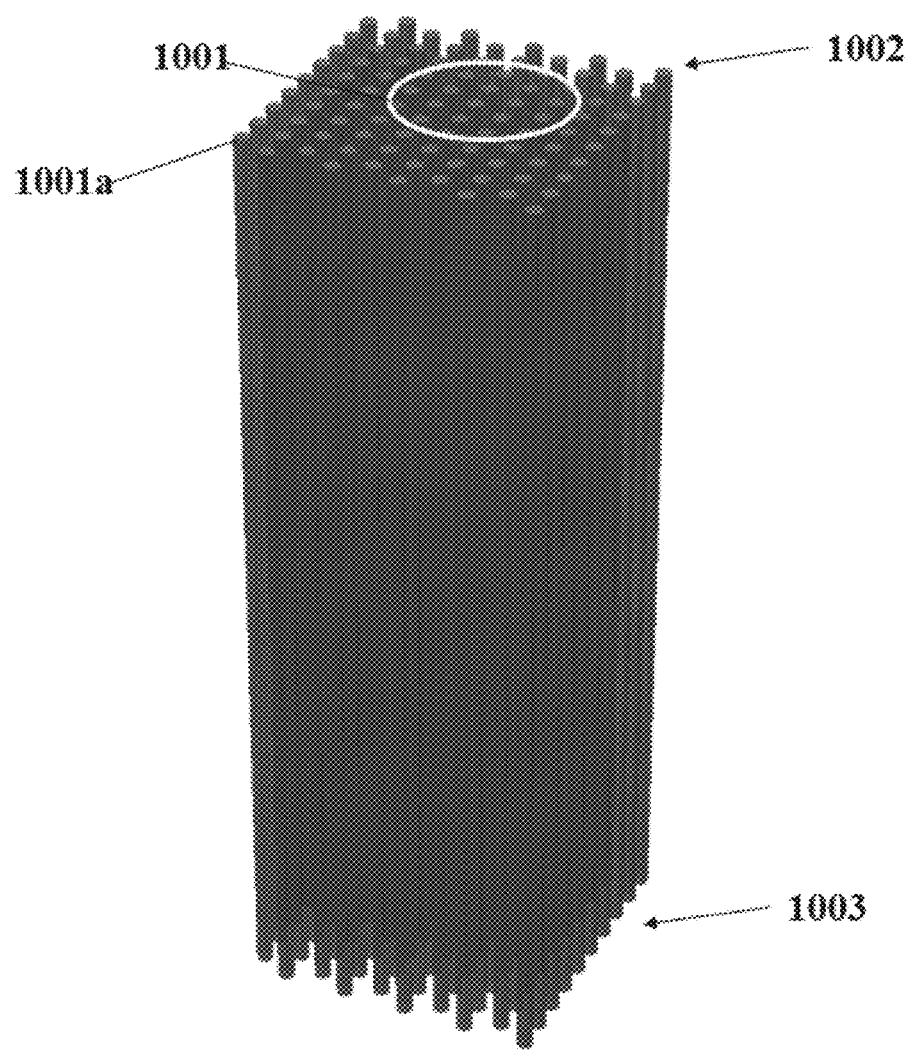
FIG. 10 is a schematic perspective view of a thermoelectric element, in accordance with an embodiment of the present disclosure.
Figure 11:
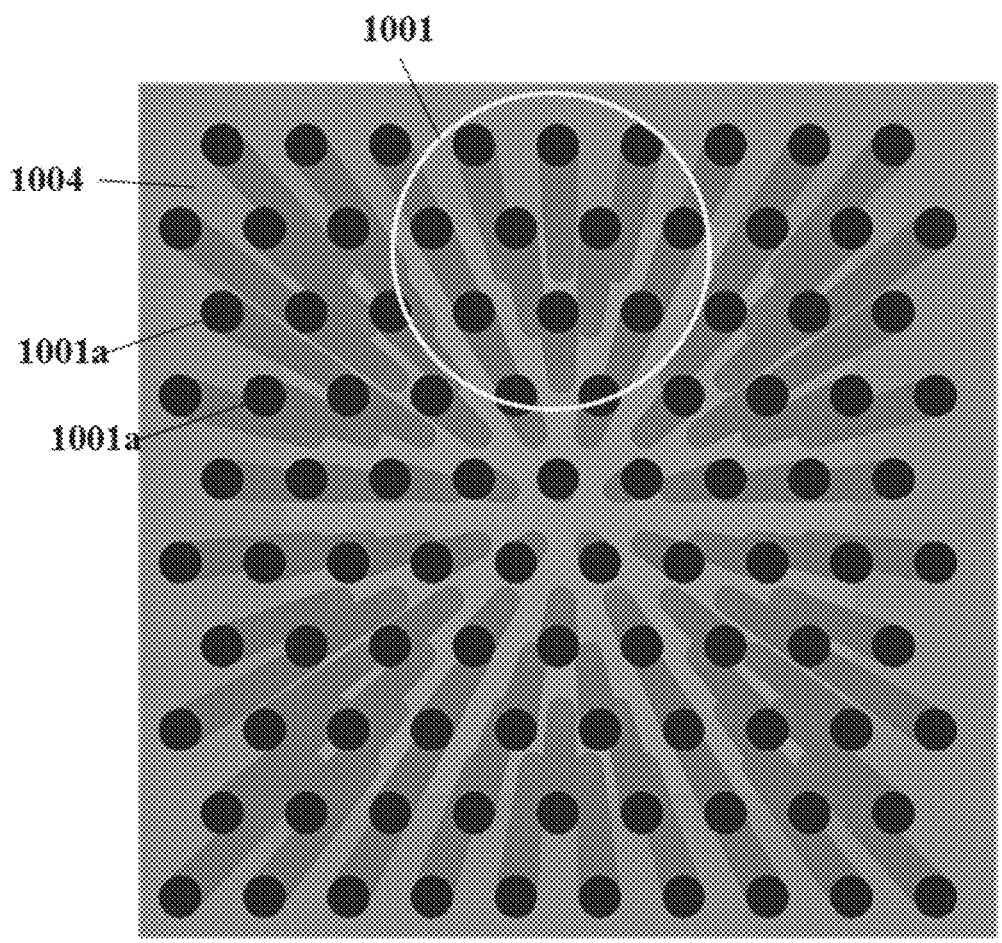
FIG. 11 is a schematic top view of the thermoelectric element of FIG. 10, in accordance with an embodiment of the present disclosure.

FIG. 10 is a schematic perspective top view of a thermoelectric element 1000, in accordance with an embodiment of the present disclosure. FIG. 11 is a schematic perspective top view of the thermoelectric element 1000. The thermoelectric element 1000 may be used with devices, systems and methods provided herein. The element 1000 includes an array of wires 1001 having individual wires 1001a. In some embodiments, the wires have widths (or diameters, if circular) ("d") between about 1 nm and 500 nm, or 5 nm and 100 nm, or 10 nm and 30 nm. The wires can have lengths ("L") from about several nanometers or less up to microns, millimeters or more. In some embodiments, the wires have lengths between about 0.5 microns and 1 centimeter, or 1 micron and 500 millimeters, or 10 microns and 1 millimeter.

In some embodiments, the wires 1001a are substantially monodisperse. Monodisperse wires may have substantially the same size, shape and/or distribution (e.g., cross-sectional distribution). In other embodiments, the wires 1001a are distributed in domains of wires of various sizes, such that the wires 1001a are not necessarily monodisperse. For example, the wires 1001a may be polydisperse. Polydisperse wires can have shapes, sizes and/or orientations that deviate from one another by at least about 0.1%, 0.5%, 1%, 2%, 3%, 4%, 5%, 10%, 15%, 20%, 30%, 40%, or 50%.

In some embodiments, the wires 1001a in the array of wires 1001 have a center-to-center spacing between about 1 nm and 500 nm, or 5 nm and 100 nm, or 10 nm and 30 nm. In some cases, the center-to-center spacing is the same, which may be the case for monodisperse wires 1001. In other cases, the center-to-center spacing can be different for groups of wires with various diameters and/or arrangements.

In some embodiments, the wires 1001a are formed of a solid state material, such as a semiconductor material, such as, e.g., silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The wires 1001a can be formed of other materials disclosed herein. The wires 1001a can be doped with an n-type dopant or a p-type dopant. The doping concentration of the semiconductor material can be at least about $10^{18}$ cm$^{-3}$, $10^{19}$ cm$^{-3}$, $10^{20}$ cm$^{-3}$, or $10^{21}$ cm$^{-3}$. In some examples, the doping concentration is from about $10^{18}$ to $10^{21}$ cm$^{-3}$, or $10^{19}$ to $10^{20}$ cm$^{-3}$. The doping concentration of the semiconductor material can be selected to provide a resistivity that is suitable for use as a thermoelectric element. The resistivity of the semiconductor material can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the semiconductor material is from about 0.001 ohm-cm to 1 ohm-cm, 0.001 ohm-cm to 0.5 ohm-cm, or 0.001 ohm-cm to 0.1 ohm-cm.

In some embodiments, the wires 1001a are attached to semiconductor substrates at a first end 1002 and second end 1003 of the element 1000. The semiconductor substrates can have the n-type or p-type doping configuration of the individual wires 1001a. In other embodiments, the wires 1001a at the first end 1002 and second end 1003 are not attached to semiconductor substrates, but can be attached to electrodes. For instance, a first electrode (not shown) can be in electrical contact with the first end 1002 and a second electrode can be electrical contact with the second end 1003.

With reference to FIG. 11, space 1004 between the wires 1001a may be filled with a vacuum or various materials. In some embodiments, the wires are laterally separated from one another by an electrically insulating material, such as a silicon dioxide, germanium dioxide, gallium arsenic oxide, spin on glass, and other insulators deposited using, for example, vapor phase deposition, such as chemical vapor deposition or atomic layer deposition. In other embodiments, the wires are laterally separated from one another by vacuum or a gas, such as He, Ne, Ar, $N_2$, $H_2$, $CO_2$, $O_2$, or a combination thereof.

The array of wires 1001 can have an aspect ratio—length of the element 1000 divided by width of an individual wire 1001a—of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more. In some cases, the length of the element 1000 and the length of an individual wire 1001a are substantially the same.

Thermoelectric elements provided herein can be incorporated in thermoelectric devices for use in cooling and/or heating and, in some cases, power generation. In some examples, the device 600 may be used as a power generation device. In an example, the device 600 is used for power generation by providing a temperature gradient across the electrodes and the thermoelectric elements of the device 600.

As an alternative to the array of wires of the element 1000, the wires may not be ordered and may not have a uniform distribution. In some examples, there is no long range order with respect to the wires. In some cases, the wires may intersect each other in random directions. The wires may have various sizes and may be aligned along various directions, which may be random and not uniform.

Figure 12:
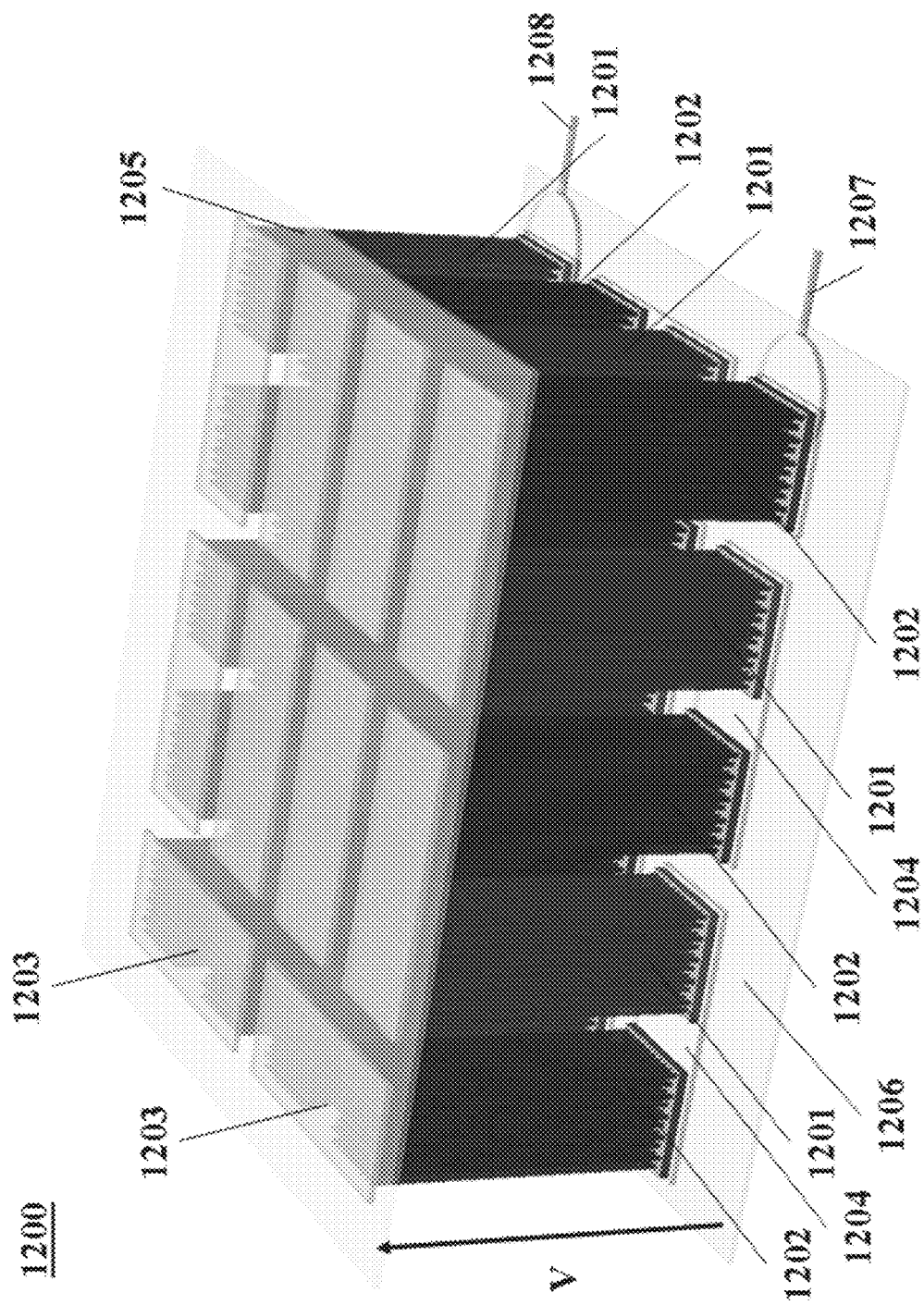
FIG. 12 is a schematic perspective view of a thermoelectric device comprising elements having an array of wires, in accordance with an embodiment of the present disclosure.

FIG. 12 shows a thermoelectric device 1200 having n-type elements 1201 and p-type elements 1202, in accordance with an embodiment of the present disclosure. The n-type elements 1201 and p-type elements 1202 each include an array of wires, such as nanowires. An array of wires can include a plurality of wires. The n-type elements 1201 include n-type (or n-doped) wires and the p-type elements 1202 include p-type wires. The wires can be nanowires or other rod-like structures.

Adjacent n-type elements 1201 and p-type elements 1202 are electrically connected to one another at their ends using electrodes 1203 and 1204. The device 1200 includes a first thermally conductive, electrically insulating layer 1205 and a second thermally conductive, electrically insulating layer 1206 at opposite ends of the elements 1201 and 1202.

The device 1200 includes terminals 1207 and 1208 that are in electrical communication with the electrodes 1203 and 1204. The application of an electrical potential across the terminals 1207 and 1208 generates a flow of electrons and holes in the n-type and p-type elements 1201 and 1202, respectively, which generates a temperature gradient across the elements 1201 and 1202. The first thermally conductive, electrically insulating layer 1205 is a cold side of the device 1200; the second thermally conductive, electrically insulating layer 1206 is a hot side of the device 1200. The cold side is cooler (i.e., has a lower operating temperature) than the hot side.

Figure 13:
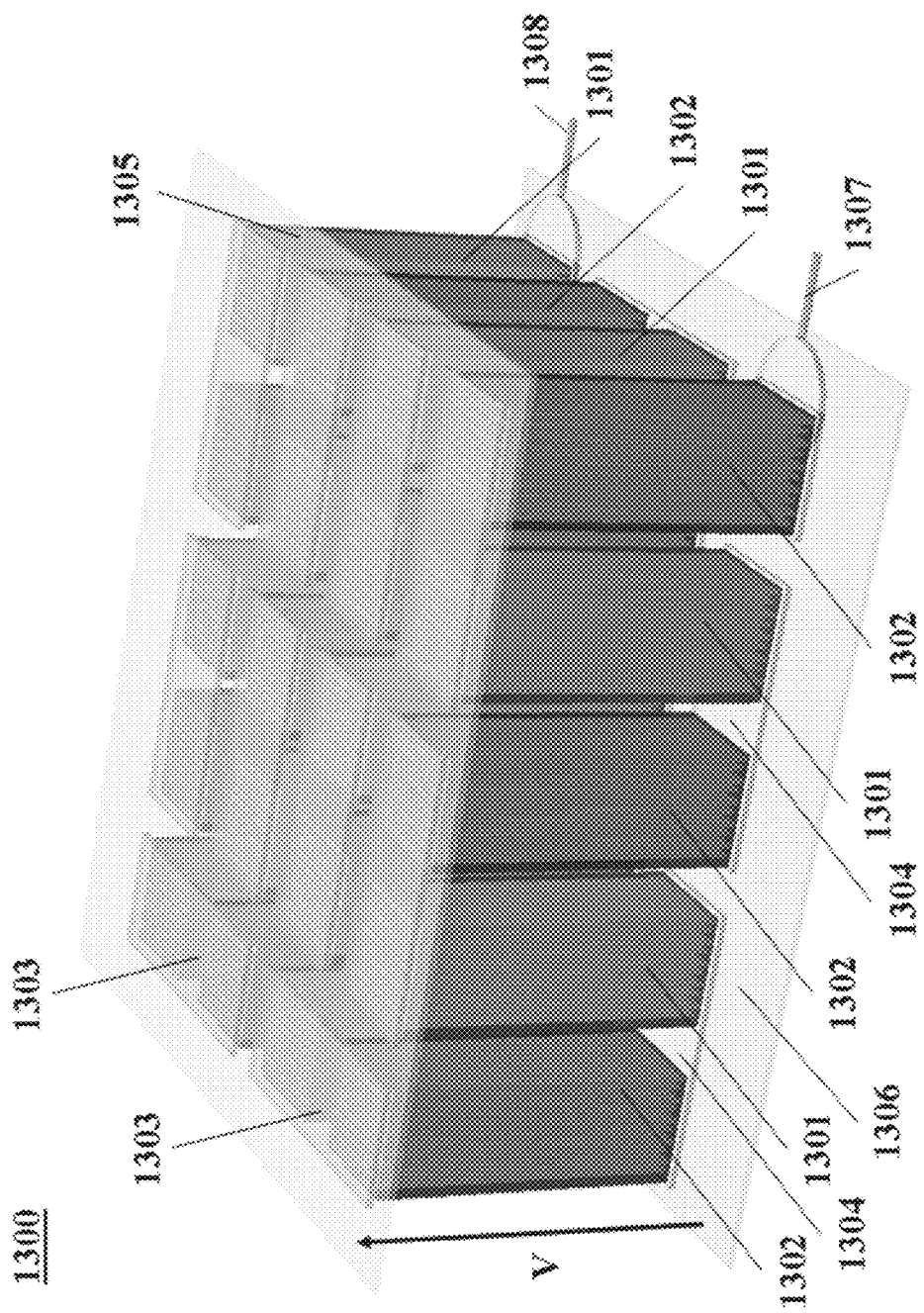
FIG. 13 is a schematic perspective view of a thermoelectric device comprising elements having an array of holes, in accordance with an embodiment of the present disclosure.

FIG. 13 shows a thermoelectric device 1300 having n-type elements 1301 and p-type elements 1302, in accordance with an embodiment of the present disclosure. The n-type elements 1301 and p-type elements 1302 are formed in n-type and p-type semiconductor substrates, respectively. Each substrate can include an array of holes, such as nanoholes. The array of holes can include a plurality of holes. An individual hole can span the length of an n-type or p-type element. The holes can be monodisperse, in which case hole dimensions and center-to-center spacing may be substantially constant. In some cases, the array of holes includes holes with center-to-center spacing and hole dimensions (e.g., widths or diameters) that may be different. In such a case, the holes may not be monodisperse.

Select n-type elements 1301 and p-type elements 1302 are electrically connected to one another at their ends by electrodes 1303 and 1304. The device 1300 includes a first thermally conductive, electrically insulating layer ("first layer") 1305 and a second thermally conductive, electrically insulating layer ("second layer") 1306 at opposite ends of the elements 1301 and 1302.

The device 1300 includes terminals 1307 and 1308 that are in electrical communication with the electrodes 1303 and 1304. The application of an electrical potential across the terminals 1307 and 1308 generates the flow of electrons and holes in the n-type and p-type elements 1301 and 1302, respectively, which generates a temperature gradient across the elements 1301 and 1302. The first thermally conductive, electrically insulating layer 1305 is a cold side of the device 1300; the second thermally conductive, electrically insulating layer 1306 is a hot side of the device 1300. The cold side is cooler (i.e., has a lower operating temperature) than the hot side.

The thermoelectric device 1300 has a temperature gradient from the second thermally conductive, electrically insulating layer 1306 to the first thermally conductive, electrically insulating layer 1305. In some cases, the holes are disposed parallel to a vector oriented from the first layer 1305 to the second layer 1306. In other cases, the holes are disposed at an angle greater than 0° in relation to the vector. For instance, the holes can be disposed at an angle of at least about 1°, 10°, 20°, 30°, 40°, 50°, 60°, 70°, 80°, or 90° in relation to the vector.

Figure 14:
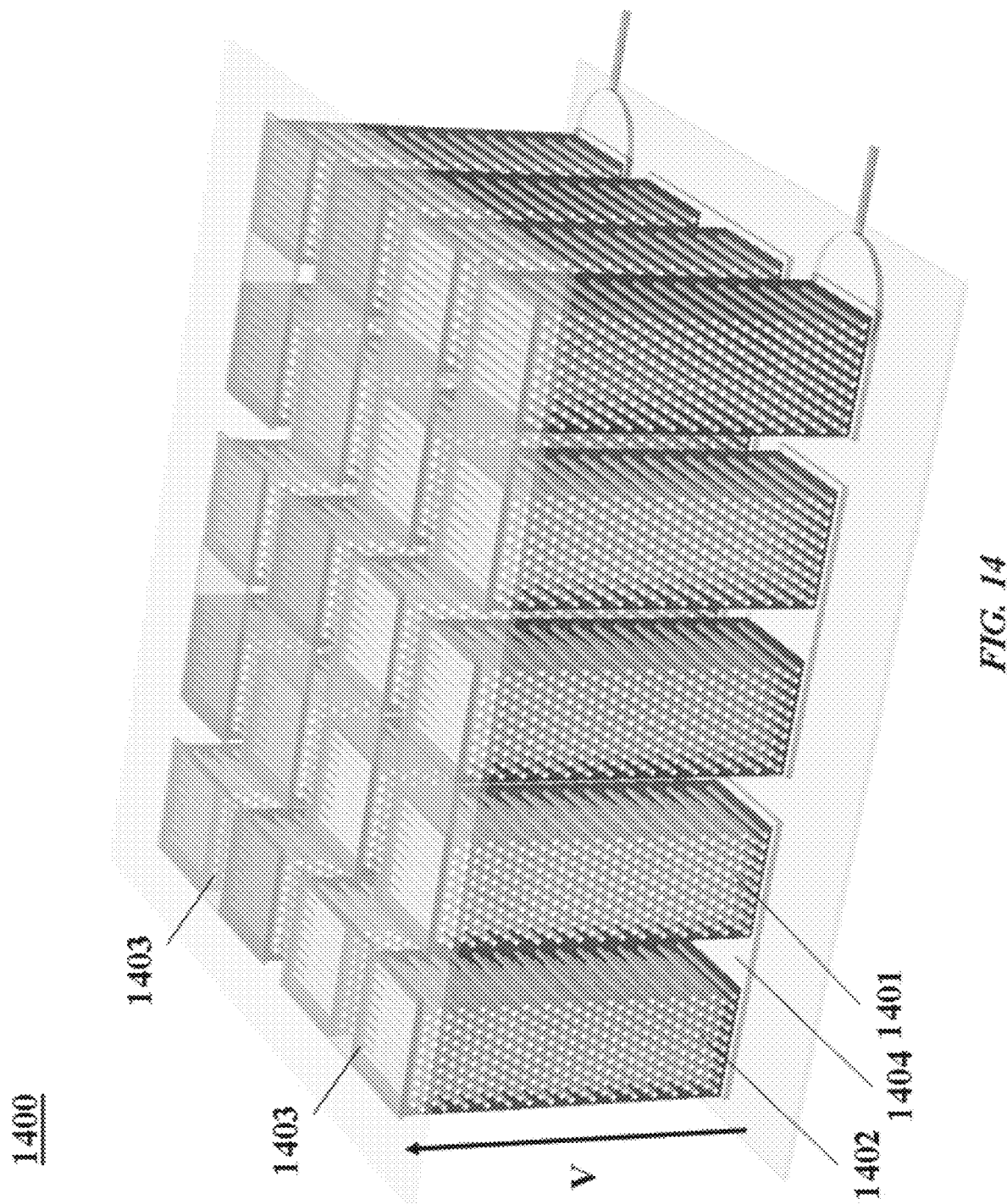
FIG. 14 is a schematic perspective view of a thermoelectric device comprising elements having an array of holes that are oriented perpendicularly with respect to the vector V, in accordance with an embodiment of the present disclosure.

FIG. 14 shows a thermoelectric device 1400 having n-type elements 1401 and p-type elements 1402, with the elements having holes formed in substrates of the n-type and p-type elements. The holes are oriented perpendicular to a vector ("V") orthogonal to the electrodes 1403 and 1404 of the device 1400.

Wires or holes of thermoelectric elements provided herein may be formed in a substrate and oriented substantially anti-parallel to a support structure, such as an electrode. In some examples, the wires or holes are oriented at an angle greater than 0°, or 10°, or 20°, or 30°, or 40°, or 50°, or 60°, or 70°, or 80°, or 85° in relation to the support structure. In an example, the wires or holes are oriented at an angle of about 90° in relation to the support structure. The electrode may be an electrode of a thermoelectric device. In some cases, wires or holes may be oriented substantially parallel to the electrode.

As an alternative to the devices of FIGS. 12-14, a thermoelectric device can have a thermoelectric element with an array of holes or wires with individual holes or wires that may have different sizes and/or distributions. An array of holes or wires may not be ordered and may not have a uniform distribution. In some examples, there is no long range order with respect to the holes or wires. In some cases, the holes or wires may intersect each other in random directions. The holes or wires may include intersecting holes or wires, such as secondary holes or wires that project from other holes or wires in various directions. The holes or wires may have various sizes and may be aligned along various directions, which may be random and not uniform. As another alternative, a thermoelectric device can include at least one thermoelectric element (p or n-type) with an order array of holes or wires, and at least one thermoelectric element (p or n-type) with a disordered array of holes or wires. The disordered array of holes or wires may include holes or wires that are not ordered and do not have a uniform distribution.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Methods for Forming Thermoelectric Elements

The present disclosure provides various methods for forming thermoelectric elements. A thermoelectric element can be formed using electrochemical etching. In some cases, a thermoelectric element is formed by cathodic or anodic etching, in some cases without the use of a catalyst. A thermoelectric element can be formed without use of a metallic catalysis. A thermoelectric element can be formed without providing a metallic coating on a surface of a substrate to be etched. This can also be performed using purely electrochemical anodic etching and suitable etch solutions and electrolytes. As an alternative, a thermoelectric can be formed using metal catalyzed electrochemical etching in suitable etch solutions and electrolytes, as described in, for example, PCT/US2012/047021, filed Jul. 17, 2012, PCT/US2013/021900, filed Jan. 17, 2013, PCT/US2013/055462, filed Aug. 16, 2013, PCT/US2013/067346, filed Oct. 29, 2013, each of which is entirely incorporated herein by reference.

Recognized herein are various benefits to not using catalysts to form thermoelectric elements. In an example, a non-metal catalyzed etch can preclude the need for metal (or metallic) catalysts, which can provide for fewer processing steps, including cleanup steps to remove the metal catalysts from the thermoelectric element after etching. This can also provide for reduced manufacturing cost, as metal catalysts can be expensive. Metal catalysts can include rare and/or expensive metallic materials (e.g., gold, silver, platinum, or palladium), and eliminating the use of a metallic catalyst can advantageously decrease the cost of forming thermoelectric elements. Additionally, the non-catalyzed process can be more reproducible and controllable. In some cases, the non-catalyzed process described herein can be scaled from a relatively small production scale of thermoelectric elements to a relatively larger production scale of thermoelectric elements.

The present disclosure provides methods for forming thermoelectric materials for use in various applications, such as consumer and industrial applications. In some examples, thermoelectric materials are used in consumer electronic devices (e.g., smart watches, portable electronic devices, and health/fitness tracking devices). As another example, a thermoelectric material of the present disclosure can be used in an industrial setting, such as at a location where there is heat loss, which heat can be captured and used to generate power.

The present disclosure provides methods for forming flexible or substantially flexible thermoelectric materials. A flexible material can be a material that bends at an angle of least about 1°, 5°, 10°, 15°, 20°, 25°, 30°, 35°, 40°, 45°, 50°, 60°, 70°, 80°, 90°, 100°, 120°, 130°, 140°, 150°, 160°, 170°, or 180° relative to a measurement plane without experiencing plastic deformation or breaking. The flexible material can bend under an applied force over a given area of the flexible material (i.e., pressure). Plastic deformation can be measured by, for example, three-point testing (e.g., instron extension) or tensile testing. As an alternative or in addition to, the flexible material can be a material that bends at an angle of least about 1°, 5°, 10°, 15°, 20°, 25°, 30°, 35°, 40°, 45°, 50°, 60°, 70°, 80°, 90°, 100°, 120°, 130°, 140°, 150°, 160°, 170°, or 180° relative to a measurement plane at a plastic deformation that is less than or equal to about 20%, 15%, 10%, 5%, 1%, or 0.1% as measured by three-point testing (e.g., instron extension) or tensile testing. A flexible material can be a substantially pliable material. A flexible material can be a material that can conform or mold to a surface. Such materials can be employed for use in various settings, such as consumer and industrial settings. Thermoelectric elements formed according to methods herein can be formed into various shapes and configurations. Such shapes can be changed as desired by a user, such as to conform to a given object. The thermoelectric elements can have a first shape, and after being formed into a shape or configuration the thermoelectric elements can have a second shape. The thermoelectric elements can be transformed from the second shape to the initial shape.

In an aspect of the present disclosure, a thermoelectric device (or material) is formed using anodic etching. Anodic etching can be performed in an electrochemical etch cell that provides electrical connections to the substrate being etched, one or more reservoirs to hold the etch solutions or electrolytes in contact with the substrate, and access for analytical measurements or monitoring of the etching process. The etch solutions and/or electrolytes can comprise an aqueous solution. The etch (or etching) solutions and/or electrolytes can be a basic, neutral, or acidic solution. Examples of etching solutions include acids, such as hydrofluoric acid (HF), hydrochloric acid (HCl), hydrogen bromide (HBr), hydrogen iodide (HI), or combinations thereof. The etch solutions and/or electrolytes can be an electrically conductive solution. In an example, the etch cell includes a top reservoir that contains a solution comprising an electrolyte. The top reservoir can be situated adjacent to (e.g., on top of) a substrate to be etched. The substrate to be etched can be substantially free of one or more metallic material, which may be catalytic materials. The substrate to be etched may be free of a metallic coating. In some examples, the substrate to be etched has a metal content (e.g., on a surface of the substrate) that is less than about 25%, 20%, 15%, 10%, 5%, 1%, 0.1%, 0.01%, 0.001%, 0.0001%, 0.00001%, or 000001%, as measured by x-ray photoelectron spectroscopy (XPS).

An etching solution can include an acid (e.g., HF) or a concentration of acids (taken as a weight percentage) that is less than or equal to about 70%, 60%, 50%, 40%, 30%, 20% or 10% (by weight), in some cases greater than or equal to about 1%, 10%, 20%, or 30%. In some examples, the concentration (by weight) is from about 1% to 60%, or 10% to 50%, or 20% to 45%. The balance of the etching solution can include a solvent (e.g., water) and an additive, such as an alcohol, carboxylic acid, ketone and/or aldehyde. In some examples, the additive is an alcohol, such as methanol, ethanol, isopropanol, or a combination thereof. The additive can enable the user of lower current densities while forming nanostructures (e.g., holes) with properties that are suitable for use in thermoelectric elements of the present disclosure, such as a substantially uniform distribution of holes having a disordered pattern. The additive can enable the user of lower current densities while forming nanostructures (e.g., holes) with properties that are suitable for use in thermoelectric elements of the present disclosure, such as increased control of the spacing between two or more holes. The additive can enable the user of lower current densities while forming nanostructures (e.g., holes) with properties that are suitable for use in thermoelectric elements of the present disclosure, such as spacing between two or more holes of at most about 5 nm. The additive can enable the use of lower current densities while forming nanostructures (e.g., holes) with properties that are suitable for use in thermoelectric elements of the present disclosure, such as spacing between two or more holes of at most about 20 nm. The additive can enable the use of lower current densities while forming nanostructures (e.g., holes) with properties that are suitable for use in thermoelectric elements of the present disclosure, such as spacing between two or more holes of at most about 100 nm.

Electric current can be sourced to and/or through the substrate using an edge or backside contact, through the solution/electrolyte, and into a counter electrode. The counter electrode can be in electrical communication with the top reservoir, in some cases situated in the top reservoir. In some cases, the counter electrode is adjacent to or in contact with a top side of the substrate. The body of the etch cell can be fabricated from materials inert to the etch solution or electrolyte (e.g., PTFE, PFA, polypropylene, HDPE). The edge or backside contact can include a metal contact on the substrate, or it can be a liquid contact using a suitable electrolyte. The counter electrode can include a wire or mesh constructed from a suitable electrode material. The etch cell can contain mechanical paddles or ultrasonic agitators to maintain solution motion, or the entire cell may be spun, rotated or shaken. In some examples, agitating the solution before and/or during etching can provide for improved etching uniformity. This can enable the electrolyte to be circulated during etching. In another example, the etch cell can contain one or more recirculating reservoirs and etch chambers, with one or more solutions/electrolytes.

In an example, an unpatterned substrate is loaded into reaction space provided with up to five or more electrode connections. One of the electrodes is in ohmic contact with the substrate backside (the working electrode) and is isolated from an etchant electrolyte. One of the electrodes can be in ohmic contact with the substrate backside (the working electrode) and may not be in contact with an etchant electrolyte. Another electrode (the counter electrode) can be submerged in the electrolyte but not in direct contact with the substrate, and used to supply current through the electrolyte to the substrate working electrode. Another electrode (the reference electrode) is immersed in the electrolyte and isolated from both the working and counter electrodes, in some cases using a frit, and used to sense the operating potential of the etch cell using a known or predetermined reference standard. Another two or more electrodes may be placed outside the reaction space in order to set up an external electric field. In some cases, at least two electrodes—a working electrode and a counter electrode—are required.

The reaction space can be used in a number of ways. In one approach, the reaction space can be used in a two-electrode configuration by passing an anodic current via the substrate backside through a suitable electrolyte. The electrolyte can be, for example, a liquid mixture containing a diluent, such as water, or a fluoride-containing reagent, such as hydrofluoric acid, or an oxidizer, such as hydrogen peroxide. The electrolyte can include surfactants and/or modifying agents. The working potential can be sensed during anodization using the counter electrode in a three-electrode configuration. The anodization can be performed in the presence of a DC or AC external field using the electrodes placed outside the reaction space.

In anodic etching, a voltage/current assisted etch of a semiconductor can result in etching of the semiconductor at a rate dependent on the voltage/current. The etch rate, etch depth, etch morphology, pore density, pore structure, internal surface area and surface roughness can be controlled by the voltage/current, etch solution/electrolyte composition and other additives, pressure/temperature, front/backside illumination, and stirring/agitation. They can also be controlled by the crystal orientation, dopant type, resistivity (doping concentration), and growth process (e.g., float-zone or Czochralski) of the semiconductor. The resistivity of the semiconductor can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the semiconductor is from about 0.001 ohm-cm to 1 ohm-cm, 0.001 ohm-cm to 0.5 ohm-cm, or 0.001 ohm-cm to 0.1 ohm-cm.

During etching of a semiconductor substrate using voltage/current control, a potential or bias (e.g., direct current bias) is applied to the substrate using an underlying electrode. This can result in the semiconductor substrate being etched. As a result of anodic etching, the semiconductor's thermal conductivity can drop significantly. In some examples, by employing an applied bias, the porosity (mass loss) can be controlled and tuned and therefore the thermal and electrical properties can be controlled. In other examples, by employing a specific etch solution/electrolyte composition and/or additives the porosity can be controlled. In yet other examples, by employing any number of variables already listed, the porosity can be controlled.

In some cases, the semiconductor substrate is unpatterned and in some cases it is patterned. In an unpatterned etch, the substrate is etched directly in the cell. In a patterned etch, a blocking layer that prevents etching can first be placed over the semiconductor, and then removed in specific locations. This layer may be formed in any manner suitable (e.g., chemical vapor deposition, spin-coating, oxidation) and then be removed in a subsequent step in desired locations (e.g., plasma etching, reactive ion etching, sputtering) using a suitable mask (e.g., photolithography). Alternatively, a blocking layer can be deposited directly (e.g., dip pen lithography, inkjet printing, spray coating through a stencil).

Subsequently, a negative replica of the pattern in the blocking layer is transferred into the substrate during the anodic etch.

The etch can be performed by applying an electrical potential ("potential") to the semiconductor substrate, in the presence of a suitable etch solution/electrolyte. The potential can be, for example, at least about +0.01 V, +0.02 V, +0.03 V, +0.04 V, +0.05 V, +0.06 V, +0.07 V, +0.08 V, +0.09 V, +0.1 V, +0.2 V, +0.3 V, +0.4 V, +0.5 V, +0.6 V, +0.7 V, +0.8 V, +0.9 V, +1.0 V, +2.0 V, +3.0 V, +4.0 V, +5.0 V, +10 V, +20 V, +30 V, +40 V, or +50 V relative to a reference, such as ground. In some examples, the potential is from about +0.01 V to +20 V, +0.1 V to +10 V, or +0.5 V to +5 V relative to a reference. In some examples, the potential can range from about +0.01 V to +0.05 V, +0.06 V to +0.1 V, +0.2 V to +0.5 V, +0.6 V to +1.0 V, +2.0 V to +5.0 V, +10 V to +20 V, +20V to +30 V, +30V to +40 V, or +40V to +50. In some examples, the potential is from about +0.5 V to +5 V or from about +1 V to +5 V.

The etch can be performed by applying or generating an electrical current ("current") to or through the semiconductor substrate, in some cases in the presence of a suitable etch solution/electrolyte. The current can be applied to the substrate upon the application of the potential to the substrate. The current can have a current density, for example, of at least about +0.01 milliamps per square centimeter (mA/cm$^2$), +0.1 mA/cm$^2$, +0.2 mA/cm$^2$, +0.3 mA/cm$^2$, +0.4 mA/cm$^2$, +0.5 mA/cm$^2$, +0.6 mA/cm$^2$, +0.7 mA/cm$^2$, +0.8 mA/cm$^2$, +0.9 mA/cm$^2$, +1.0 mA/cm$^2$, +2.0 mA/cm$^2$, +3.0 mA/cm$^2$, +4.0 mA/cm$^2$, +5.0 mA/cm$^2$, +6.0 mA/cm$^2$, +7.0 mA/cm$^2$, +8.0 mA/cm$^2$, +9.0 mA/cm$^2$, +10 mA/cm$^2$, +20 mA/cm$^2$, +30 mA/cm$^2$, +40 mA/cm$^2$, +50 mA/cm$^2$, +60 mA/cm$^2$, +70 mA/cm$^2$, +80 mA/cm$^2$, +90 mA/cm$^2$, +100 mA/cm$^2$, +200 mA/cm$^2$, +300 mA/cm$^2$, +400 mA/cm$^2$, +500 mA/cm$^2$, +600 mA/cm$^2$, +700 mA/cm$^2$, +800 mA/cm$^2$, +900 mA/cm$^2$, +1000 mA/cm$^2$, or more. In some examples, the current density ranges from about 0.01 mA/cm$^2$ to 20 mA/cm$^2$, 0.05 mA/cm$^2$ to 10 mA/cm$^2$, or 0.01 mA/cm$^2$ to 5 mA/cm$^2$. In some examples, the current density ranges from about +0.1 mA/cm$^2$ to +0.5 mA/cm$^2$, +0.6 to +1.0 mA/cm$^2$, +1.0 mA/cm$^2$ to +5.0 mA/cm$^2$, +5.0 mA/cm$^2$ to +10 mA/cm$^2$, +10 mA/cm$^2$ to +20 mA/cm$^2$, +20 mA/cm$^2$ to +30 mA/cm$^2$, +30 mA/cm$^2$ to +40 mA/cm$^2$, +40 mA/cm$^2$ to +50 mA/cm$^2$, +50 mA/cm$^2$ to +60 mA/cm$^2$, +60 mA/cm$^2$ to +70 mA/cm$^2$, +70 mA/cm$^2$ to +80 mA/cm$^2$, +80 mA/cm$^2$ to +90 mA/cm$^2$, +90 mA/cm$^2$ to +100 mA/cm$^2$, +10 mA/cm$^2$ to +200 mA/cm$^2$, +20 mA/cm$^2$ to +300 mA/cm$^2$, +300 mA/cm$^2$ to +400 mA/cm$^2$, +40 mA/cm$^2$ to +500 mA/cm$^2$, +500 mA/cm$^2$ to +600 mA/cm$^2$, +600 mA/cm$^2$ to +700 mA/cm$^2$, +700 mA/cm$^2$ to +800 mA/cm$^2$, +800 mA/cm$^2$ to +900 mA/cm$^2$, or +900 mA/cm$^2$ to +1000 mA/cm$^2$. In some examples, the current density is from about 1 mA/cm$^2$ to 30 mA/cm$^2$, 5 mA/cm$^2$ to 25 mA/cm$^2$, or 10 mA/cm$^2$ to 20 mA/cm$^2$. Such current densities may be achieved with potential provided herein, such as a potential from about +0.5 V to +5 V or from about +1 V to +5 V.

The electrical potential (or voltage) can be measured using a voltmeter, for instance. The voltmeter can be in parallel with the substrate. For example, the voltmeter can be measure the electrical potential between two sides of the substrate, or the electrical potential between a working electrode and counter electrode in solution. The current density can be measured using an ammeter. The ammeter can be in series with a power source and the substrate. For example, the ammeter can be coupled to a backside of the substrate.

Thermoelectric elements of the present disclosure can be formed at an etching time that is selected to provide an array of nanostructures (e.g., holes or wires). Etching times can range from 1 second to 2 days, 1 minute to 1 day, 1 minute to 12 hours, 10 minutes to 6 hours, or 30 minutes to 3 hours. In some examples, the etching time is from 30 minutes to 6 hours, or 1 hour to 6 hours. In some cases, etching times can be at least about 1 second, 10 seconds, 30 seconds, 1 minute, 2 minutes, 3 minutes, 4 minutes, 5 minutes, 10 minutes, 30 minutes, 1 hour, 2 hours, 3 hours, 4 hours, 5 hours, 6 hours, 12 hours, 1 day, or more. Such etching times can be used in combination with applied voltage and/or current of the present disclosure.

In some cases, the bias applied to the semiconductor substrate can be changed during etching to regulate the etch rate, etch depth, etch morphology, pore density, pore structure, internal surface area and surface roughness of the semiconductor substrate, including the density and location of nanostructuring in the semiconductor substrate. In another case, the etch solution/electrolyte composition and/or additives can be changed during etching. In yet other cases, the pressure/temperature or illumination or stirring/agitation can be changed. Alternatively, more than one of these variables may be changed simultaneously to obtain the desired etch characteristics.

During the period in which the substrate is etched, the electrical potential can be constant, varied or pulsed. In an example, the electrical potential is constant during the etching period. In another example, the electrical potential is pulsed on and off, or from positive to negative, during the etching period. In another example, the electrical potential is varied during the etching period, such as varied gradually from a first value to a second value, which second value can be less than or greater than the first value. The electrical potential can then be varied from the second value to the first value, and so on. In yet another example, the bias/current may be oscillated according to a sinusoidal/triangular/arbitrary waveform. In some cases, the bias/current can be pulsed with a frequency of at least about 1 Hz, 10 Hz, 1000 Hz, 5000 Hz, 10000 Hz, 50000 Hz, or 100000 Hz.

The bias and/or current can be DC or AC, or a combination of DC and AC. Use of an AC bias and/or current with DC offset can provide control over the etch rate using the DC bias/current and control over ions using the AC bias/current. The AC bias/current can alternately enhance and retard the etch rate, or increase/decrease the porosity/surface roughness, or modify the morphology and structure in a periodic or non-periodic fashion. The amplitude and frequency of the AC bias/current can be used to tune the etch rate, etch depth, etch morphology, pore density, pore structure, internal surface area and surface roughness.

In some situations, the application of an electrical potential to a semiconductor substrate during etching can provide for a given etch rate. In some examples, the substrate can be etched at a rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 60 nm/s, 70 nm/s, 80 nm/s, 90 nm/s, 100 nm/s, 200 nm/s, 300 nm/s, 400 nm/s, 500 nm/s, 600 nm/s, 700 nm/s, 800 nm/s, 900 nm/s, 1000 nm/s, or 10,000 nm/s at 25° C. In other cases, the etch rate may be increased/decreased with a change in pressure/temperature, solution/electrolyte composition and/or additives, illumination, stirring/agitation.

The porosity of a semiconductor substrate during etching using an applied potential or current density can provide a substrate with a porosity (mass loss) that can provide a thermoelectric element that is suitable for various applications. In some examples, the porosity is at least about 0.01%, 0.1%, 1%, 5%, 10%, 20%, 30%, 40%, 50%, 60%, or more. The porosity can be from about 0.01% to 99.99%, 0.1% to 60%, or 1% to 50%.

A substrate can have a thickness that is selected to yield a thermoelectric element that is suitable for various applications. The thickness can be at least about 100 nanometers (nm), 500 nm, 1 micrometer (micron), 5 microns, 10 microns, 100 microns, 500 microns, 1 millimeter (mm), or 10 mm. In some examples, the thickness is from about 500 nm to 1 mm, 1 micron to 0.5 mm, or 10 microns to 0.5 mm.

The etch may be performed to completion through the entire thickness of the substrate, or it may be stopped at any depth. A complete etch yields a self-supporting nanostructured material with no underlying unetched substrate. An incomplete etch yields a layer of nanostructured material over underlying unetched substrate. The nanostructured layer may have a thickness at least about 10 nanometers (nm), 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 micrometers (µm), 2 µm, 3 µm, 4 µm, 5 µm, 6 µm, 7 µm, 8 µm, 9 µm, 10 µm, 20 µm, 30 µm, 40 µm, 50 µm, 60 µm, 70 µm, 80 µm, 90 µm, 100 µm, 200 µm, 300 µm, 400 µm, 500 µm, 600 µm, 700 µm, 800 µm, 900 µm, 1 millimeters (mm), 2 millimeters (mm), 3 millimeters (mm), 4 millimeters (mm), 5 millimeters (mm), 6 millimeters (mm), 7 millimeters (mm), 8 millimeters (mm), 9 millimeters (mm), 10 millimeters (mm), or more.

The nanostructured layer may be left on the substrate, or it may be separated from the substrate in a number of ways. The layer may be mechanically separated from the substrate (e.g., using a diamond saw, scribing and cleaving, laser cutting, peeling off). Alternatively, the layer can be separated from the substrate by effecting electropolishing conditions at the etching front at the base of the layer. These conditions can be achieved by a change in pressure, change in temperature, change in solution composition, change in electrolyte composition, use of additives, illumination, stirring, and/or agitation, or by waiting a sufficient duration of time (e.g., more than about 1 day). In some cases, a partial or incomplete separation may be desired, such that the layer is still weakly attached to the substrate. This can be achieved by varying between normal etching conditions and electropolishing. Complete separation can then be achieved in a subsequent step.

After etching, the material may be chemically modified to yield functionally active or passive surfaces. For example, the material may be modified to yield chemically passive surfaces, or electronically passive surfaces, or biologically passive surfaces, or thermally stable surfaces, or a combination of the above. This can be accomplished using a variety of methods, e.g., thermal oxidation, thermal silanation, thermal carbonization, hydrosilylation, Grignard reagents, electrografting. In some cases, one or more of the above methods may be used to obtain a surface with the desired or otherwise predetermined combination of properties.

After modification, the voids in the material may also be fully or partially impregnated with a filling material. For example, the filling material may be electrically conductive, or thermally insulating, or mechanically strengthening, or a combination of the above. Suitable filling materials may include one or more of the following groups: insulators, semiconductors, semimetals, metals, polymers, gases, or vacuum. Filling can be accomplished using a variety of methods, e.g., atomic layer deposition, chemical vapor deposition, deposition from chemical bath or polymerization bath, electrochemical deposition, drop casting or spin coating or immersion followed by evaporation of a solvated filling material. In some cases, one or more of the above methods may be used to obtain filling materials with the desired combination of properties.

After filling, the material may also be sealed with a capping material. For example, the capping material may be impermeable to gases, or liquids, or both. Suitable filling materials may include one or more of the following groups: insulators, semiconductors, semimetals, metals or polymers. Capping can be accomplished using a variety of methods, e.g., atomic layer deposition, chemical vapor deposition, deposition from chemical bath or polymerization bath, electrochemical deposition, drop casting or spin coating or immersion followed by evaporation of a solvated filling material. In some cases, one or more of the above methods may be used to obtain capping materials with the desired or predetermined combination of properties.

After etching, the material can be washed with a suitable rinsing solution (e.g., water, methanol, ethanol, isopropanol, toluene, hexanes etc.) and dried (e.g., blow drying, evaporative drying, oven/furnace drying, vacuum drying, critical point drying, or air drying). The rinsing solution can be selected depending on the mode of drying.

After anodic etching, the thermal and electrical properties of the semiconductor may be further controlled or tuned by coarsening or annealing the semiconductor nanostructure (pore or hole morphology, density, structure, internal surface area and surface roughness) through the application of heat and time. Temperatures between about 50° C. and 1500° C., or 100° C. and 1300° C. for a time period from about 1 second to 1 week can be utilized to control the thermal and electrical properties of the semiconductor. In some cases, the time period is at least about 1 second, 10 seconds, 30 seconds, 1 minute, 2 minutes, 3 minutes, 4 minutes, 5 minutes, 10 minutes, 30 minutes, 1 hour, 2 hours, 3 hours, 4 hours, 5 hours, 6 hours, 12 hours, 1 day, or more. The annealing may be performed in vacuum (e.g., at a pressure that is from about $1 \times 10^{-10}$ Torr to less than 760 Torr) or in the presence of a suitable gas (e.g., helium, neon, argon, xenon, hydrogen, nitrogen, forming gas, carbon monoxide, carbon dioxide, oxygen, water vapor, air, methane, ethane, propane, sulfur hexafluoride and mixtures thereof). The gas can be an inert gas. Annealing can be performed on partially or completely etched substrates, completely separated etched layers on unetched substrates, partially separated etched layers on unetched substrates, or unseparated etched layers on unetched substrates. In some cases, when layers on unetched substrates are annealed, the semiconductor coarsening may proceed in such a fashion as to separate the layers from the unetched substrate. This can be convenient for effecting layer separation.

Electrical contacts may be deposited on or adjacent to the nanostructured material using standard deposition techniques (e.g., silk-screening, inkjet deposition, painting, spraying, dip-coating, soldering, metal sputtering, metal evaporation). The electrical contacts may be metal contacts (e.g., gold, silver, copper, aluminum, indium, gallium, lead-containing solder, lead-free solder or combinations thereof) with/without suitable adhesion layers (e.g., titanium, chromium, nickel or combinations thereof). Alternatively, the electrical contacts may be silicide contacts (e.g., titanium silicide, cobalt silicide, nickel silicide, palladium silicide, platinum silicide, tungsten silicide, molybdenum silicide etc.). Barrier layers (e.g., platinum, palladium, tungsten nitride, titanium nitride, molybdenum nitride etc.) may be inserted to prevent inter-diffusion between the silicon and the contact, or between contact layers, or between every layer. In other examples, the electrical contacts may be combinations of both metal and silicide contacts. A silicide contact can be provided to reduce contact resistance between a metal contact and the substrate. Examples of silicides include tungsten silicide, titanium disilicide and nickel silicide. A subsequent annealing step may be used to form the contact and improve its properties. For example annealing can reduce contact resistance, which can provide an ohmic contact.

After electrical contacts have been formed, the material can be assembled into a thermoelectric device comprising of p- and n-type thermoelectric elements (or legs). A thermoelectric device can include p- and n-legs connected electrically in series, and thermally in parallel with each other. The thermoelectric device can be built upon electrically insulating and thermally conductive rigid plates (e.g., aluminum nitride, aluminum oxide, silicon carbide, silicon nitride etc.) with electrical connections between the legs provided by metal interconnects (e.g., copper, aluminum, gold, silver etc.). In another example, the thermoelectric material may be assembled on a flexible insulating material (e.g., polyimide, polyethylene, polycarbonate etc.). Electrical connections between the legs are provided via metal interconnects integrated on the flexible material. The resulting thermoelectric may be in sheet, roll or tape form. Desired sizes of thermoelectric material may be cut out from the sheet, roll or tape and assembled into devices.

Processing conditions (e.g., applied voltages and current densities) provided herein have various unexpected benefits, such as the formation of nanostructures (e.g., holes) having orientations and configurations that provide thermoelectric elements and devices of the present disclosure with enhanced or otherwise improved properties, such as a thermoelectric element with a ZT from about 0.01 to 3, 0.1 to 2.5, 0.5 to 2.0 or 0.5 to 1.5 at 25° C. Such processing conditions can provide for the formation of an array of nanostructures in a substrate. The array of nanostructures can have a disordered pattern. Such processing conditions can provide for the formation of flexible thermoelectric elements or devices.

Figure 15:
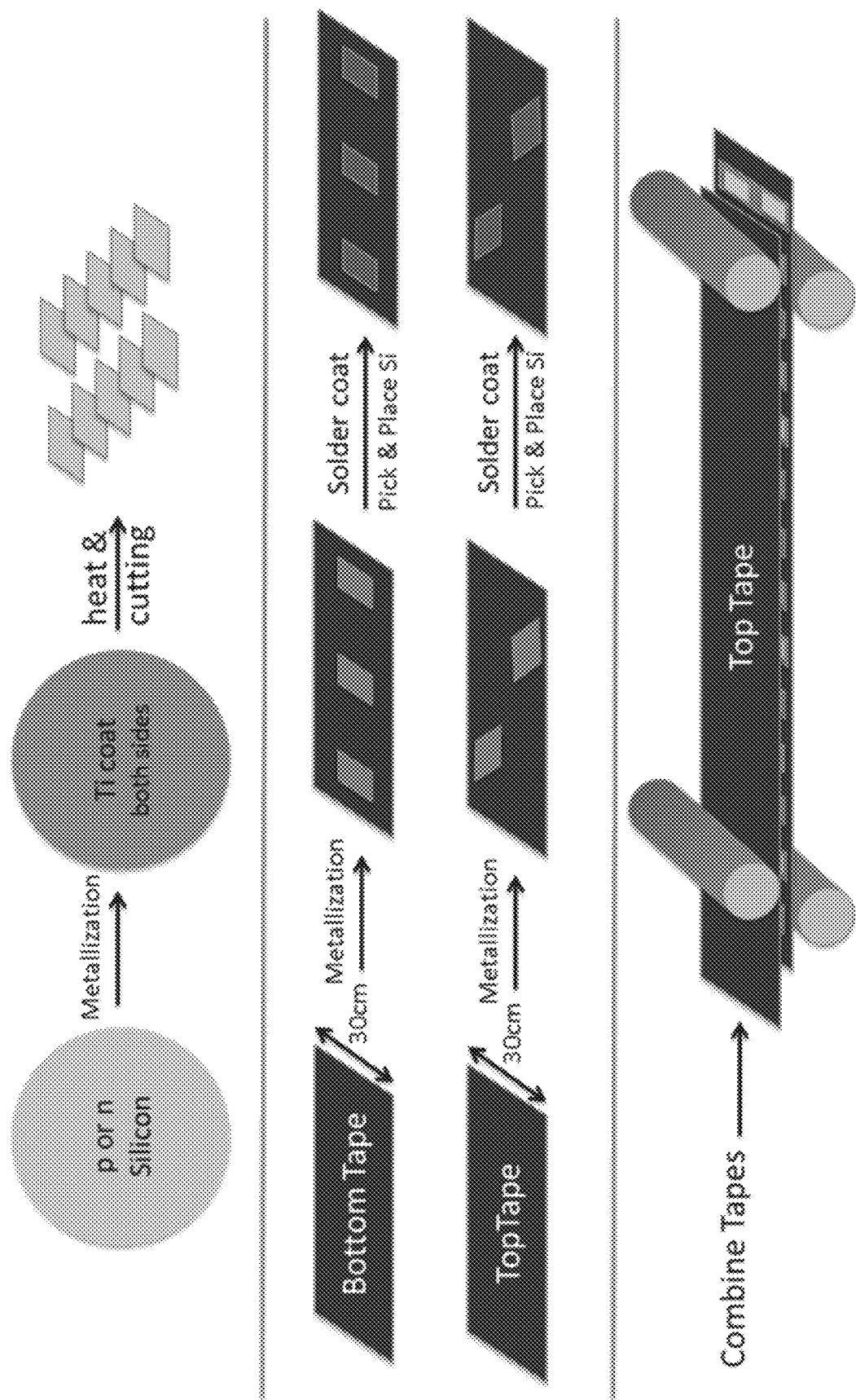
FIG. 15 schematically illustrates a method for manufacturing a flexible thermoelectric device comprising a plurality of thermoelectric elements.

FIG. 15 schematically illustrates a method for manufacturing a flexible thermoelectric device comprising a plurality of thermoelectric elements. A p-type or n-type silicon substrate that has been processed using, for example, a non-catalytic approach described elsewhere herein (e.g., anodic etching) is coated on both sides with a suitable contact material, such as titanium, nickel, chromium, tungsten, aluminum, gold, platinum, palladium, or any combination thereof. The substrate is then heated to a temperature of at least about 250° C., 300° C., 350° C., 400° C., 450° C., 500° C., 550° C., 600° C., 650° C., 700° C., 750° C., 800° C., 850° C., 900° C., 950° C., or 1000° C., and cut into multiple pieces using, for example, a diamond cutter, wire saw, or laser cutter.

Next, in a metallization operation, individual pieces of the cut substrate are placed on bottom and top tapes having widths of about 30 centimeters (cm). The tapes can be formed of a polymeric material, such as, for example, polyimide, polycarbonate, polyethylene, polypropylene, or copolymers, mixtures and composites of these and other polymers.

Next, the individual pieces are subjected to solder coating to form serial connections to the individual pieces across a given tape. The tapes are then combined through one or more rollers (two rollers are illustrated). A thermally conductive adhesive can be provided around the tables to help seal the individual pieces between the tapes.

Thermoelectric elements, devices and systems formed according to methods provided herein can have various physical characteristics. The performance of a thermoelectric device of the disclosure may be related to the properties and characteristics of holes and/or wires of thermoelectric elements. In some cases, optimum device performance may be achieved for an element having holes or wires, an individual hole or wire having a surface roughness between about 0.1 nm and 50 nm, or 1 nm and 20 nm, or 1 nm and 10 nm, as measured by transmission electron microscopy (TEM). In some cases, a thermoelectric element may have a residual metal content that is less than or equal to about 0.000001%, 0.00001%, 0.0001%, 0.001%, 0.01%, 0.1%, 1%, 5%, 10%, 15%, 20%, or 25%, as measured by x-ray photoelectron spectroscopy (XPS).

A thermoelectric element of the present disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Thermoelectric elements, devices and systems of the present disclosure can be employed for use in various settings or employed for various uses. Settings can include, without limitation, healthcare, consumer, and industrial settings. Such uses include, without limitation, flexible thermoelectric tape with flexible heat sinks, wearable electronic devices powered by body heat, waste heat recovery units for generating power (e.g., waste heat recovery unit in a vehicle or chemical plant).

Heat sink can aid in collecting or dissipating heat. A heat sink can include one or more heat fins which can be sized and arranged to provide increase heat transfer area.

Computer Control Systems

Figure 16:
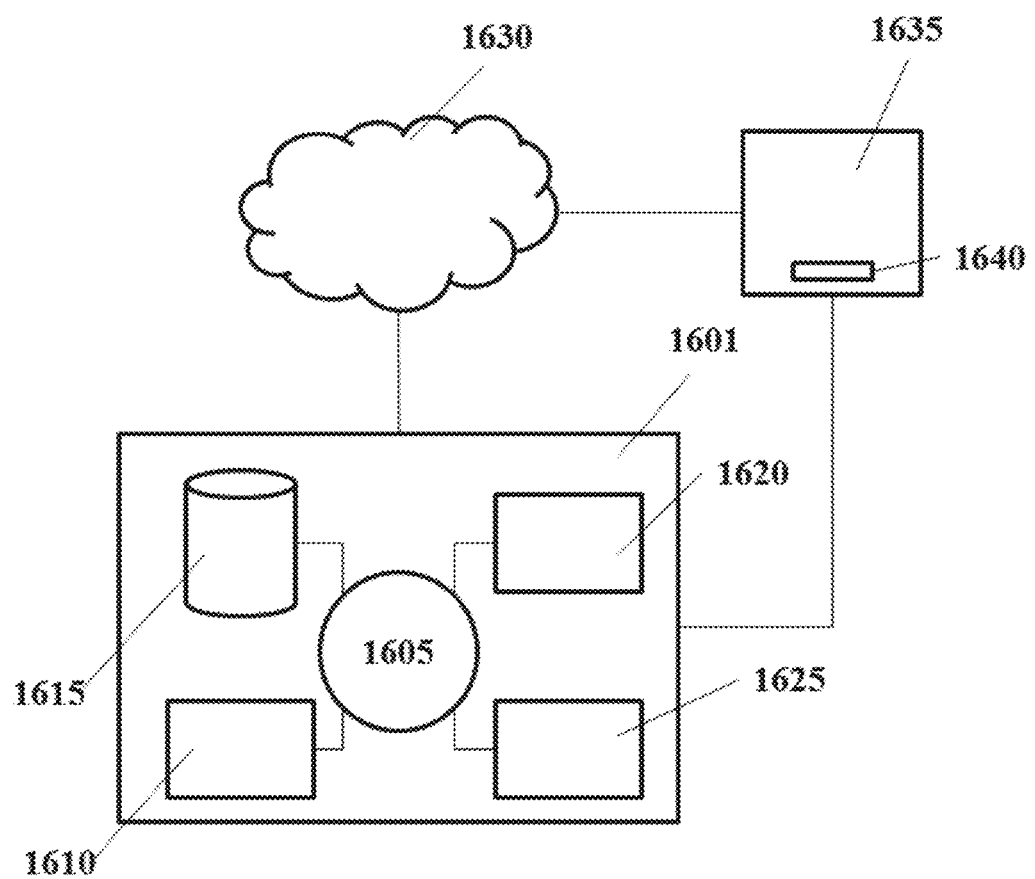
FIG. 16 shows a computer system that is programmed or otherwise configured to implement methods and systems of the present disclosure, such as facilitating the formation of thermoelectric devices of the present disclosure.

The present disclosure provides computer control systems that are programmed or otherwise configured to implement various devices, methods and systems of the present disclosure. FIG. 16 shows a computer system (also "system" herein) 1601 programmed or otherwise configured to facilitate the formation of thermoelectric devices of the present disclosure. The system 1601 can be programmed or otherwise configured to implement methods described herein. The system 1601 includes a central processing unit (CPU, also "processor" and "computer processor" herein) 1605, which can be a single core or multi core processor, or a plurality of processors for parallel processing. The system 1601 also includes memory 1610 (e.g., random-access memory, read-only memory, flash memory), electronic storage unit 1615 (e.g., hard disk), communications interface 1620 (e.g., network adapter) for communicating with one or more other systems, and peripheral devices 1625, such as cache, other memory, data storage and/or electronic display adapters. The memory 1610, storage unit 1615, interface 1620 and peripheral devices 1625 are in communication with the CPU 1605 through a communications bus (solid lines), such as a motherboard. The storage unit 1615 can be a data storage unit (or data repository) for storing data. The system 1601 is operatively coupled to a computer network ("network") 1630 with the aid of the communications interface 1620. The network 1630 can be the Internet, an internet and/or extranet, or an intranet and/or extranet that is in communication with the Internet. The network 1630 in some cases is a telecommunication and/or data network. The network 1630 can include one or more computer servers, which can enable distributed computing, such as cloud computing. The network 1630 in some cases, with the aid of the system 1601, can implement a peer-to-peer network, which may enable devices coupled to the system 1601 to behave as a client or a server.

The system 1601 is in communication with a processing system 1635 for forming thermoelectric elements and devices of the disclosure. The processing system 1635 can be configured to implement various operations to form thermoelectric devices provided herein, such as forming thermoelectric elements and forming thermoelectric devices (e.g., thermoelectric tape) from the thermoelectric elements. The processing system 1635 can be in communication with the system 1601 through the network 1630, or by direct (e.g., wired, wireless) connection. In an example, the processing system 1635 is an electrochemical etching system. In another example, the processing system 1635 is a dry box.

The processing system 1635 can include a reaction space for forming a thermoelectric element from the substrate 1640. The reaction space can be filled with an electrolyte and include electrodes for etching (e.g., cathodic or anodic etching).

Methods as described herein can be implemented by way of machine (or computer processor) executable code (or software) stored on an electronic storage location of the system 1601, such as, for example, on the memory 1610 or electronic storage unit 1615. During use, the code can be executed by the processor 1605. In some examples, the code can be retrieved from the storage unit 1615 and stored on the memory 1610 for ready access by the processor 1605. In some situations, the electronic storage unit 1615 can be precluded, and machine-executable instructions are stored on memory 1610.

The code can be pre-compiled and configured for use with a machine have a processer adapted to execute the code, or can be compiled during runtime. The code can be supplied in a programming language that can be selected to enable the code to execute in a pre-compiled or as-compiled fashion.

Aspects of the systems and methods provided herein, such as the system 1601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

Methods described herein can be automated with the aid of computer systems having storage locations with machine-executable code implementing the methods provided herein, and a processor for executing the machine-executable code.

Devices, systems and methods provided herein may be combined with or modified by other devices, systems and methods, such as devices, systems and/or methods described in U.S. Pat. No. 7,309,830 to Zhang et al., U.S. Patent Publication No. 2006/0032526 to Fukutani et al. U.S. Patent Publication No. 2009/0020148 to Boukai et al., U.S. Patent Publication No. 2013/0019918 to Boukai et al., U.S. Patent Publication No. 2015/0280099, U.S. Patent Publication No. 2016/0197259, PCT/US2012/047021, filed Jul. 17, 2012, PCT/US2013/021900, filed Jan. 17, 2013, PCT/US2013/055462, filed Aug. 25, 2013, PCT/US2013/067346, filed Oct. 29, 2013, and PCT/US16/64501, filed Dec. 1, 2016, each of which is entirely incorporated herein by reference.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A wearable electronic device, comprising:
   an electronic display; and
   a power management unit operatively coupled to said electronic display, said power management unit comprising:
   one or more solar cells configured to generate power upon exposure to light;
   a thermoelectric device comprising (i) a heat collecting unit configured to collect thermal energy from a body surface of a user, (ii) a heat sink in thermal communication with said heat collecting unit, and (iii) a thermoelectric power generator disposed between said heat collecting unit and said heat sink, wherein said thermoelectric power generator is configured to generate power upon flow of at least a portion of said thermal energy from said heat collecting unit to said heat sink; and
   an energy storage device configured to store power generated by said one or more solar cells or said thermoelectric power generator when said power is not used to power said electronic display.

2. The wearable electronic device of claim 1, further comprising a casing containing said electronic display and said power management unit.

3. The wearable electronic device of claim 2, wherein said casing is in thermal communication with said heat collecting unit, said heat sink, or both.

4. The wearable electronic device of claim 2, wherein said heat sink is disposed adjacent to a side portion of said casing.

5. The wearable electronic device of claim 2, wherein one or more vents are disposed in a side portion of said casing, wherein said one or more vents are configured to expel thermal energy from said heat sink.

6. The wearable electronic device of claim 2, wherein said casing comprises one or more lugs in thermal communication with said heat sink, and wherein said one or more lugs are configured to dissipate heat.

7. The wearable electronic device of claim 2, wherein said casing comprises a bottom subassembly, wherein said bottom subassembly comprises a conductive backing, and wherein said conductive backing is configured to be in thermal communication with said body surface of said user when said wearable electronic device is in use.

8. The wearable electronic device of claim 7, wherein said bottom subassembly comprises threads, wherein said bottom subassembly threads into said casing, and wherein said threads are thermally conductive.

9. The wearable electronic device of claim 2, wherein said solar cells are disposed in a top surface of said casing.

10. The wearable electronic device of claim 2, wherein said casing comprises a case top.

11. The wearable electronic device of claim 10, wherein said case top comprises said heat sink.

12. The wearable electronic device of claim 1, wherein said wearable electronic device is a watch.

13. The wearable electronic device of claim 12, wherein said watch comprises a face, and wherein said one or more solar cells are disposed in said face.

14. The wearable electronic device of claim 12, further comprising a band that comprises an additional thermoelectric power generator.

15. The wearable electronic device of claim 1, wherein said power management unit provides at least about 10% of a power requirement of said wearable electronic device.

16. The wearable electronic device of claim 1, wherein said electronic display is a capacitive touch screen.

17. The wearable electronic device of claim 1, wherein said wearable electronic device is configured to be charged by an external power source.

18. The wearable electronic device of claim 1, wherein said thermoelectric power generator comprises a plurality of thermoelectric elements.

19. The wearable electronic device of claim 18, wherein a thermoelectric element of said plurality of thermoelectric elements comprises a semiconductor substrate.

20. The wearable electronic device of claim 19, wherein said semiconductor substrate includes pores.

21. The wearable electronic device of claim 20, wherein said pores are disordered.

22. The wearable electronic device of claim 20, wherein said pores have a non-uniform distribution throughout said semiconductor substrate.

23. The wearable electronic device of claim 18, wherein said plurality of thermoelectric elements comprises an n-type thermoelectric element in series with a p-type thermoelectric element.

24. The wearable electronic device of claim 1, further comprising an insulator spacer between said heat collecting unit and said heat sink.

25. The wearable electronic device of claim 24, wherein said insulator spacer is disposed in voids around said thermoelectric power generator.

26. The wearable electronic device of claim 1, further comprising an insulating ring that circumscribes said thermoelectric power generator.

27. A method for using a wearable electronic device, comprising:
   activating said wearable electronic device comprising:
      an electronic display; and
      a power management unit operatively coupled to said electronic display, said power management unit comprising:
      one or more solar cells configured to generate power upon exposure to light;
      a thermoelectric device comprising (i) a heat collecting unit configured to collect thermal energy from a body surface of a user, (ii) a heat sink in thermal communication with said heat collecting unit, and (iii) a thermoelectric power generator disposed between said heat collecting unit and said heat sink, wherein said thermoelectric power generator is configured to generate power upon flow of at least a portion of said thermal energy from said heat collecting unit to said heat sink; and
      an energy storage device configured to store power generated by said one or more solar cells or said thermoelectric power generator when said power is not used to power said electronic display.

28. The method of claim 27, wherein the wearable electronic device comprises a casing containing said electronic display and said power management unit.

29. The method of claim 28, wherein said wearable electronic device further comprises one or more vents disposed in a side portion of said casing, wherein said one or more vents are configured to expel thermal energy from said heat sink.

30. The method of claim 28, wherein said one or more solar cells are disposed in a top surface of said casing.

31. The method of claim 27, wherein said wearable electronic device is a watch.

32. A method of manufacturing a wearable electronic device, comprising assembling (i) an electronic display and (ii) a power management unit operatively coupled to said electronic display to yield said wearable electronic device,
wherein said power management unit comprises:
one or more solar cells configured to generate power upon exposure to light,
a thermoelectric device comprising (i) a heat collecting unit configured to collect thermal energy from a body surface of a user, (ii) a heat sink in thermal communication with said heat collecting unit, and (iii) a thermoelectric power generator disposed between said heat collecting unit and said heat sink, wherein said thermoelectric power generator is configured to generate power upon flow of at least a portion of said thermal energy from said heat collecting unit to said heat sink, and
an energy storage device configured to store power generated by said one or more solar cells or said thermoelectric power generator when said power is not used to power said electronic display.

33. The method of claim 32, wherein said wearable electronic device further comprises a casing containing said electronic display and said power management unit, and wherein said one or more solar cells are disposed in a top surface of said casing.

34. The method of claim 32, wherein said wearable electronic device is a watch.

35. The method of claim 34, wherein said watch comprises a face, and wherein said one or more solar cells are disposed in said face.

* * * * *